(12) United States Patent
Sutardja

(10) Patent No.: US 7,960,833 B2
(45) Date of Patent: Jun. 14, 2011

(54) INTEGRATED CIRCUITS AND INTERCONNECT STRUCTURE FOR INTEGRATED CIRCUITS

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 480 days.

(21) Appl. No.: 12/049,533

(22) Filed: Mar. 17, 2008

(65) Prior Publication Data

US 2008/0157209 A1    Jul. 3, 2008

Related U.S. Application Data

(60) Continuation-in-part of application No. 11/386,276, filed on Mar. 22, 2006, now Pat. No. 7,459,381, which is a division of application No. 10/765,474, filed on Jan. 26, 2004, now Pat. No. 7,265,448, application No. 12/049,533, which is a continuation-in-part of application No. 11/524,113, filed on Sep. 20, 2006, now Pat. No. 7,851,872, and a continuation-in-part of application No. 11/252,010, filed on Oct. 17, 2005, now Pat. No. 7,164,176, which is a continuation of application No. 10/691,237, filed on Oct. 22, 2003, now Pat. No. 7,091,565.

(60) Provisional application No. 60/895,022, filed on Mar. 15, 2007, provisional application No. 60/825,517, filed on Sep. 13, 2006, provisional application No. 60/824,357, filed on Sep. 1, 2006, provisional application No. 60/823,332, filed on Aug. 23, 2006, provisional application No. 60/821,008, filed on Aug. 1, 2006, provisional application No. 60/798,568, filed on May 8, 2006.

(51) Int. Cl.
*H01L 27/10* (2006.01)

(52) U.S. Cl. ......... 257/758; 257/E27.105; 257/E23.144; 438/499

(58) Field of Classification Search .................. 257/758, 257/E23.015, E23.144, E27.062, E27.105; 438/499
See application file for complete search history.

(56) References Cited

U.S. PATENT DOCUMENTS 4,409,499 A    10/1983    Zapisek et al.
(Continued)

FOREIGN PATENT DOCUMENTS

EP    0841702 A    5/1998
(Continued)

OTHER PUBLICATIONS

Communication from the European Patent Office dated Nov. 14, 2006 with the extended European Search Report for Application No. 06011395.8-2203, 7 pages.

(Continued)

*Primary Examiner* — Thomas L Dickey

(57) ABSTRACT

An integrated circuit comprises N plane-like metal layers, where N is an integer greater than one. A first plane-like metal layer includes M contact portions that communicate with the N plane-like metal layers, respectively, where M is an integer greater than one. The first plane-like metal layer and the N plane-like metal layers are located in separate planes. At least two of a first source, a first drain and a second source communicate with at least two of the N plane-like metal layers. A first gate is arranged between the first source and the first drain. A second gate is arranged between the first drain and the second source. The first and second gates define alternating first and second regions in the first drain, and wherein the first and second gates are arranged farther apart in the first regions than in the second regions.

40 Claims, 50 Drawing Sheets

U.S. PATENT DOCUMENTS

| | | | |
|---|---|---|---|
| 4,639,754 | A | 1/1987 | Wheatley, Jr. et al. |
| 5,323,036 | A | 6/1994 | Neilson et al. |
| 5,689,129 | A | 11/1997 | Pearce |
| 5,793,068 | A * | 8/1998 | Mahant-Shetti ............... 257/204 |
| 5,838,050 | A | 11/1998 | Ker et al. |
| 5,866,931 | A | 2/1999 | Bulucea et al. |
| 6,051,884 | A | 4/2000 | Papadas et al. |
| 6,054,728 | A | 4/2000 | Harada et al. |
| 6,100,591 | A | 8/2000 | Ishii |
| 6,178,082 | B1 | 1/2001 | Farooq |
| 6,204,533 | B1 | 3/2001 | Williams et al. |
| 6,264,167 | B1 | 7/2001 | Hamazawa |
| 6,278,264 | B1 | 8/2001 | Burstein et al. |
| 6,281,549 | B1 | 8/2001 | Davies |
| 6,388,292 | B1 | 5/2002 | Lin |
| 6,448,510 | B1 | 9/2002 | Neftin et al. |
| 6,477,034 | B1 | 11/2002 | Chakravorty |
| 6,486,557 | B1 | 11/2002 | Davis et al. |
| 6,489,689 | B2 | 12/2002 | Nojiri |
| 6,566,710 | B1 | 5/2003 | Strachan et al. |
| 6,686,300 | B2 | 2/2004 | Mehrotra et al. |
| 6,724,044 | B2 | 4/2004 | Blanchard |
| 6,740,930 | B2 | 5/2004 | Mattei et al. |
| 6,744,288 | B1 * | 6/2004 | Doyle et al. .................. 327/108 |
| 6,867,083 | B2 | 3/2005 | Imam et al. |
| 7,075,147 | B2 | 7/2006 | Cao |
| 7,371,627 | B1 | 5/2008 | Forbes |
| 7,528,444 | B2 | 5/2009 | Sutardja |
| 2001/0045670 | A1 | 11/2001 | Nojiri |
| 2002/0076851 | A1 | 6/2002 | Eden et al. |
| 2002/0153609 | A1 | 10/2002 | Kaneko et al. |
| 2003/0006467 | A1 | 1/2003 | Mattei et al. |
| 2003/0052409 | A1 | 3/2003 | Matsuo et al. |
| 2003/0209759 | A1 * | 11/2003 | Blanchard |
| 2005/0110056 | A1 | 5/2005 | Sutardja |
| 2005/0231990 | A1 * | 10/2005 | Uno et al. |
| 2006/0033171 | A1 | 2/2006 | Sutardja |
| 2007/0034903 | A1 * | 2/2007 | Sutardja |
| 2007/0210430 | A1 | 9/2007 | Kagii et al. |
| 2008/0157209 | A1 * | 7/2008 | Sutardja |

FOREIGN PATENT DOCUMENTS

| | | | |
|---|---|---|---|
| EP | 0 867 929 | A2 | 9/1998 |
| EP | 0982777 | | 3/2000 |
| EP | 1 107 313 | A2 | 6/2001 |
| EP | 1256985 | A | 11/2002 |
| EP | 1267413 | A2 | 12/2002 |
| EP | 1420450 | | 5/2004 |
| EP | 1526576 | | 4/2005 |
| EP | 1548831 | | 6/2005 |
| EP | 1 727 200 | * | 11/2006 |
| JP | 60076160 | A | 4/1985 |
| JP | 01207976 | | 8/1989 |
| JP | 05-090579 | | 4/1993 |
| JP | 06-232396 | | 5/1994 |
| JP | 08 046198 | * | 2/1996 |
| JP | 10-233508 | | 9/1998 |
| JP | 11-195730 | | 7/1999 |
| JP | 11214529 | | 8/1999 |
| JP | 11-330451 | | 11/1999 |
| JP | 2000-208759 | | 7/2000 |
| JP | 2000-323658 | | 11/2000 |
| JP | 2001- 339165 | | 12/2001 |
| JP | 2002-368121 | | 12/2002 |
| JP | 2003-142623 | | 5/2003 |
| JP | 2003-347727 | | 12/2003 |
| JP | 2004-260026 | | 9/2004 |
| WO | WO 98/53499 | A1 | 11/1998 |
| WO | WO 00/31797 | A2 | 6/2000 |
| WO | WO 00/31797 | A3 | 6/2000 |

OTHER PUBLICATIONS

Communication from the European Patent Office dated Nov. 14, 2006 with the extended European Search Report for Application No. 06011396.6-2203, 6 pages.

Communication from the European Patent Office dated Feb. 22, 2006 with the European Search Report for Application No. 050002849-2203.

Organized Translation of Notice of Reasons for Rejection from the Japanese Patent Office dated Aug. 28, 2007 for Japanese Patent Application 2005-006181; 18 pages.

Official Communication from the European Patent Office dated Sep. 13, 2007 for Application No. 06 011 395.8-2203; 4 pages.

Official Communication from the European Patent Office dated Sep. 13, 2007 for Application No. 06 011 396.6-223; 3 pages.

Organized Translation of Decision of Rejection from the Japanese Patent Office dated Oct. 16, 2007 for Application No. 2004-238034; 10 pages.

EPO Communication and Search Report date Oct. 12, 2007 for European Patent Application No. 04 012 376.2, 7 pgs.

Communication Relating to the Results of the Partial International Search dated Jun. 26, 2009 for application PCT/US2008/003491, 5 pgs.*

EPO Communication and Search Report dated Feb. 6, 2006 for European Patent Application No. 05 000 284.9, 4 pgs.*

EPO Communication and Search Report date Oct. 12, 2007 for European Patent Application No. 04 012 376.2, 5 pgs.

Notification of Transmittal of The International Search Report and The Written Opinion of The International Searching Authority, or The Declaration dated May 16, 2008 in reference to PCT/US2007/011207 (17 pgs).

Organized Translation of Decision of Rejection from the Japanese Patent Office dated Oct. 16, 2007 for Application No. 2004-238034; 10 pages.

Notification of Transmittal of The International Search Report and The Written Opinion of The International Searching Authority, or The Declaration dated Aug. 24, 2009 for application PCT/US2008/003491, 19 pgs.

First Office Action from the Japanese Patent Office dated Mar. 10, 2010 for Application No. 2007-80025919.4; 9 pages.

Organized Translation of Notice of Reasons for Rejection from the Japanese Patent Office dated Sep. 21, 2010 for Japanese Patent Application 2005-276911; 9 pages.

Non-Final Office Action from the Japanese Patent Office dated Feb. 9, 2011 for Application No. 2005-276912; 8 pages.

Final Office Action from the Japanese Patent Office dated Feb. 9, 2011 for Application No. 2005-276911; 11 pages.

* cited by examiner

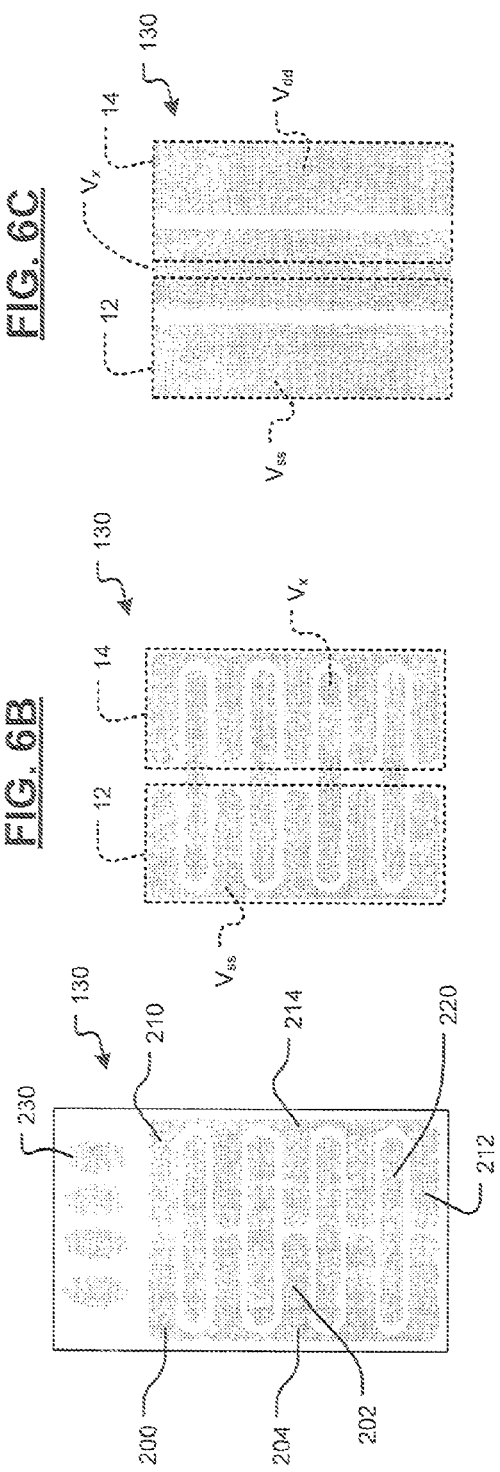

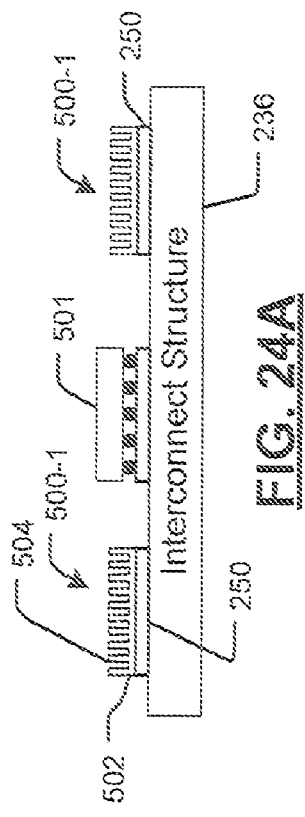
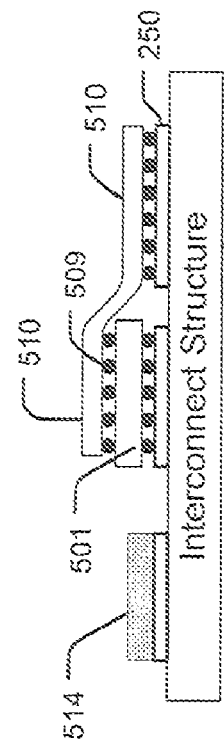
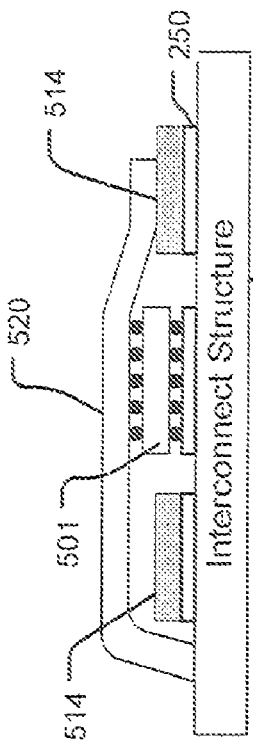
FIG. 24A
FIG. 24B
FIG. 24C

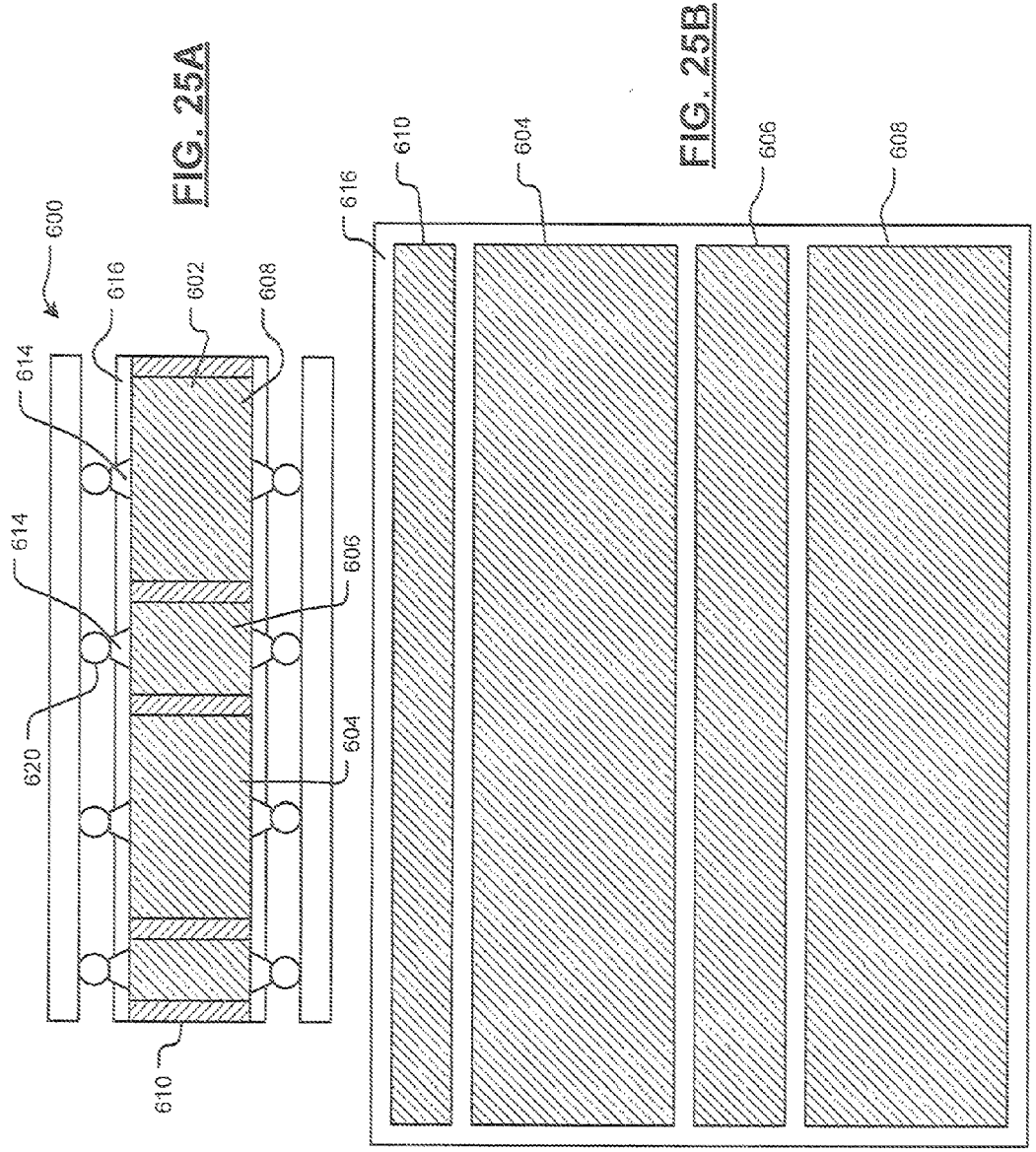

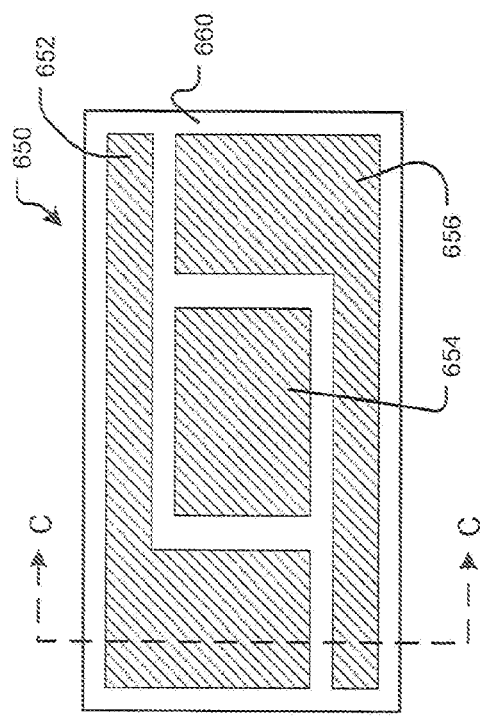
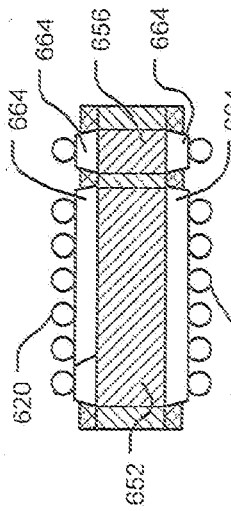
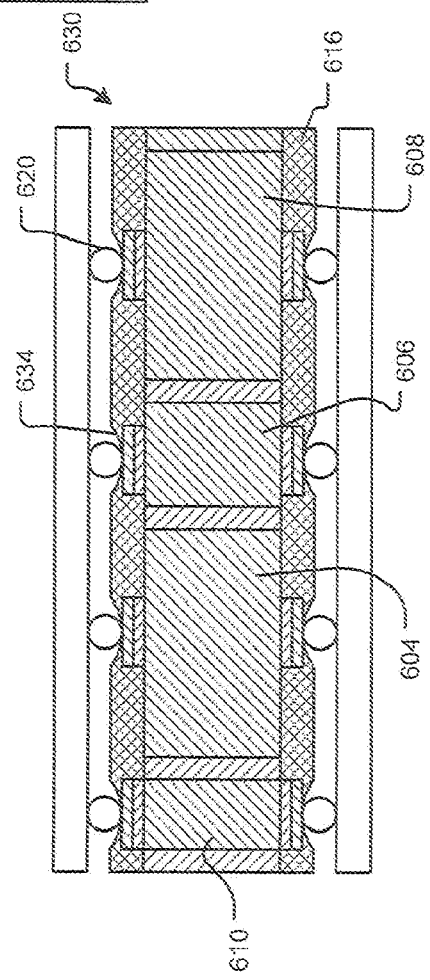
FIG. 27A
FIG. 27B
FIG. 26

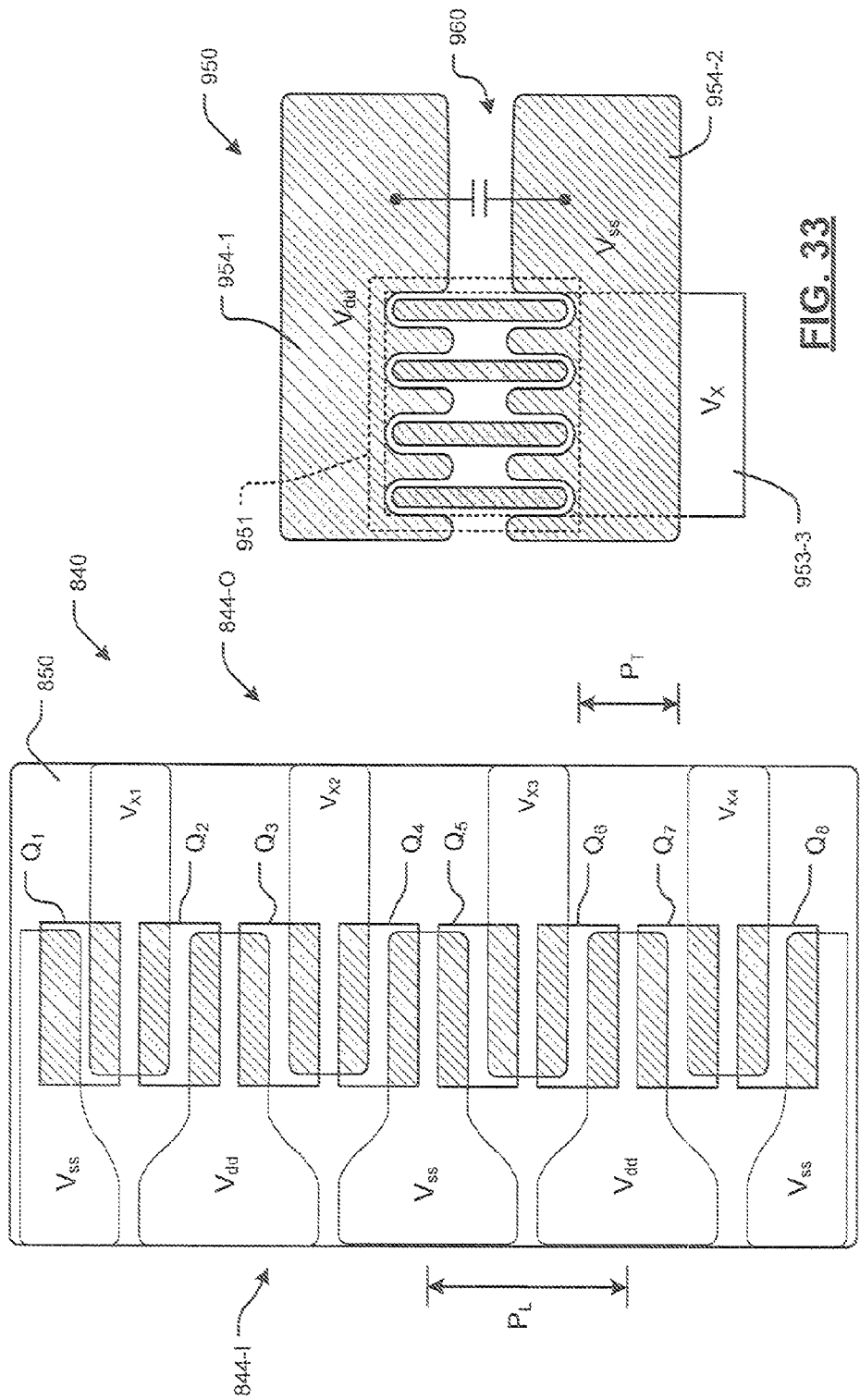

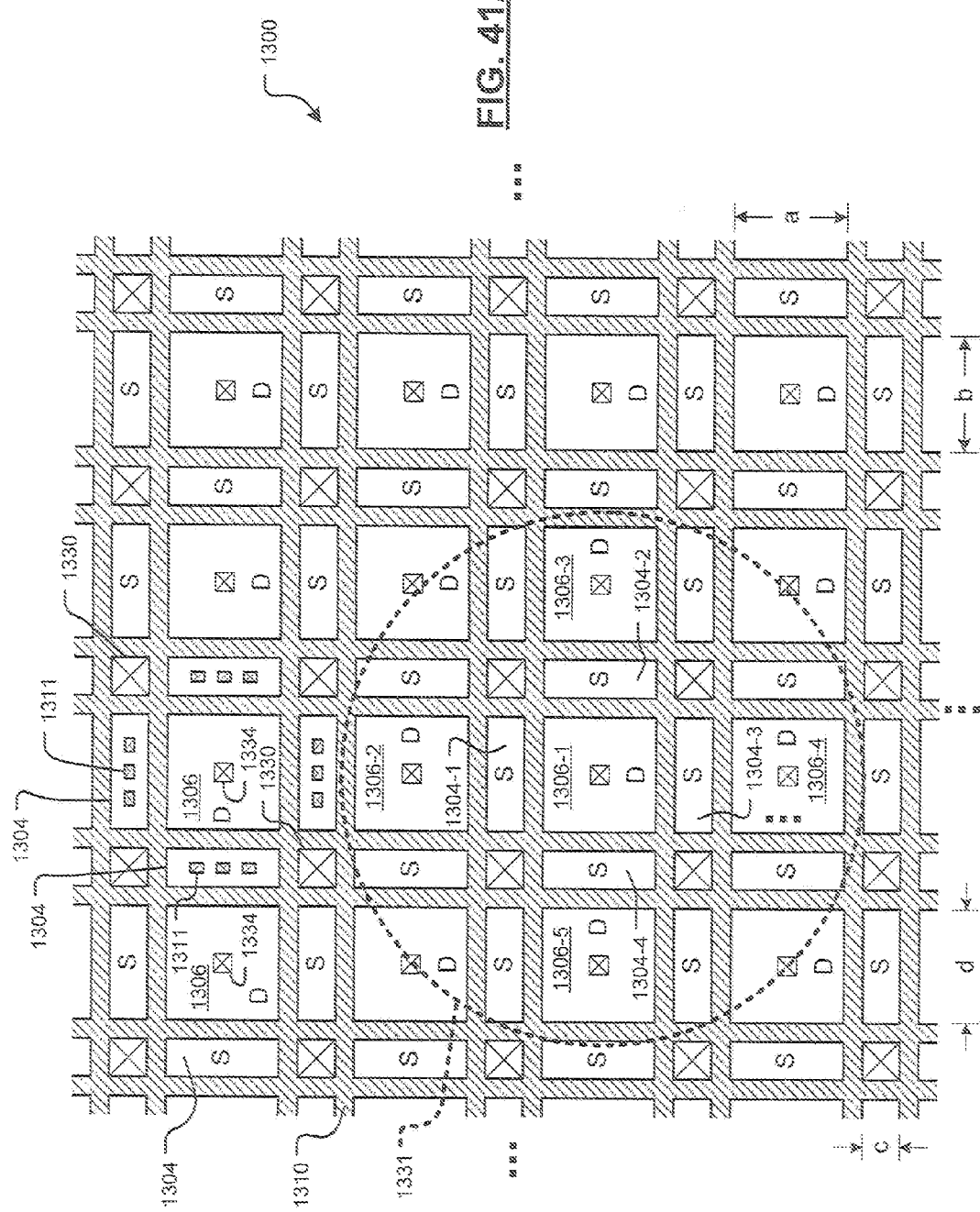

1344-X

1344-Z

1344-W

1344-Y

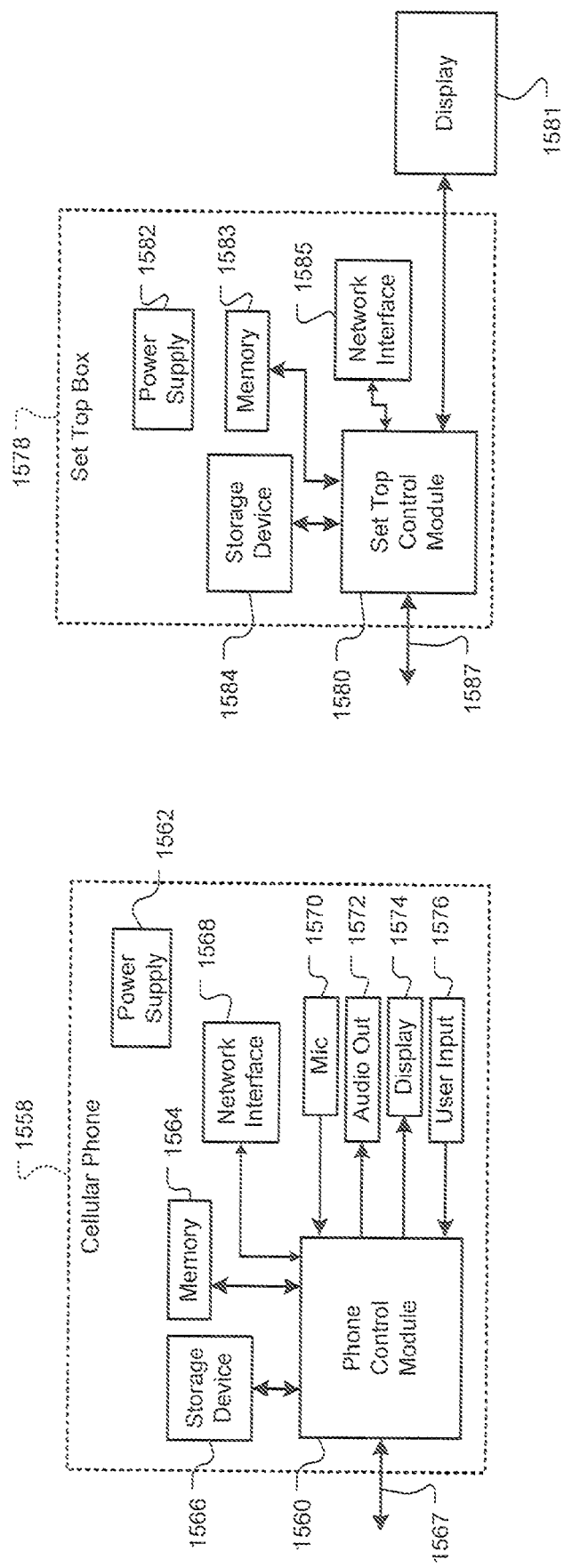

INTEGRATED CIRCUITS AND INTERCONNECT STRUCTURE FOR INTEGRATED CIRCUITS

CROSS-REFERENCE TO RELATED APPLICATIONS

This application claims the benefit of U.S. Provisional Application No. 60/895,022, filed Mar. 15, 2007, and is a continuation-in-part of U.S. patent application Ser. No. 11/386,276 filed on Mar. 22, 2006, which is a divisional of U.S. patent application Ser. No. 10/765,474 filed on Jan. 26, 2004. This application is also a continuation in part of U.S. patent application Ser. No. 11/524,113 filed on Sep. 20, 2006, which claims the benefit of U.S. Provisional Application Nos. 60/825,517, filed Sep. 13, 2006, 60/824,357, filed Sep. 1, 2006, 60/823,332, filed on Aug. 23, 2006, 60/821,008, filed Aug. 1, 2006 and 60/798,568, filed on May 8, 2006 and is a continuation-in-part of U.S. patent application Ser. No. 11/252,010 filed on Oct. 17, 2005, which is a continuation of U.S. patent application Ser. No. 10/691,237 filed on Oct. 22, 2003. The disclosures of the above applications are incorporated herein by reference in their entirety.

FIELD OF THE INVENTION

The present invention relates to integrated circuits, and more particularly to integrated circuits and interconnect structures for integrated circuits.

BACKGROUND OF THE INVENTION

Power integrated circuits (ICs) or power ICs may be used to supply power in variety of different applications. For example, power ICs may be used to supply power in pulse width modulation circuits. A drive IC may be used to provide input voltages and control signals to the power IC. Therefore, the drive IC and the power IC must be connected together. However, the drive IC and the power IC may be implemented using different IC technology. For example, the power IC may be implemented using MOSFET technology and the drive IC may employ standard IC technology. Therefore, packaging of the power IC and the drive IC may be problematic.

Typically, an integrated circuit (IC) is designed with pads, which are used to provide external connections to the IC. The IC is typically mounted on a package, which may include pins for connecting the package and its circuits to other electronic devices. The pins of the package are sometimes connected to the pads of the IC using bondwires. The bondwires, however, may have a resistance that is greater than 50-100 mΩ. The combined resistance of the bondwires increases the power dissipation of the IC. Therefore, when the IC has a large number pads that need connections, bondwires may not be an acceptable approach. To reduce parasitic packaging resistance, wires and/or traces that are arranged on a substrate such as a printed circuit board are sometimes used to provide interconnects. While this approach offers some improvement over bondwires, the wires and/or traces also have unacceptably high parasitic packaging resistance for ICs requiring a large number of connections.

ICs may include a large number of interconnected transistors. The transistors and other circuit elements are interconnected in various ways to provide desired circuit functions. It is usually most efficient to fabricate multiple ICs on a single wafer. After processing, the ICs that are fabricated on the wafer are separated and then packaged. The wafer can accommodate a fixed number of ICs for a given IC size. Reducing the size of individual transistors in the IC may help to reduce the overall size of the IC. This, in turn, allows an increased number of ICs to be made on each wafer and reduces the cost of the ICs.

SUMMARY OF THE INVENTION

An integrated circuit comprises N plane-like metal layers, where N is an integer greater than one. A first plane-like metal layer includes M contact portions that communicate with the N plane-like metal layers, respectively, where M is an integer greater than one. The first plane-like metal layer and the N plane-like metal layers are located in separate planes. At least two of a first source, a first drain and a second source communicate with at least two of the N plane-like metal layers. A first gate is arranged between the first source and the first drain. A second gate is arranged between the first drain and the second source. The first and second gates define alternating first and second regions in the first drain. The first and second gates are arranged farther apart in the first regions than in the second regions.

In other features, a well substrate contact is arranged in the first regions. R well substrate contacts are arranged in the first regions, where R is an integer greater than one. R is an integer that is greater than three and less than seven. The integrated circuit includes a plurality of transistors. The transistors include PMOS transistors. The R well substrate contacts are associated with respective ones of R transistors.

In other features, a second drain is provided. A third gate is arranged between the second source and the second drain. The second and third gates define alternating third and fourth regions. The second and third gates are arranged farther apart in the third regions than in the fourth regions. The first regions are arranged adjacent to the fourth regions and the second regions are arranged adjacent to the third regions. The first and third regions include R well substrate contacts.

In other features, at least two of the N plane-like metal layers are coplanar. The N plane-like metal layers are located in separate planes. A plurality of local interconnects communicate with the first and second sources and the first drain. At least one of the M contact portions has an elliptical shape. First and second ones of the M contact portions have a base portion and wings that extend from the base portion. A third one of the M contact portions is received between the wings of the first and second ones of the M contact portions. First and second ones of the M contact portions are generally "C"-shaped. A third one of the M contact portions is arranged between the first and second ones of the M contact portions.

In other features, the integrated circuit implements a power IC, a first one of the M contact portions supplies a first voltage potential to the power IC, a second one of the M contact portions supplies a second voltage potential to the power IC and a third one of the M contact portions receives an output voltage of the power IC.

A system comprises the integrated circuit and further comprises a leadframe including transmission lines that communicate with at least two of the M contact portions. The integrated circuit and the transmission lines are encased by a mold compound. The leadframe and the integrated circuit implement a quad flat no-lead (QFN) package.

A system comprises the integrated circuit and further comprises a first transmission line that communicates with a first one of the M contact portions. A second transmission line communicates with a second one of the M contact portions. A third transmission line communicates with a third one of the M contact portions. A capacitance communicates with the second transmission line and the third transmission line. The second transmission line supplies a first voltage potential and the third transmission line supplies a second voltage potential.

A method for providing an integrated circuit comprises providing N plane-like metal layers, where N is an integer greater than one; providing a first plane-like metal layer that includes M contact portions that communicate with the N plane-like metal layers, respectively, where M is an integer greater than one; arranging the first plane-like metal layer and the N plane-like metal layers in separate planes; providing a first source, a first drain, and a second source; arranging at least two of the first source, the first drain and the second source to communicate with at least two of the N plane-like metal layers; arranging a first gate between the first source and the first drain; arranging a second gate between the first drain and the second source; defining alternating first and second regions in the first drain using the first and second gates; and arranging the first and second gates farther apart in the first regions than in the second regions.

In other features, the method includes arranging a well substrate contact in the first regions. The method includes arranging R well substrate contacts in the first regions, where R is an integer greater than one. R is an integer that is greater than three and less than seven. The integrated circuit includes a plurality of transistors. The transistors include PMOS transistors. The R well substrate contacts are associated with respective ones of R transistors.

In other features, the method includes arranging a third gate between the second source and a second drain; defining alternating third and fourth regions using the second and third gates; and arranging the second and third gates farther apart in the third regions than in the fourth regions. The method includes arranging the first regions adjacent to the fourth regions and the second regions adjacent to the third regions. The first and third regions include R well substrate contacts. The method includes arranging at least two of the N plane-like metal layers in the same plane. The method includes arranging the N plane-like metal layers in separate planes. The method includes providing a plurality of local interconnects that communicate with the first and second sources and the first drain. At least one of the M contact portions has an elliptical shape.

In other features, first and second ones of the M contact portions have a base portion and wings that extend from the base portion, and a third one of the M contact portions is received between the wings of the first and second ones of the M contact portions. First and second ones of the M contact portions are generally "C"-shaped. A third one of the M contact portions is arranged between the first and second ones of the M contact portions.

In other features, the method includes implementing a power IC using the integrated circuit; supplying a first voltage potential to the power IC using a first one of the M contact portions; supplying a second voltage potential to the power IC using a second one of the M contact portions; and receiving an output voltage of the power IC at a third one of the M contact portions.

In other features, the method includes providing a leadframe including transmission lines that communicate with at least two of the M contact portions. The integrated circuit and the transmission lines are encased by a mold compound. The method includes implementing a quad flat no-lead (QFN) package using the leadframe and the integrated circuit. The method includes providing a first transmission line that communicates with a first one of the M contact portions; providing a second transmission line that communicates with a second one of the M contact portions; providing a third transmission line that communicates with a third one of the M contact portions; and providing a capacitance that communicates with the second transmission line and the third transmission line, wherein the second transmission line supplies a first voltage potential and the third transmission line supplies a second voltage potential.

An integrated circuit comprises N plane-like metal layers, where N is an integer greater than one. A first plane-like metal layer includes M contact portions that communicate with respective ones of the N plane-like metal layers, where M is an integer greater than one. The first plane-like metal layer and the N plane-like metal layers are located in separate planes. A first drain region has a generally rectangular shape. First, second, third and fourth source regions have a generally rectangular shape and are arranged adjacent to sides of the first drain region. The first drain region and the first, second, third and fourth source regions communicate with at least two of the N plane-like metal layers. A first gate region is arranged between the first, second, third and fourth source regions and the first drain region. First, second, third and fourth substrate contact regions are arranged adjacent to corners of the first drain region.

In other features, the first, second, third and fourth source regions have a length that is substantially equal to a length of the first drain region. The first, second, third and fourth source regions have a width that is less than a width of the first drain region. The width of the first, second, third and fourth source regions is approximately one-half the width of the first drain region.

In other features, a second drain region has a generally rectangular shape and has one side that is arranged adjacent to the first source region. Fifth, sixth and seventh source regions have a generally rectangular shape and are arranged adjacent to other sides of the second drain region. A second gate region is arranged between the first, fifth, sixth and seventh source regions and the second drain region. Fifth and sixth substrate contact regions are arranged adjacent to corners of the second drain region. The integrated circuit includes laterally-diffused MOSFET transistors. B source contacts are provided in each of the first, second, third and fourth source regions, where B is an integer greater than one. The first drain region has an area D and the B source contacts have an area A and wherein the area D is greater than or equal to 2*B*A.

In other features, at least two of the N plane-like metal layers are coplanar. The N plane-like metal layers are located in separate planes. A plurality of local interconnects communicate with the first, second, third and fourth source regions and the first drain region. At least one of the M contact portions has an elliptical shape. The first, second, third and fourth source regions communicate with a first one of the N plane-like metal layers and the first drain region communicates with a second one of the N plane-like metal layers. First and second ones of the M contact portions have a base portion and wings that extend from the base portion, and a third one of the M contact portions is received between the wings of the first and second ones of the M contact portions. First and second ones of the M contact portions are generally "C"-shaped. A third one of the M contact portions is arranged between the first and second ones of the M contact portions.

In other features, the integrated circuit implements a power IC, a first one of the M contact portions supplies a first voltage potential to the power IC, a second one of the M contact portions supplies a second voltage potential to the power IC and a third one of the M contact portions receives an output voltage of the power IC.

A system comprises the integrated circuit and further comprises a leadframe including transmission lines that communicate with at least two of the M contact portions. The integrated circuit and the transmission lines are encased by a mold compound. The leadframe and the integrated circuit implement a quad flat no-lead (QFN) package.

A system comprises the integrated circuit and further comprises a first transmission line that communicates with a first one of the M contact portions. A second transmission line communicates with a second one of the M contact portions. A third transmission line communicates with a third one of the M contact portions. A capacitance communicates with the second transmission line and the third transmission line. The second transmission line supplies a first voltage potential and the third transmission line supplies a second voltage potential.

A method for providing an integrated circuit comprises providing N plane-like metal layers, where N is an integer greater than one; providing a first plane-like metal layer that includes M contact portions that communicate with respective ones of the N plane-like metal layers, where M is an integer greater than one; arranging the first plane-like metal layer and the N plane-like metal layers in separate planes; providing a first drain region having a generally rectangular shape; arranging first, second, third and fourth source regions that have a generally rectangular shape adjacent to sides of the first drain region, wherein the first drain region and the first, second, third and fourth source regions communicate with at least two of the N plane-like metal layers; arranging a first gate region between the first, second, third and fourth source regions and the first drain region; and arranging first, second, third and fourth substrate contact regions adjacent to corners of the first drain region.

In other features, the first, second, third and fourth source regions have a length that is substantially equal to a length of the first drain region. The first, second, third and fourth source regions have a width that is less than a width of the first drain region. The width of the first, second, third and fourth source regions is approximately one-half the width of the first drain region.

In other features, the method includes providing a second drain region having a generally rectangular shape; arranging one side of the second drain region adjacent to the first source region; providing fifth, sixth and seventh source regions that have a generally rectangular shape; and arranging the fifth, sixth and seventh source regions adjacent to other sides of the second drain region. The method includes arranging a second gate region between the first, fifth, sixth and seventh source regions and the second drain region. The method includes arranging fifth and sixth substrate contact regions adjacent to corners of the second drain region. The integrated circuit includes laterally-diffused MOSFET transistors. The method includes providing B source contacts in each of the first, second, third and fourth source regions, where B is an integer greater than one. The first drain region has an area D and the B source contacts have an area A and wherein the area D is greater than or equal to 2*B*A.

In other features, the method includes arranging at least two of the N plane-like metal layers in the same plane. The method includes arranging the N plane-like metal layers in separate planes. The method includes providing a plurality of local interconnects that communicate with the first, second, third and fourth source regions and the first drain region. At least one of the M contact portions has an elliptical shape. The first, second, third and fourth source regions communicate with a first one of the N plane-like metal layers and the first drain region communicates with a second one of the N plane-like metal layers. First and second ones of the M contact portions have a base portion and wings that extend from the base portion, and a third one of the M contact portions is received between the wings of the first and second ones of the M contact portions. First and second ones of the M contact portions are generally "C"-shaped and wherein a third one of the M contact portions is arranged between the first and second ones of the M contact portions.

In other features, the method includes implementing a power IC using the integrated circuit; supplying a first voltage potential to the power IC using a first one of the M contact portions; supplying a second voltage potential to the power IC using a second one of the M contact portions; and receiving an output voltage of the power IC at a third one of the M contact portions.

In other features, the method includes providing a leadframe including transmission lines that communicate with at least two of the M contact portions. The method includes encasing the integrated circuit and the transmission lines in a mold compound. The method includes implementing a quad flat no-lead (QFN) package using the leadframe and the integrated circuit. The method includes providing a first transmission line that communicates with a first one of the M contact portions; providing a second transmission line that communicates with a second one of the M contact portions; providing a third transmission line that communicates with a third one of the M contact portions; and providing a capacitance that communicates with the second transmission line and the third transmission line, wherein the second transmission line supplies a first voltage potential and the third transmission line supplies a second voltage potential.

An integrated circuit comprises N plane-like metal layers, where N is an integer greater than one. A first plane-like metal layer includes M contact portions that communicate with the N plane-like metal layers, respectively, where M is an integer greater than one. The first plane-like metal layer and the N plane-like metal layers are located separate planes. A first drain region has a symmetric shape across at least one of horizontal and vertical centerlines. A first gate region has a first shape that surrounds the first drain region. A second drain region has the symmetric shape. A second gate region has the first shape that surrounds the second drain region. A connecting region connects the first and second gate regions. A first source region is arranged adjacent to and on one side of the first gate region, the second gate region and the connecting region. A second source region is arranged adjacent to and on one side of side of the first gate region, the second gate region and the connecting region. The first source region, the second source region, the first drain region and the second drain region communicate with at least two of the N plane-like metal layers.

In other features, the symmetric shape tapers as a distance from a center of the symmetric shape increases. First and second substrate contacts are arranged in the first and second source regions. The integrated circuit includes laterally-diffused MOSFET transistors. The symmetric shape is a circular shape. The symmetric shape is an elliptical shape. The symmetric shape is a polygonal shape. The symmetric shape is a hexagonal shape.

In other features, at least two of the N plane-like metal layers are coplanar. The N plane-like metal layers are located in separate planes. A plurality of local interconnects communicate with the first and second source regions and the first and second drain regions. At least one of the M contact portions has an elliptical shape. First and second ones of the M contact portions have a base portion and wings that extend from the base portion. A third one of the M contact portions is received between the wings of the first and second ones of the M contact portions.

In other features, first and second ones of the M contact portions are generally "C"-shaped. A third one of the M contact portions is arranged between the first and second ones of the M contact portions. The integrated circuit implements a power IC, a first one of the M contact portions supplies a first voltage potential to the power IC, a second one of the M contact portions supplies a second voltage potential to the power IC and a third one of the M contact portions receives an output voltage of the power IC.

A system comprises the integrated circuit and further comprises a leadframe including transmission lines that communicate with at least two of the M contact portions. The integrated circuit and the transmission lines are encased by a mold compound. The leadframe and the integrated circuit implement a quad flat no-lead (QFN) package.

A system comprises the integrated circuit and further comprises a first transmission line that communicates with a first one of the M contact portions. A second transmission line communicates with a second one of the M contact portions. A third transmission line communicates with a third one of the M contact portions. A capacitance communicates with the second transmission line and the third transmission line. The second transmission line supplies a first voltage potential and the third transmission line supplies a second voltage potential.

A method for providing an integrated circuit comprises providing N plane-like metal layers, where N is an integer greater than one; providing a first plane-like metal layer that includes M contact portions that communicate with the N plane-like metal layers, respectively, where M is an integer greater than one; arranging the first plane-like metal layer and the N plane-like metal layers in separate planes; providing a first drain region having a symmetric shape across at least one of horizontal and vertical centerlines; providing a first gate region having a first shape that surrounds the first drain region; providing a second drain region having the symmetric shape; providing a second gate region having the first shape that surrounds the second drain region; connecting the first and second gate regions using a connecting region; arranging a first source region adjacent to and on one side of the first gate region, the second gate region and the connecting region; and arranging a second source region adjacent to and on one side of side of the first gate region, the second gate region and the connecting region, wherein the first source region, the second source region, the first drain region and the second drain region communicate with at least two of the N plane-like metal layers.

In other features, the symmetric shape tapers as a distance from a center of the symmetric shape increases. The method includes arranging first and second substrate contacts in the first and second source regions. The integrated circuit includes laterally-diffused MOSFET transistors. The symmetric shape is a circular shape. The symmetric shape is an elliptical shape. The symmetric shape is a polygonal shape. The symmetric shape is a hexagonal shape.

In other features, the method includes arranging at least two of the N plane-like metal layers in the same plane. The method includes arranging the N plane-like metal layers in separate planes. The method includes providing a plurality of local interconnects that communicate with the first and second source regions and the first and second drain regions. At least one of the M contact portions has an elliptical shape.

In other features, first and second ones of the M contact portions have a base portion and wings that extend from the base portion, and a third one of the M contact portions is received between the wings of the first and second ones of the M contact portions. First and second ones of the M contact portions are generally "C"-shaped and wherein a third one of the M contact portions is arranged between the first and second ones of the M contact portions.

In other features, the method includes implementing a power IC using the integrated circuit; supplying a first voltage potential to the power IC using a first one of the M contact portions; supplying a second voltage potential to the power IC using a second one of the M contact portions; and receiving an output voltage of the power IC at a third one of the M contact portions. The method includes providing a leadframe including transmission lines that communicate with at least two of the M contact portions. The method includes encasing the integrated circuit and the transmission lines in a mold compound. The method includes implementing a quad flat no-lead (QFN) package using the leadframe and the integrated circuit.

In other features, the method includes connecting a first transmission line with a first one of the M contact portions; connecting a second transmission line with a second one of the M contact portions; connecting a third transmission line with a third one of the M contact portions; and providing a capacitance that communicates with the second transmission line and the third transmission line, wherein the second transmission line supplies a first voltage potential and the third transmission line supplies a second voltage potential.

An integrated circuit comprises N plane-like metal layers, where N is an integer greater than one. A first plane-like metal layer includes M contact portions that communicate with the N plane-like metal layers, respectively, where M is an integer greater than one. The first plane-like metal layer and the N plane-like metal layers are located in separate planes. First and second drain regions have a generally rectangular shape. First, second and third source regions have a generally rectangular shape. The first source region is arranged between first sides of the first and second drain regions and the second and third source regions are arranged adjacent to second sides of the first and second drain regions. A fourth source region is arranged adjacent to third sides of the first and second drain regions. A fifth source region is arranged adjacent to fourth sides of the first and second drain regions. A gate region is arranged between the first, second, third, fourth and fifth source regions and the first and second drain regions. First and second drain contacts are arranged in the first and second drain regions. At least two of the first, second, third, fourth and fifth source regions and the first and second drain regions communicate with at least two of the N plane-like metal layers.

In other features, the first, second and third source regions have a length that is substantially equal to a length of the first drain region and wherein the fourth and fifth source regions have a length that is greater than or equal to a length of the first and second drain regions. The first, second and third source regions have a width that is less than a width of the first drain region. The width of the first, second and third source regions is approximately one-half the width of the first drain region. The fourth and fifth source regions are driven from sides thereof. The first and second drain contacts have a size that is greater than a minimum drain contact size. The drain contacts have one of a regular shape and an irregular shape. The drain contacts are one of square, rectangular, and cross-shaped. The first, second and third source regions include source contacts.

In other features, the first and second drain regions and the first, second and third source regions are arranged in a first row and further comprising N additional rows. Drain regions of at least one of the N additional rows share one of the fourth and fifth source regions. At least two of the N plane-like metal layers are coplanar. The N plane-like metal layers are located in separate planes. A plurality of local interconnects communicate with the first, second, third, fourth and fifth source regions and the first and second drain regions. At least one of the M contact portions has an elliptical shape. First and second ones of the M contact portions have a base portion and wings that extend from the base portion, and a third one of the M contact portions is received between the wings of the first and second ones of the M contact portions. First and second ones of the M contact portions are generally "C"-shaped and wherein a third one of the M contact portions is arranged between the first and second ones of the M contact portions.

In other features, the integrated circuit implements a power IC, a first one of the M contact portions supplies a first voltage potential to the power IC, a second one of the M contact portions supplies a second voltage potential to the power IC and a third one of the M contact portions receives an output voltage of the power IC.

A system comprises the integrated circuit and further comprises a leadframe including transmission lines that communicate with at least two of the M contact portions. The integrated circuit and the transmission lines are encased by a mold compound. The leadframe and the integrated circuit implement a quad flat no-lead (QFN) package.

A system comprises the integrated circuit and further comprises a first transmission line that communicates with a first one of the M contact portions. A second transmission line communicates with a second one of the M contact portions. A third transmission line communicates with a third one of the M contact portions. A capacitance communicates with the second transmission line and the third transmission line. The second transmission line supplies a first voltage potential and the third transmission line supplies a second voltage potential.

A method for providing an integrated circuit comprises providing N plane-like metal layers, where N is an integer greater than one; providing a first plane-like metal layer that includes M contact portions that communicate with the N plane-like metal layers, respectively, where M is an integer greater than one; locating the first plane-like metal layer and the N plane-like metal layers in separate planes; providing first and second drain regions having a generally rectangular shape; providing first, second and third source regions that have a generally rectangular shape; arranging the first source region between first sides of the first and second drain regions; arranging the second and third source regions adjacent to second sides of the first and second drain regions; arranging a fourth source region adjacent to third sides of the first and second drain regions; arranging a fifth source region adjacent to fourth sides of the first and second drain regions; arranging a gate region between the first, second, third, fourth and fifth source regions and the first and second drain regions; and arranging first and second drain contacts in the first and second drain regions. At least two of the first, second, third, fourth and fifth source regions and the first and second drain regions communicate with at least two of the N plane-like metal layers.

In other features, the first, second and third source regions have a length that is substantially equal to a length of the first drain region. The fourth and fifth source regions have a length that is greater than or equal to a length of the first and second drain regions. The first, second and third source regions have a width that is less than a width of the first drain region. The width of the first, second and third source regions is approximately one-half the width of the first drain region. The fourth and fifth source regions are driven from sides thereof. The first and second drain contacts have a size that is greater than a minimum drain contact size. The drain contacts have one of a regular shape and an irregular shape. The drain contacts are one of square, rectangular, and cross-shaped. The first, second and third source regions include source contacts.

In other features, the method includes arranging the first and second drain regions and the first, second and third source regions in a first row; and providing N additional rows, wherein drain regions of at least one of the N additional rows share one of the fourth and fifth source regions. The method includes arranging at least two of the N plane-like metal layers in the same plane. The method includes arranging the N plane-like metal layers in separate planes. The method includes providing a plurality of local interconnects that communicate with the first, second, third, fourth and fifth source regions and the first and second drain regions. At least one of the M contact portions has an elliptical shape. First and second ones of the M contact portions have a base portion and wings that extend from the base portion, and a third one of the M contact portions is received between the wings of the first and second ones of the M contact portions. First and second ones of the M contact portions are generally "C"-shaped and wherein a third one of the M contact portions is arranged between the first and second ones of the M contact portions.

In other features, the integrated circuit implements a power IC, a first one of the M contact portions supplies a first voltage potential to the power IC, a second one of the M contact portions supplies a second voltage potential to the power IC and a third one of the M contact portions receives an output voltage of the power IC. The method includes providing a leadframe including transmission lines that communicate with at least two of the M contact portions. The integrated circuit and the transmission lines are encased by a mold compound. The leadframe and the integrated circuit implement a quad flat no-lead (QFN) package.

In other features, the method includes connecting a first transmission line to a first one of the M contact portions; connecting a second transmission line to a second one of the M contact portions; connecting a third transmission line to a third one of the M contact portions; and connecting a capacitance to the second transmission line and the third transmission line. The second transmission line supplies a first voltage potential and the third transmission line supplies a second voltage potential.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

FIGS. 6A-6D are plan views of alternate layouts for a top metal layer of the power ICs in FIGS. 4 and 5;

FIGS. 24A, 24B and 24C illustrate various exemplary heat sinks that can be arranged on the interconnect structure;

FIGS. 25A and 25B illustrate an interconnect structure including an aluminum core;

FIG. 26 illustrates an alternate interconnect structure with an aluminum core;

FIGS. 27A and 27B are a plan view and a cross-sectional view (taken along line C-C in FIG. 27A), respectively, of a second alternate exemplary layout for the interconnect structure with an aluminum core;

FIG. 31 is a plan view of another leadframe including input side transmission lines and output side transmission lines for another exemplary power IC;

FIG. 33 is a plan view of a substrate with transmission lines and a coupling capacitor connected between at least two of the transmission lines;

FIG. 41A is a plan view of a seventh exemplary layout for reducing $R_{DSon}$;

FIG. 45E is a functional block diagram of a cellular phone;

FIG. 45F is a functional block diagram of a set top box; and

DETAILED DESCRIPTION OF THE PREFERRED EMBODIMENTS

Figure 1B:
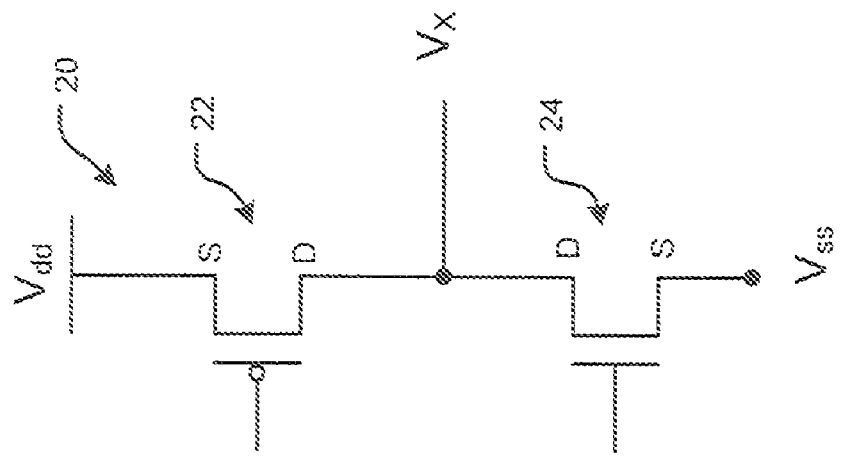
FIG. 1B is an electrical schematic of a second exemplary power IC with first and second interconnected transistors.

The following description of the preferred embodiment(s) is merely exemplary in nature and is in no way intended to limit the invention, its application, or uses. For purposes of clarity, the same reference numbers will be used in the drawings to identify similar elements.

Figure 1A:
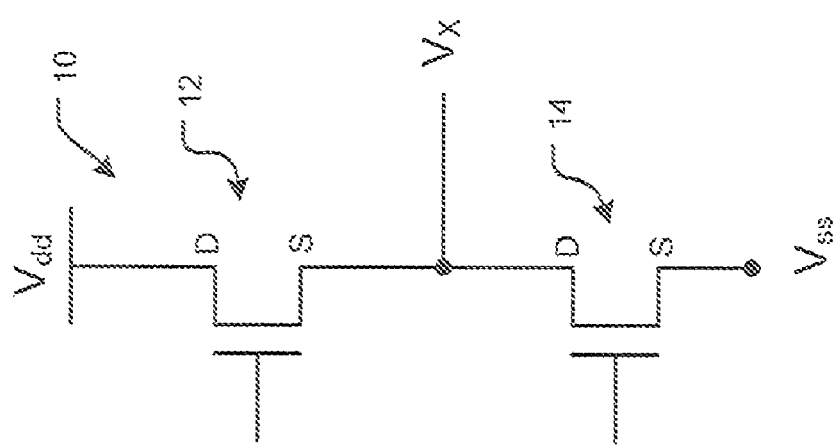
FIG. 1A is an electrical schematic of a first exemplary power IC with first and second interconnected transistors.

Referring now to FIG. 1A, a power IC 10 includes first and second power transistors 12 and 14. While first and second power transistors 12 and 14 are shown, additional transistors may be used to implement the power IC. In one implementation, the power IC 10 is used in a pulse width modulation circuit. A source of the first transistor 12 is connected to a drain of the second transistor 14. A supply voltage $V_{dd}$ is connected to a drain of the first transistor 12. A reference potential $V_{ss}$ such as ground is connected to a source of the second transistor 14. An output voltage $V_x$ is taken between the source and drain of the first and second transistors 12 and 14, respectively. The transistor 12 is an NMOS transistor and the transistor 14 is an NMOS transistor, although other types of transistors may be used.

Referring now to FIG. 1B, another configuration of a power IC 20 includes first and second power transistors 22 and 24. While first and second power transistors 22 and 24 are shown, additional transistors may be used to implement the power IC. A drain of the first transistor 22 is connected to a drain of the second transistor 24. A supply voltage $V_{dd}$ is connected to a source of the first transistor 22. A reference potential $V_{ss}$ such as ground is connected to a source of the second transistor 24. The transistor 22 is a PMOS transistor and the transistor 24 is an NMOS transistor, although other types of transistors may be used. An output voltage $V_x$ is taken between the drains of the first and second transistors 22 and 24.

Figure 2:
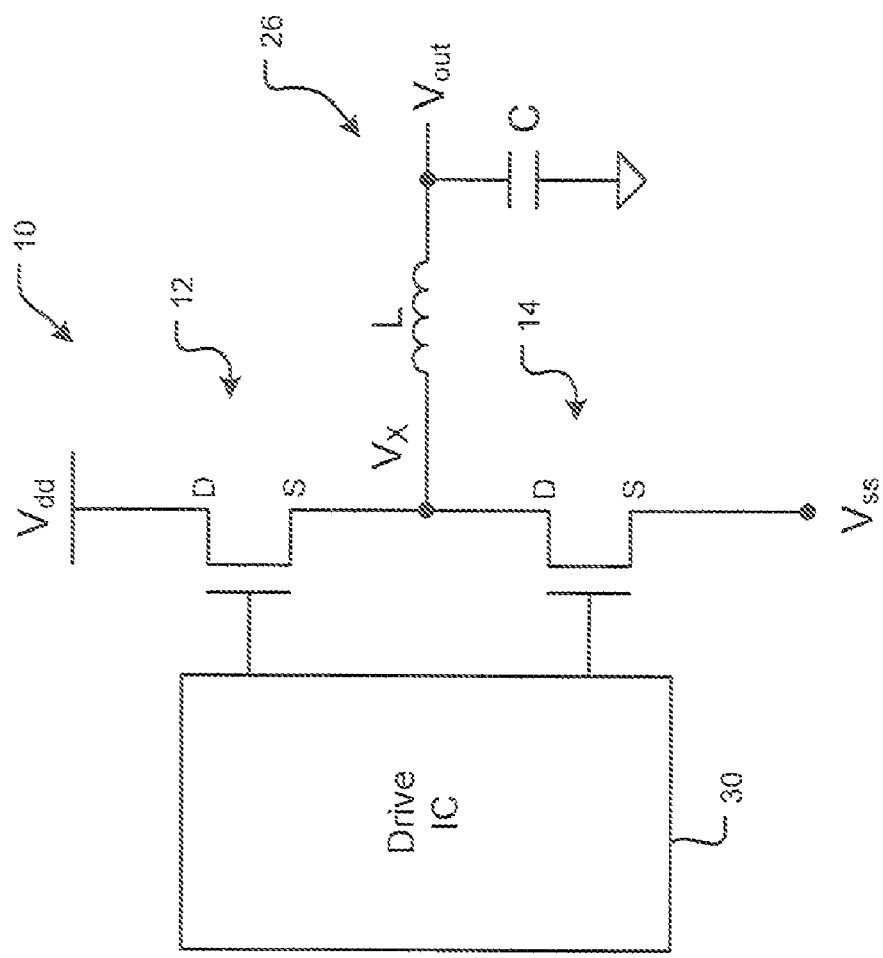
FIG. 2 is an electrical schematic and functional block diagram of the power IC of FIG. 1 connected to a drive IC.

Referring now to FIG. 2, the power transistors 10 and 20 may be connected to a drive IC. The processes that are used for the power IC 10 and/or 20 may not be the same as those used for the drive IC 30. For example, the power IC 10 and/or 20 may be implemented using MOSFET technology whereas the drive IC 30 may employ standard IC technology. While MOSFET/standard processes are disclosed, other processes can be used. The output signal $V_x$ may be output to one or more components 26, which may include a series inductor L and a parallel capacitor C.

Figure 3:
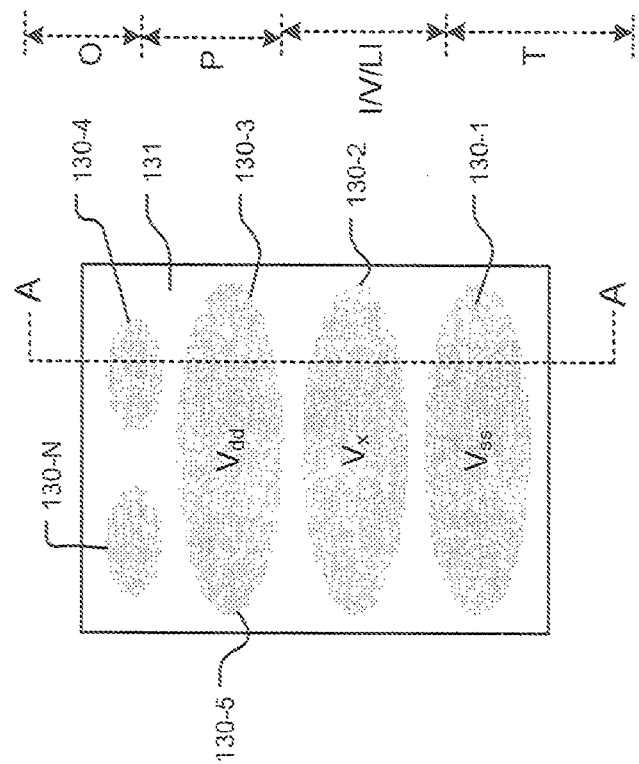
FIG. 3 is a plan view of a first layout for a top metal layer of the power IC.

Referring now to FIG. 3, an exemplary plan view of a top metal layer 130 is shown. While connections to first and second power transistors are shown, additional connections may be provided for additional transistors that may be used to implement the power IC. First, second and third contact portions 130-1, 130-2, and 130-3 have an elliptical shape. In this implementation, the first contact portion 130-1 is connected to $V_{ss}$, the second contact portion 130-2 is connected to $V_x$ and the third contact portion 130-3 is connected to $V_{dd}$. A fourth contact portion 130-4 is associated with a control signal such as a gate control signal. Additional control signals may be provided via additional contact portions 130-N. An insulating material 131 is arranged between the contact portions 130 to electrically isolate the contact portions.

Figure 4A:
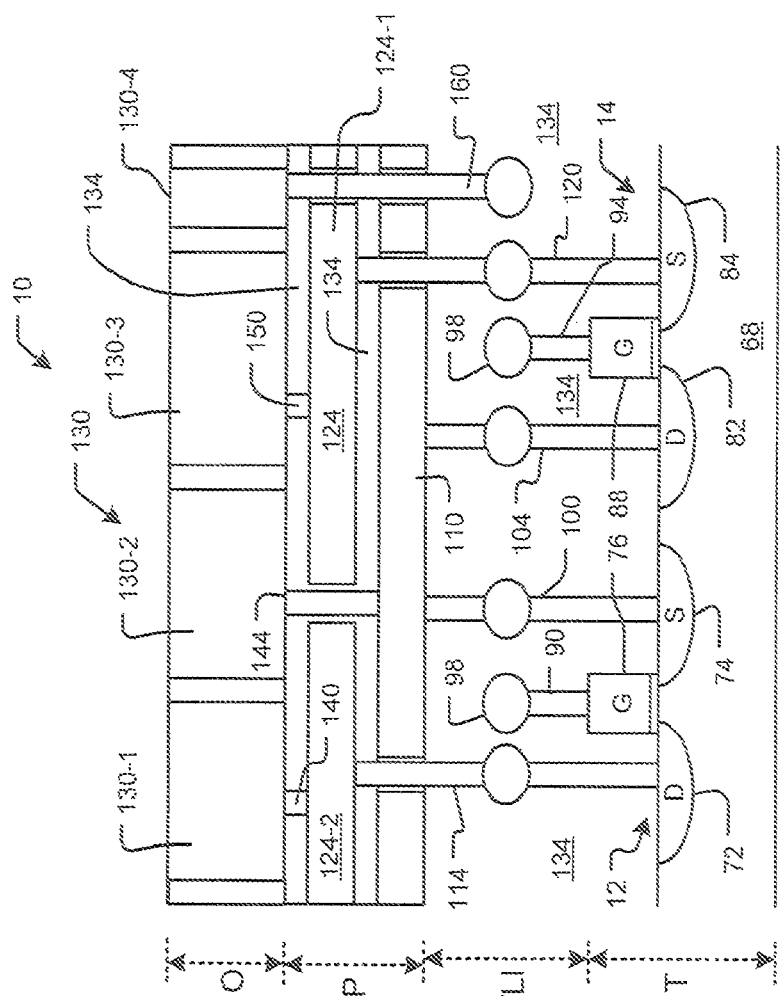
FIG. 4A is a cross-sectional view of the power IC layout according to the present invention taken along A-A in FIG. 3 for the power IC of FIG. 1A.

Referring now to FIG. 4A, one exemplary implementation of the power IC 10 corresponding to FIG. 1A is shown in further detail. The first transistor 12 includes a drain 72, a source 74, and a gate 76. The second transistor 14 includes a drain 82, a source 84, and a gate 88. The transistors 12 and 14 are NMOS transistors, although other transistor types can be used. While first and second power transistors 12 and 14 are shown, additional transistors are typically used to implement the power IC 10, as will be described below. The gate 76 of the first transistor 12 is connected by vias 90 to local interconnects 98. The local interconnects 98 are weak local interconnects such as standard wiring. As used herein, the term vias refers to a sufficient number of vias that are required to minimize resistance to a desired level. The gate 88 of the second transistor 14 is connected by vias 94 to local interconnects 98.

The source 74 of the first transistor 12 and the drain 82 of the second transistor 14 are connected by local interconnects 98 and vias 100 and 104, respectively, to a plane-like metal layer 110. As used herein, the term plane-like metal layer refers to a strong interconnect plane rather than weak local interconnects such as standard wiring. The plane-like metal layer allows current to flow in x and y directions rather than in a single direction such as x or y, which would be the case for weak local interconnects such as standard wiring.

On a macroscopic level, when current flows through weak local interconnects or standard wiring from point A to point B, it generally flows in a single direction such as the x direction. When current flows through a plane-like metal layer from point A to points B and C or from many points to many points in the plane-like metal layer connections according to the present invention, current flows in both x and y directions, where the x direction is orthogonal to the y direction. The plane-like metal layer may or may not include insulated vias passing therethrough and/or vias that are connected thereto. The plane-like metal layer may also have holes that are disbursed therein regularly, randomly or in any other pattern. The plane-like metal layer may have a uniform shape such as but not limited to a rectangle or square or a non-uniform or irregular shape.

The drain 72 of the first transistor 12 is connected by local interconnects 98 and vias 114 to a second plane-like portion 124-2 of a plane-like metal layer 124. The source 84 is connected by local interconnects 98 and vias 120 to a first plane-like portion 124-1 of the plane-like metal layer 124. The first and second plane-like portions 124-1 and 124-2 of the plane-like metal layer 124 are electrically isolated from each other.

The top metal layer 130 is preferably thicker than the plane-like metal layers 98, 110, and 124. As can be appreciated, one or more insulating layers 134 provide electrical insulation, for example between the metal layers 110, 124, and 130 to electrically isolate the layers 110, 124, and 130. The top metal layer 130 defines the contact portions 130-1, 130-2, 130-3, 130-4, . . . , and 130-N that are electrically isolated from each other. The first contact portion 130-1 is connected by vias 140 to the second plane-like portion 124-2 of the plane-like metal layer 124. The second contact portion 130-2 is connected by vias 144 to the plane-like metal layer 110. The third contact portion 130-3 is connected by vias 150 to the first plane-like portion 124-1 of the plane-like metal layer 124. The fourth contact portion 130-4 is connected by vias 160 to the metal interconnect 98. The plane-like metal layers 110 and 124 provide strong plane interconnects while the interconnect 98 provides a weak/local interconnect.

Figure 4B:
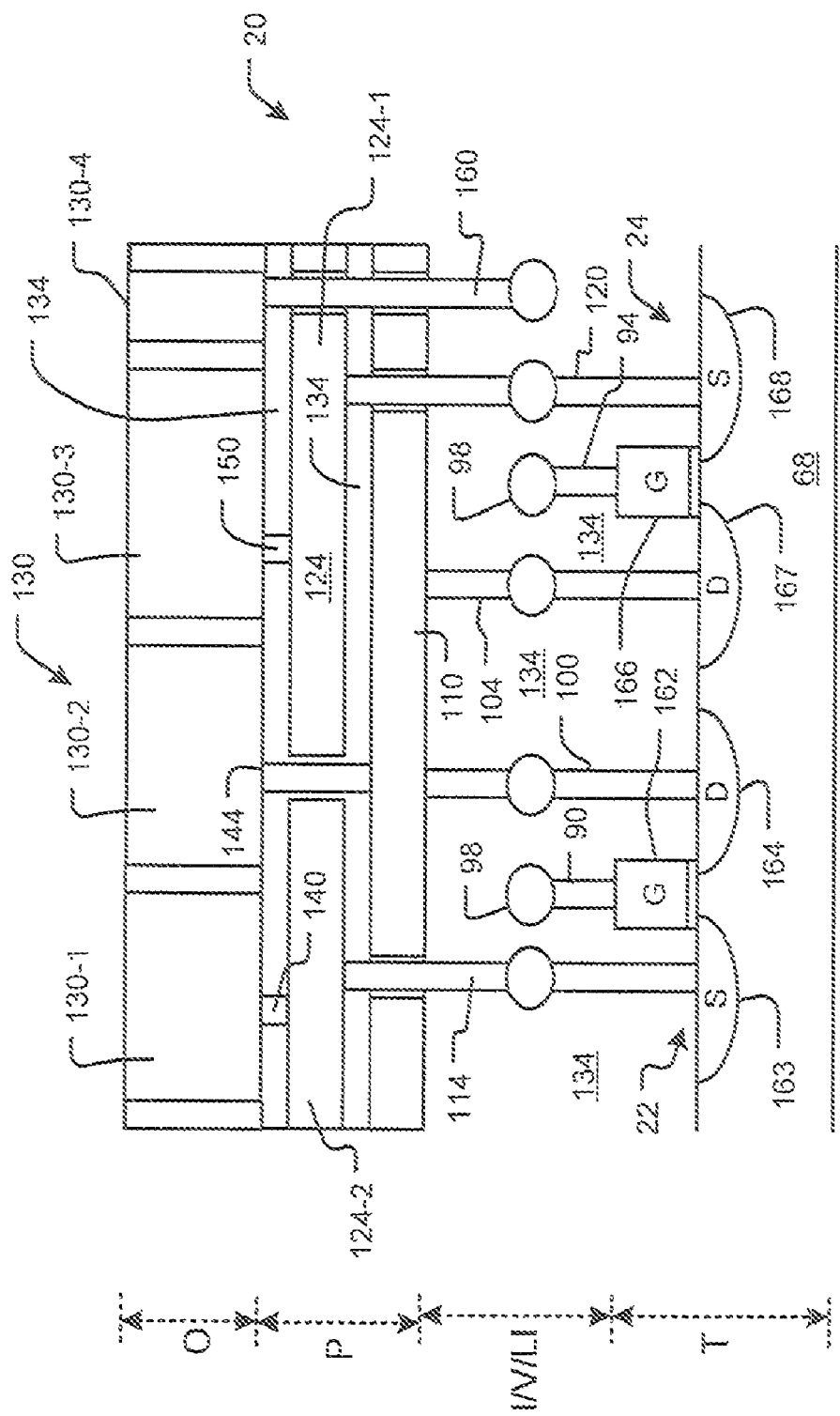
FIG. 4B is a cross-sectional view of the power IC layout according to the present invention taken along A-A in FIG. 3 for the power IC of FIG. 1B.

As can be appreciated by skilled artisans, the power IC 20 corresponding to FIG. 1B will have a somewhat similar layout to that shown in FIG. 4A. Referring now to FIG. 4B, the transistor 22 includes a gate 162, a source 163 and a drain 164. The transistor 24 includes a gate 166, a drain 167 and source 168. In ne implementation, the transistors 22 and 24 are PMOS and NMOS transistors, respectively, although other transistor types can be used. The source 163 is connected by vias 114 to the second plane-like portion 124-2 of the plane-like metal layer 124. The drains 164 and 167 are connected by vias 100 and 104, respectively, to the plane-like metal layer 110. The source 168 is connected by vias 120 to the first plane-like portion 124-1 of the plane-like metal layer 124.

While the plane-like metal layer 124 in FIGS. 4A and 4B is shared, skilled artisans will appreciate that the plane-like metal layer 110 can be shared instead of the plane-like metal layer 124. In addition, while the source 74 of the first transistor 12 and the drain 82 of the second transistor 14 are shown to be connected in FIG. 4A (and the drains 164 and 167 in FIG. 4B), there are other implementations that may have separate connections. The power IC may be connected to other circuits using solder balls and a solder mask, adhesive such as anisotropic adhesive and/or any other suitable attachment method. The use of global metal planes for $V_{ss}$, $V_{dd}$ and/or $V_x$ provides the lowest impedance connection to the power IC, which reduces power dissipation.

Figure 4C:
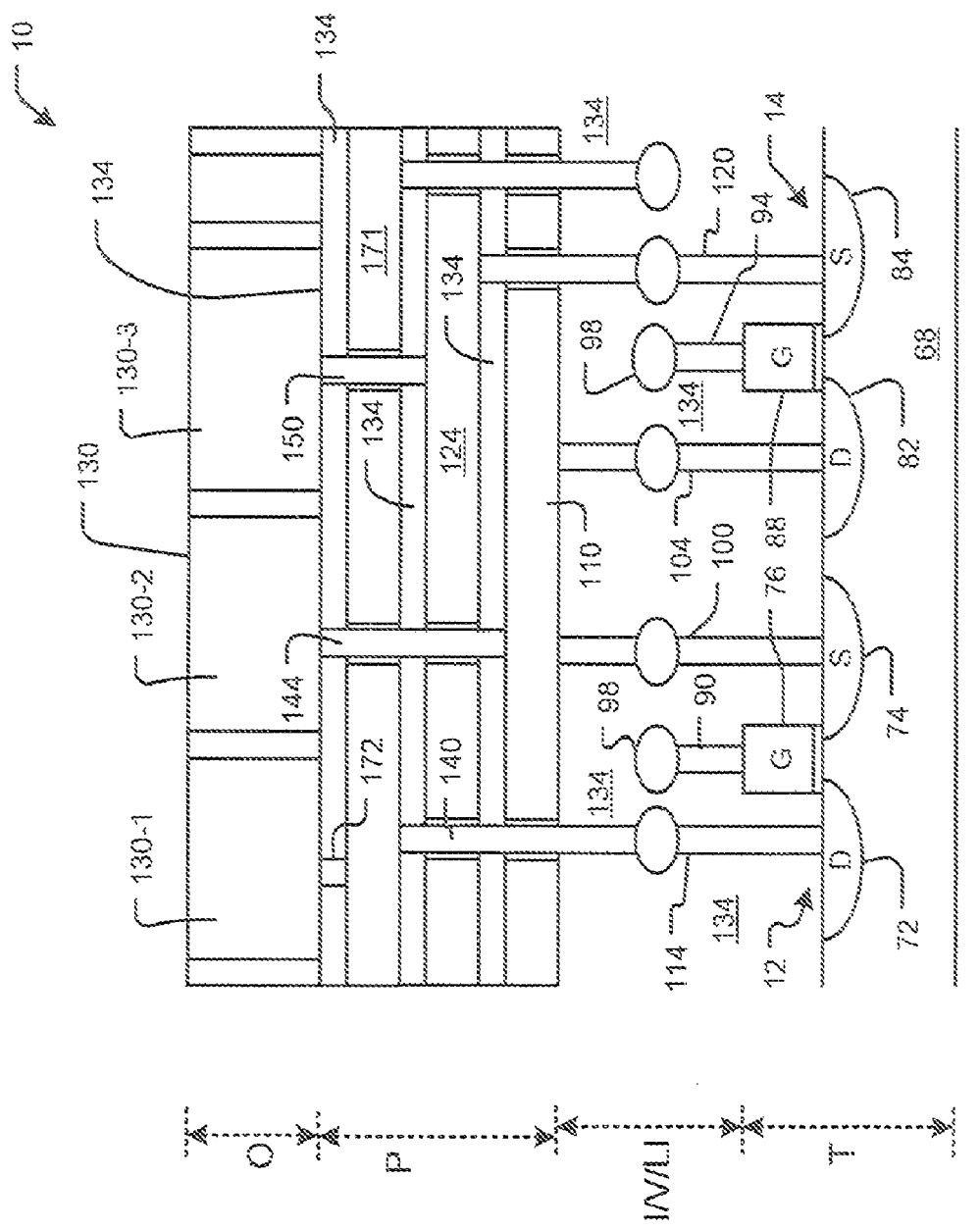
FIG. 4C is a cross-sectional view of an alternate power IC layout according to the present invention taken along A-A in FIG. 3 for the power IC of FIG. 1A.

Referring now to FIG. 4C, an additional plane-like metal layer 171 is provided for the layout corresponding to FIGS. 1A and 4A. While first and second power transistors are shown, additional transistors are typically used to implement the power IC. The plane-like metal layer 124 is no longer shared. The first contact portion 130-1 is connected by vias 172 to the plane-like metal layer 171. The vias 140 connect the drain 72 to the plane-like metal layer 171. The source 74 and the drain 82 are connected by the vias 100 and 104, respectively, to the plane-like metal layer 110. Skilled artisans will appreciate that an additional layer can also be added to the layouts corresponding to FIGS. 1B and 4B.

Figure 5A:
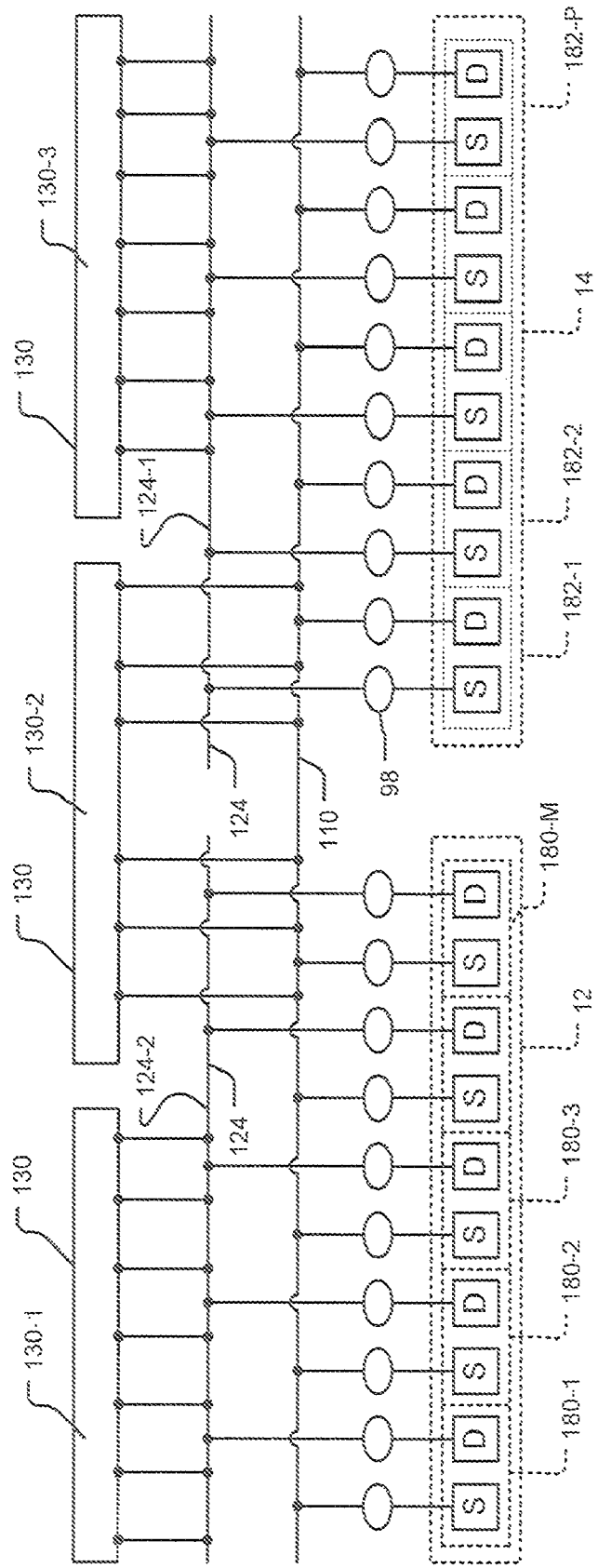
FIG. 5A is an electrical schematic illustrating the power IC of FIG. 1A.

Referring now to FIG. 5A, the first power transistor 12 is shown to include multiple transistors 180-1, 180-2, ..., and 180-M each with sources S and drains D. The second power transistor 14 is shown to include multiple transistors 182-1, 182-2, ..., and 182-P each with sources S and drains D. The plane-like metal layers 110 and 124 provide a strong plane interconnect while the interconnect 98 provides a weak local interconnect such as standard wiring. In the implementation that is shown in FIG. 5A, the transistors 12 and 14 are NMOS transistors, although other transistor types can be used.

The sources S of the first power transistor 12 and the drains D of the second power transistor 14 are connected to the plane-like metal layer 110 via the local interconnect 98. The drains D of the first power transistor 12 are connected to the second plane-like portion 124-2 of the plane-like metal layer 124. The sources S of the second power transistor 14 are connected to the first plane-like portion 124-1 of the plane-like metal layer 124. The first and second plane-like portions 124-1 and 124-2 are electrically isolated.

The first contact portion 130-1 of the top plane-like metal layer 130 is connected to the second plane-like portion 124-2. The second contact portion 130-2 of the top plane-like metal layer 130 is connected to the plane-like metal layer 110. The third contact portion 130-3 of the top plane-like metal layer 130 is connected to the first plane-like portion 124-1. The plane-like portions 124-1 and 124-2 preferably covers approximately 80%-100% of the underlying transistors 14 and 12, respectively. The plane-like metal layer 110 covers approximately 80%-100% of the underlying transistors 12 and 14.

Figure 5B:
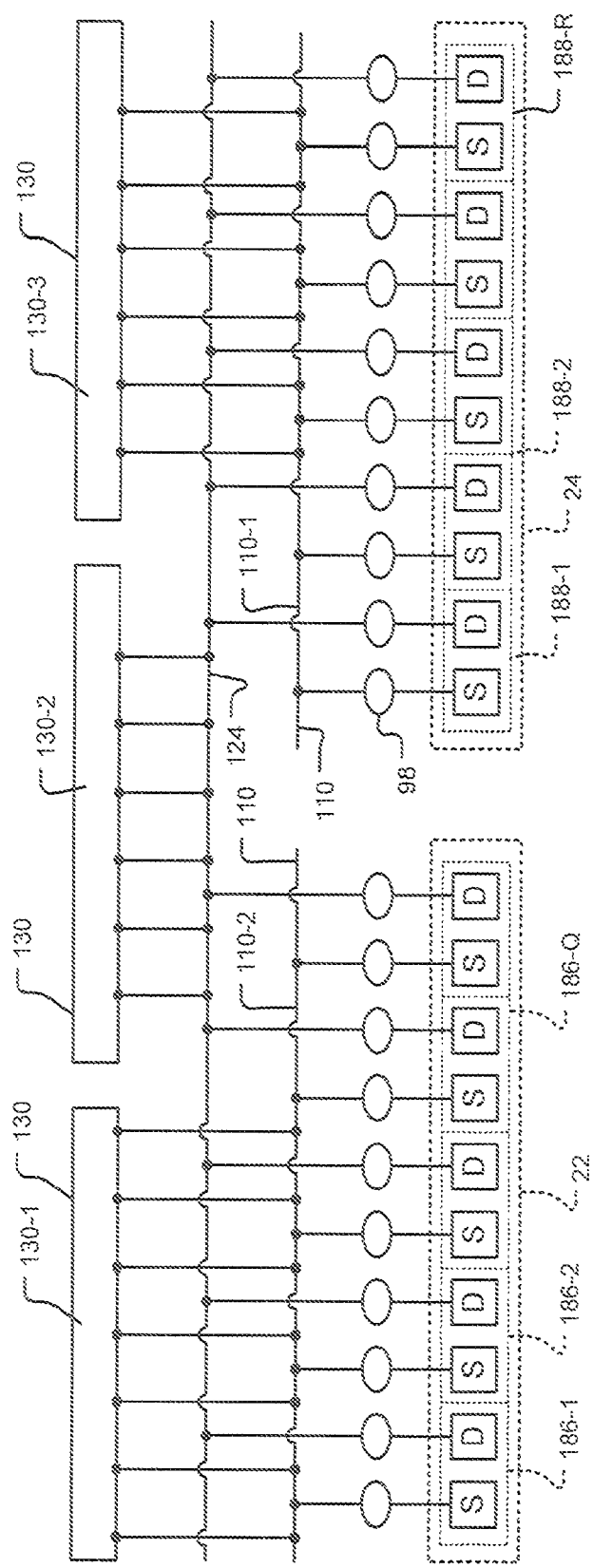
FIG. 5B is an electrical schematic illustrating the power IC of FIG. 1B.

Referring now to FIG. 5B, the first power transistor 22 is shown to include multiple transistors 186-1, 186-2, ..., and 186-Q each with sources S and drains D. The second power transistor 24 is shown to include multiple transistors 188-1, 188-2, ..., and 188-R each with sources S and drains D. In the implementation that is shown in FIG. 5B, the first power transistor 22 is an PMOS transistor and the second power transistor 24 is an NMOS transistor, although other transistor types can be used. The drains D of the first power transistor 22 and the drains D of the second power transistor 24 are connected to the plane-like metal layer 124. The sources S of the first power transistor 22 are connected to a second plane-like portion 110-2 of the plane-like metal layer 110. The sources S of the second power transistor 24 are connected to a first plane-like portion 110-1 of the plane-like metal layer 110. The first and second plane-like portions 110-1 and 110-2 are electrically isolated.

The first contact portion 130-1 of the top plane-like metal layer 130 is connected to the second plane-like portion 110-2 of the plane-like metal layer 110. The second contact portion 130-2 of the top plane-like metal layer 130 is connected to the plane-like metal layer 124. The third contact portion 130-3 of the plane-like metal layer 130 is connected to the first plane-like portion 110-1 of the plane-like metal layer 110.

Referring now to FIG. 6A, a plan view of a preferred embodiment of the top metal layer 130 is shown. A first contact portion 200 that is arranged in the top plane-like metal layer 130 includes a plurality of wings 202 that extend from a base portion 204. In one implementation, the first contact portion 200 is associated with $V_{ss}$ or $V_{dd}$ and the wings 202 extend in a perpendicular direction from the base portion 204. A second contact portion 210 that is arranged in the top plane-like metal layer 130 also includes a plurality of wings 212 that extend from a base portion 214. In one implementation, the second contact portion 210 is associated with $V_{dd}$ or $V_{ss}$ and the wings 212 extend in a perpendicular direction from the base portion 214.

One or more third contact portions 220 are located between the wings 202 and 212 of the first and second contact portions 200 and 210, respectively. In one implementation, the third contact portion 220 is associated with $V_x$ and the third contact portions 220 have a generally rectangular shape with rounded corners. The wings 202 and 212 reduce the impedance of the connection and increase heat dissipation. Additional contact portions 230 provide connections to control signals such as one or more gate control signals. The first, second and third contact portions substantially cover underlying transistor area. As used herein, substantially covering ⅓ means that each of the first, second and third contact portions cover ⅓ of the underlying area less spacing between the contact portions. In one embodiment, the first, second and third contact portions each cover about ⅓ of the underlying area less areas between the contact portions.

In a preferred embodiment, the IC has a length to width ratio that is greater than or equal to approximately 2:1. In a preferred embodiment, a plurality of fingers are employed. In the exemplary implementation, four fingers are used. The pitch between the fingers is preferably minimized to reduce resistance. The length of the IC is generally longer than the width to increase the number of fingers that can be employed. The combination of the increased number of fingers that are narrower reduces the resistance of the connection and increases heat dissipation. The use of global plane-like metal layers to connect the terminals of the transistors to the interconnect structure further reduces the resistance of the connections.

Referring now to FIG. 6B, the layout of the top plane-like metal layer 130 is shown relative to the underlying transistors 12 and 14. Approximately ⅓ of the area of the top plane-like metal layer 130 is assigned to each of $V_x$, $V_{ss}$ and $V_{dd}$. $V_x$, $V_{ss}$ and $V_{dd}$ are arranged in an interleaved manner as was described above in conjunction with FIG. 6A.

Referring now to FIG. 6C, an alternate layout for the top metal layer is shown. Approximately ⅓ of the area of the top plane-like metal layer 130 is assigned to each of $V_x$, $V_{ss}$ and $V_{dd}$ in a non-interleaved manner as was described above. This implementation is suitable for smaller power transistor applications.

Referring now to FIG. 6D, the top plane-like metal layer 130 is shown for a power IC with additional transistors. As shown in FIG. 6D, approximately ⅓ of the area of the top plane-like metal layer 130 is assigned to each of $V_x$, $V_{ss}$ and $V_{dd}$ in a non-interleaved manner. The layout that is shown in FIG. 6D is particularly suitable when the $V_{ss}$ and $V_{dd}$ connections are made on one side and the $V_x$ connections are made on an opposite side of the power IC. While FIGS. 6A-6D were described in conjunction with transistors 12 and 14, transistors 22 and 24 and/or other types of transistors may also be used.

Figure 7:
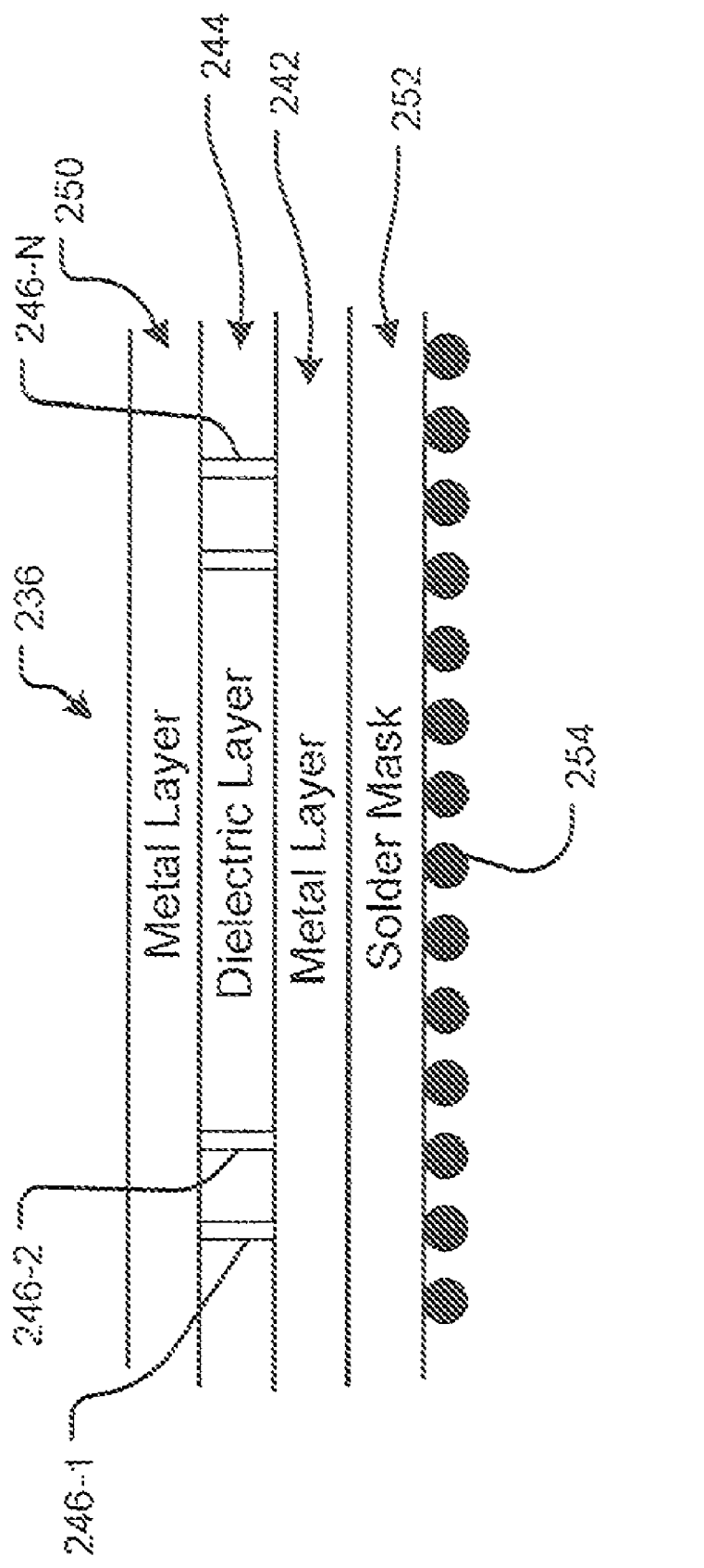
FIG. 7 is a cross sectional view illustrating layers of a first exemplary interconnect structure.

Referring now to FIG. 7, a first exemplary interconnect structure 236 is shown in further detail. The interconnect structure 236 may be used to connect one integrated circuit to another and/or to connect external components such as output circuits, capacitors, heat sinks, inductors, and/or other external components and/or structures. For example, the interconnect structure 236 may be used to connect the power IC to the drive IC in FIG. 2.

The interconnect structure 236 includes a dielectric layer 244 having a second metal layer and/or traces 242 arranged on one side thereof. A first or buildup metal layer 250 is built up on an opposite or outer side of the dielectric layer 244. Vias 246-1. 246-2, ..., and 246-N (collectively 246) pass through the dielectric layer 244. A solder mask 252 is arranged over the second metal layer 242. Solder balls 254 are selectively used to connect portions of the first and/or second metal layer 250 and/or 242 to other electronic devices, as will be described below.

Figure 8B:
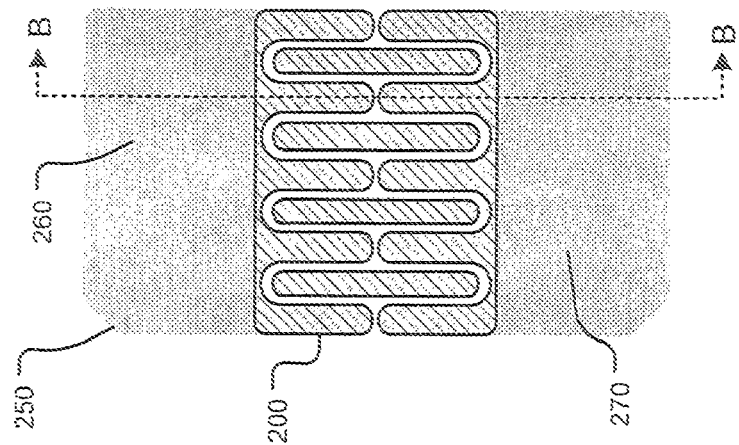
FIG. 8B is a plan view illustrating alignment of the top metal layer of the interconnect structure and the top metal layer of the IC.
Figure 8A:
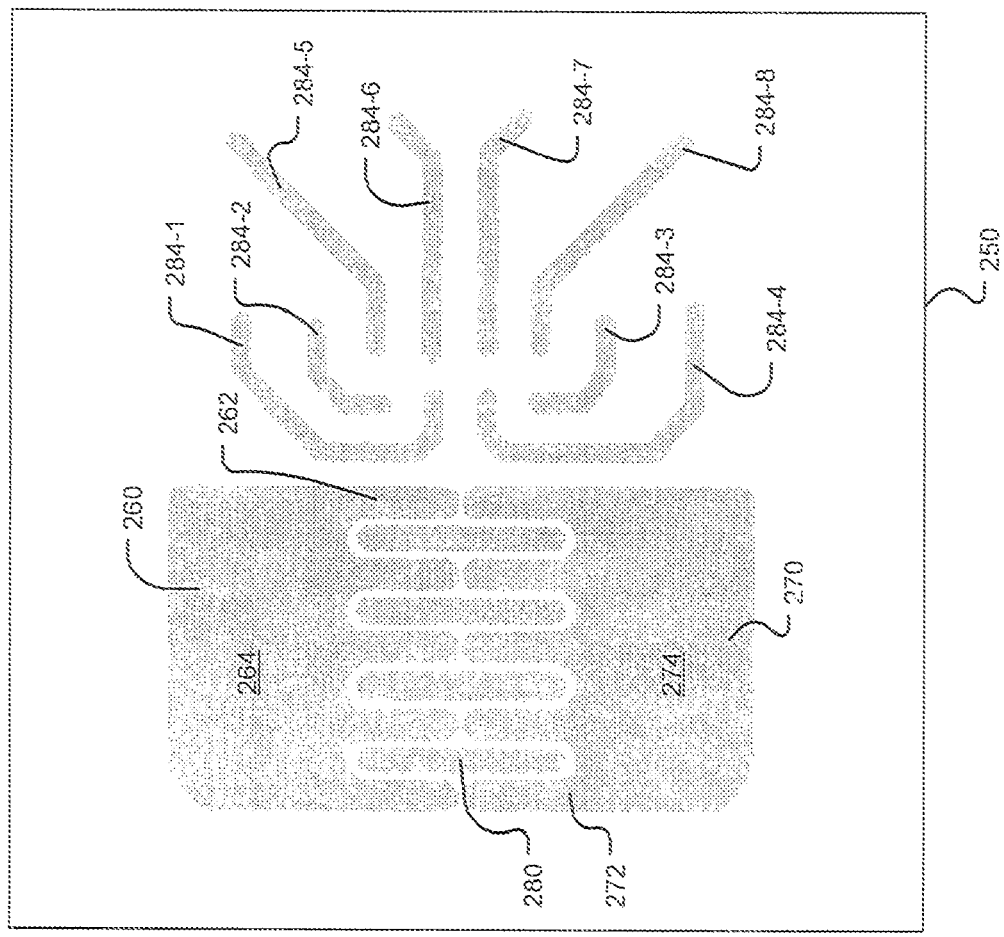
FIG. 8A is a plan view illustrating a top metal layer of the interconnect structure of FIG. 7.

Referring now to FIG. 8A, one exemplary embodiment of the metal buildup layer 250 is shown. The metal buildup layer 250 includes a first plane-like contact portion 260 that includes wings 262 that project from a base portion 264. The wings 264 have a shape and size that allows alignment with the wings 202 and/or 212 that are arranged on the metal layer 130 of the power IC 54. The metal buildup layer 250 includes a second plane-like contact portion 270 that includes wings 272 that project from a base portion 274. The wings 274 have a shape and size that also aligns with the wings 202 and/or that are arranged in the metal layer 130 of the power IC 54.

The metal buildup layer 250 includes one or more third plane-like contact portion(s) 280 that are located between wings 262 and 272 of the first and second plane-like contact portions 260 and 270, respectively. The third plane-like contact portions 280 also have a shape and size that also allows alignment with the third plane-like contact portions 220 that are arranged on the metal layer 130 of the power IC 54.

The metal buildup layer 250 also includes one or more additional contact portions 284 that provide control signal interconnects. One or more of the additional contact portions 284 may be associated with gate control signals. In one exemplary implementation, the buildup layer 250 is arranged by electroplating a conductive material such as copper onto the dielectric layer. Skilled artisans will appreciate that other materials and methods may be used. In one embodiment, the buildup layer 250 has a minimum thickness of approximately 15 µm and an average thickness of approximately 18 µm, although other thicknesses may be employed.

Referring now to FIG. 8B, the metal buildup layer 250 of the interconnect structure 236 is shown relative to the top metal layer 130 of the power IC. As can be appreciated, the two structures substantially align with each other and overlap. However, the metal buildup layer 250 may extend beyond the top metal layer 130 of the power IC to reduce resistance and to increase heat dissipation.

Figure 9:
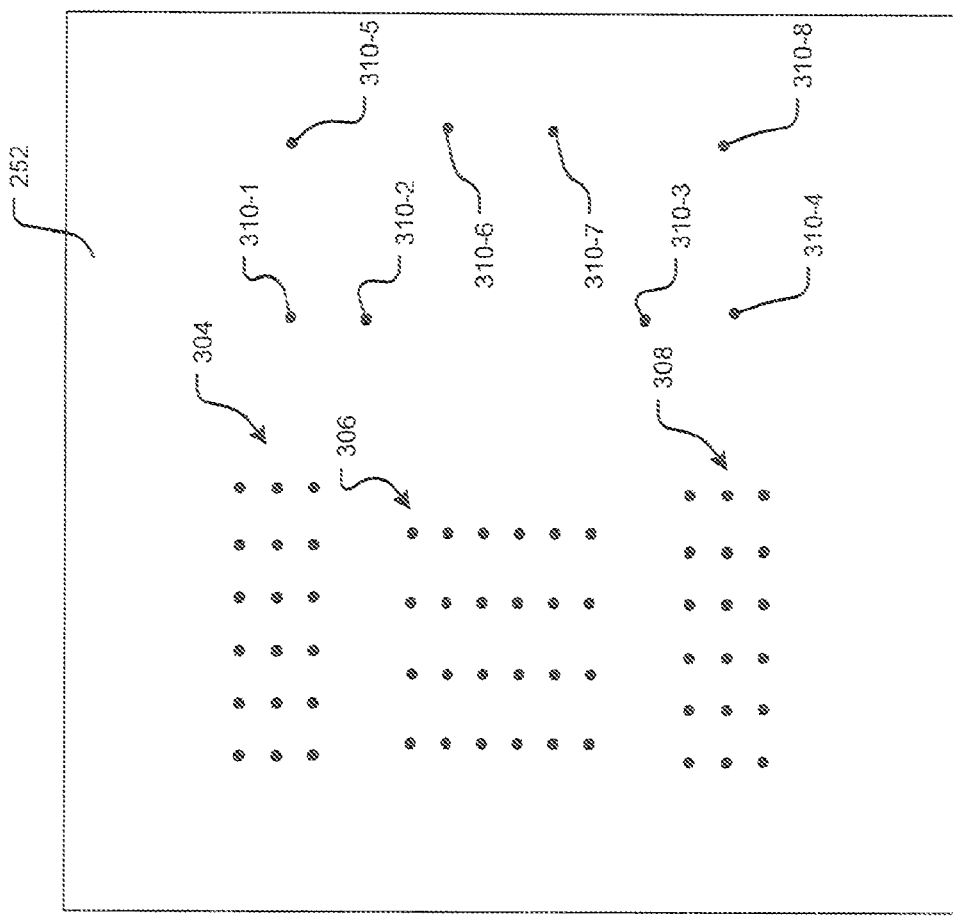
FIG. 9 is a plan view of a dielectric layer of the interconnect structure of FIG. 7.

Referring now to FIG. 9, the dielectric layer 252 is shown in further detail. The dielectric layer 252 includes a set of vias 304 that align with the body 264 of the first portion 260. The dielectric layer 252 includes a set of vias 308 that align with the base portion 264 of the second plane-like contact portion 270. The dielectric layer 252 also includes a set of vias 306 that align with the third plane-like contact portions 280. In an exemplary embodiment, the set of vias 306 are arranged in rows and each of the third plane-like contact portions 280 includes a row of the vias 306. Additional vias 310-1, 310-2, ..., 310-8 are provided and align with the additional portions 284-1, 284-2, ..., 284-8 arranged in the metal buildup layer 250. In one exemplary implementation, the vias in the core dielectric layer 252 are 57 µm solid copper vias.

Figure 10:
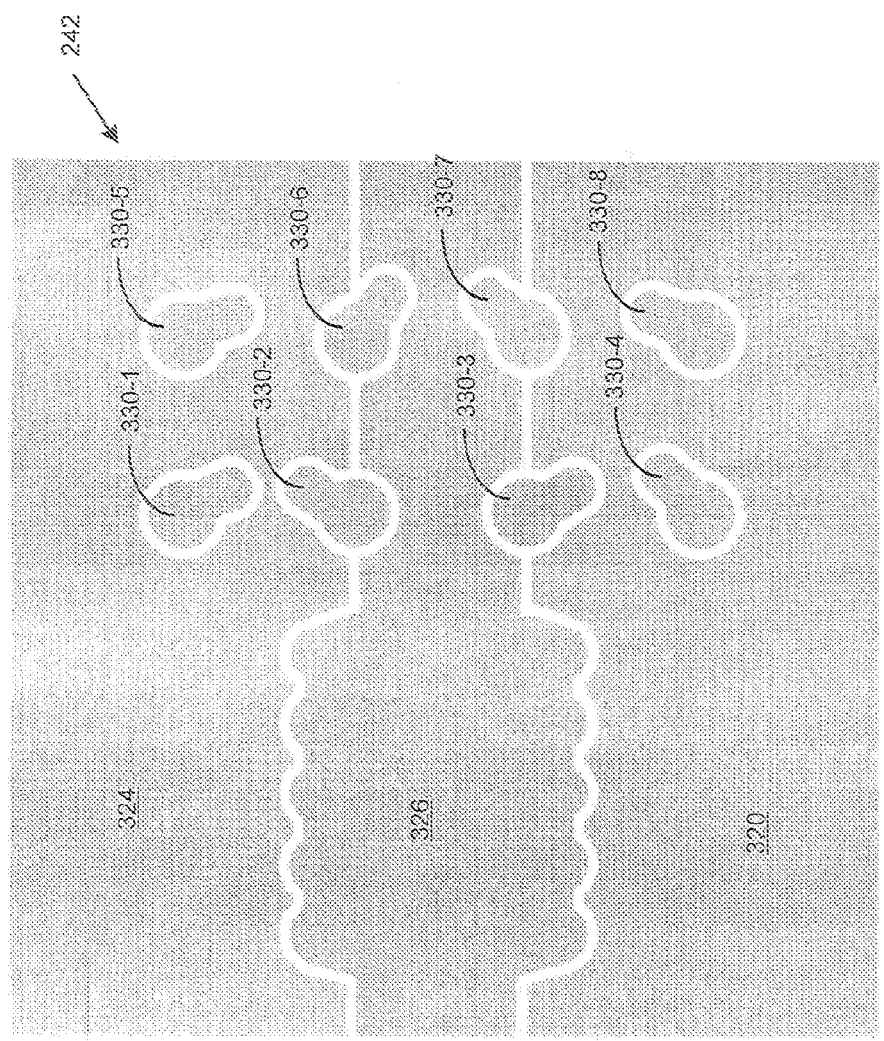
FIG. 10 is a plan view of a metal layer of the interconnect structure of FIG. 7.

Referring now to FIG. 10, an exemplary implementation of the metal layer 242 is shown in further detail. The metal layer 242 includes a first plane-like conducting portion 320 that is in electrical contact with the set of vias 308. The metal layer 254 includes a second plane-like conducting portion 324 that is in electrical contact with the set of vias 304. The metal layer 254 includes a third plane-like conducting portion 326 that is in electrical contact with the set of vias 306. The metal layer 254 includes an additional plane-like conducting portions 330-1, 330-2, 330-3, ..., 330-8 that are in electrical contact with the vias 310-1, 310-2, 310-3, ..., 310-8. In a preferred embodiment, the additional plane-like conducting portions 330 are generally pear-shaped, although other shapes maybe used. As used herein, the term "generally" means approximately and may include rounding of corners and other variations from the shape. The plane-like conducting portions in FIG. 10 are electrically isolated from each other.

Figure 11:
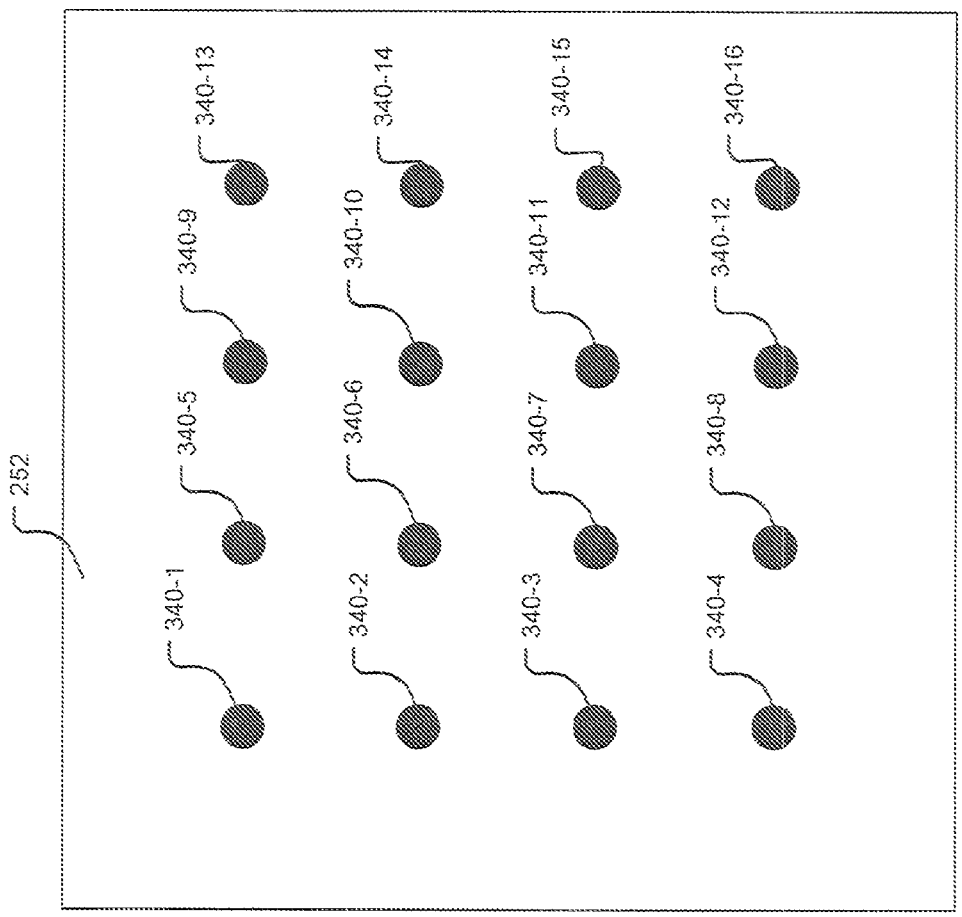
FIG. 11 is a plan view of a solder mask layer of the interconnect structure of FIG. 7.

Referring now to FIG. 11, a dielectric layer forms the solder mask 252 and includes openings 340-1, 340-2, ..., and 340-16, which receive solder balls that are used to attach the interconnect structure 236 to other electronic devices. In one exemplary implementation, the openings have a 1.0 mm ball pitch, although other ball pitches may be used.

Figure 12:
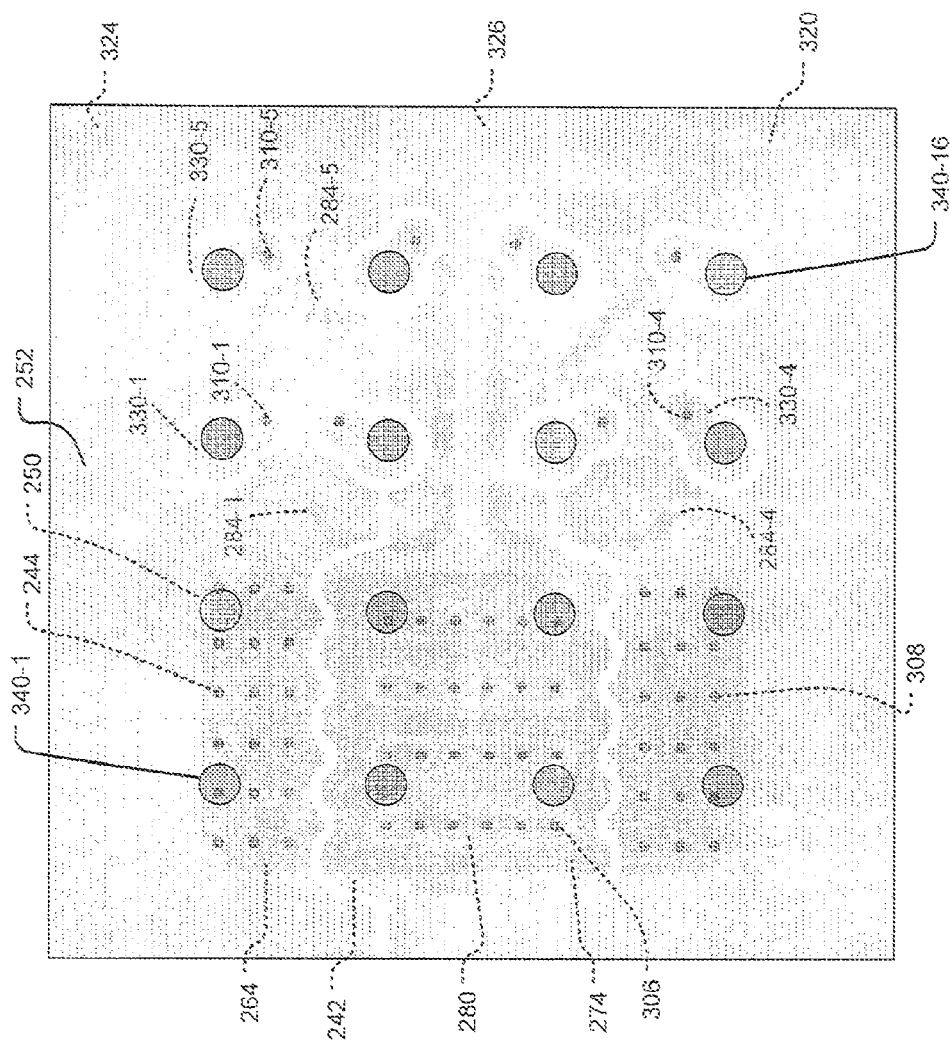
FIG. 12 illustrates alignment and orientation of the layers shown in FIGS. 7-11.

Referring now to FIG. 12, alignment of the metal buildup layer 250 relative to the dielectric layer 244 of FIG. 9, the metal layer 242 of FIG. 10 and the solder mask 252 of FIG. 11 is shown.

Figure 13:
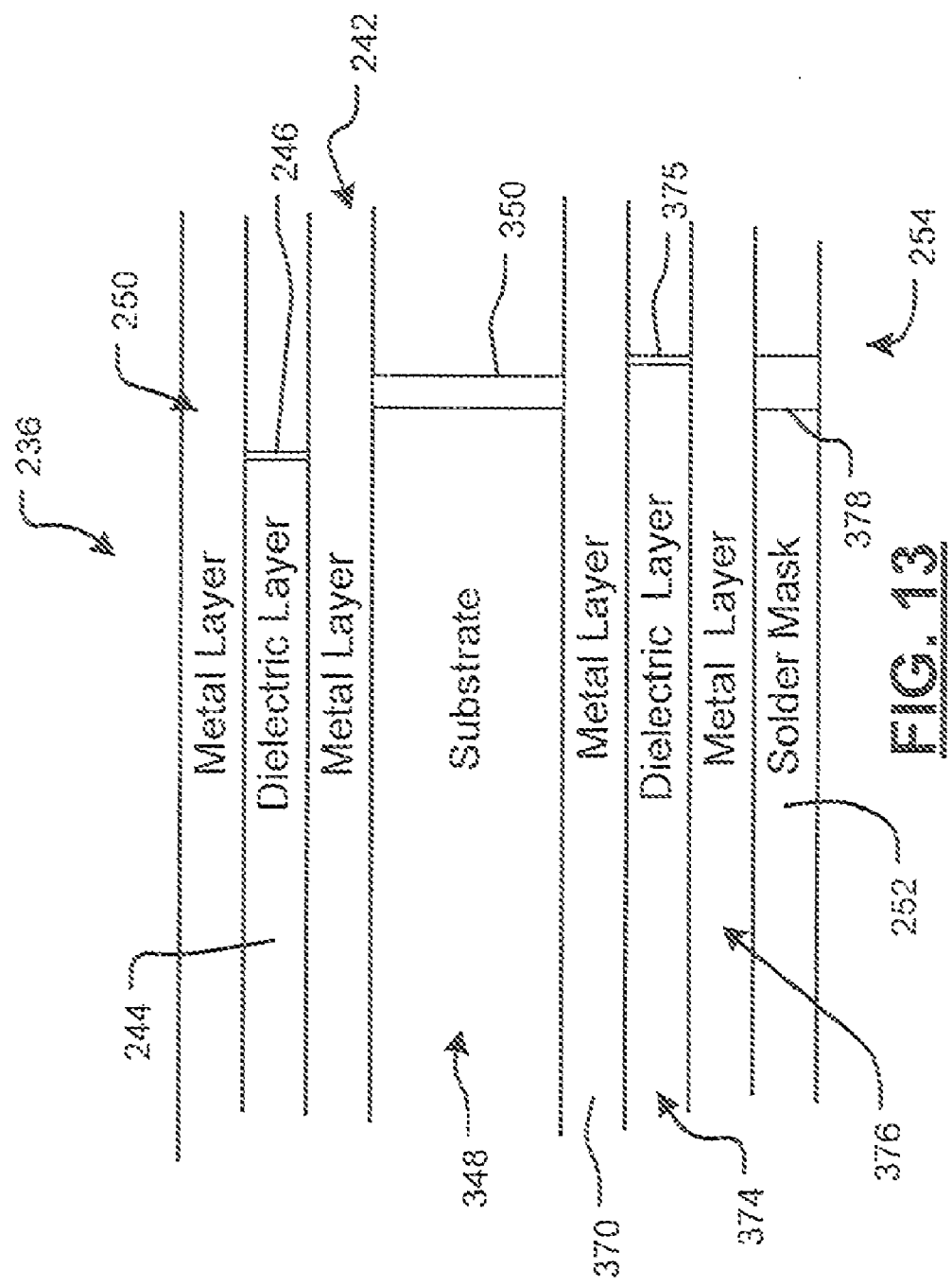
FIG. 13 illustrates layers of a second exemplary interconnect structure.

Referring now to FIG. 13, the interconnect structure 236 can be designed with additional metal and dielectric layers to provide structural support and/or to prevent warpage due to thermal expansion and contraction. The interconnect structure in FIG. 13 includes the layers that are shown and described in conjunction with FIGS. 7-12, however, additional layers are provided between the second metal layer 242 and the solder mask 252.

The interconnect structure 236 includes a substrate 348 with plated through holes (PTH) 350, which provide a connection from the metal layer 242 to a metal layer 370. The metal layer 370 is arranged on an opposite side of the substrate 348. A dielectric layer 374 is arranged adjacent to the metal layer 370 and includes vias 375, which provide a connection from the metal layer 370 to a metal layer 376. The metal layer 376 is arranged on an opposite side of the dielectric layer 374. In one implementation, the metal layer 370 has a structure that is similar to the metal layer 242 that is shown in FIG. 10. The solder mask layer 252 is arranged on an opposite side of the metal layer 376. Openings 378 in the solder mask layer 252 allow solder balls 254 to provide connections to other electronic devices.

The metal layers are 250, 242, 370 and 376 are preferably formed using copper, aluminum or any other suitable conductive material. The metal layers 354 and/or 350 can be traces that are etched and/or otherwise formed on the substrate 348. The metal layers 250 and 376 can be buildup layers that are formed by electroplating.

Figure 14:
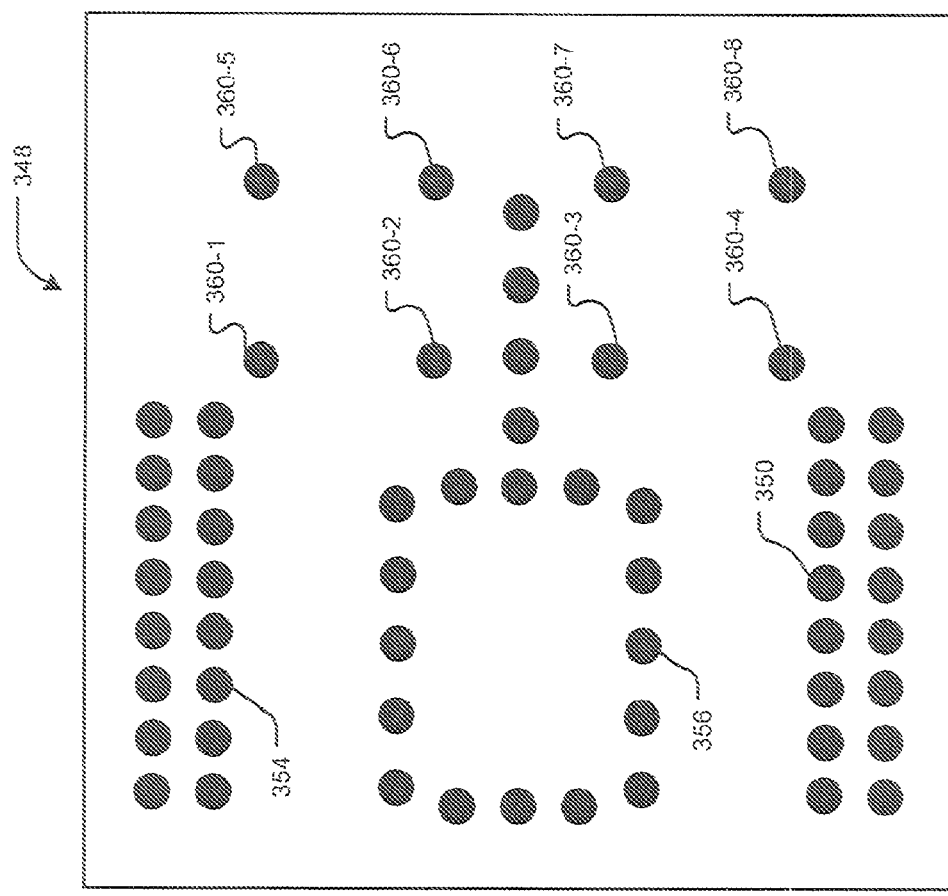
FIG. 14 is a plan view of a core dielectric layer with plated through holes (PTHs)
Figure 15:
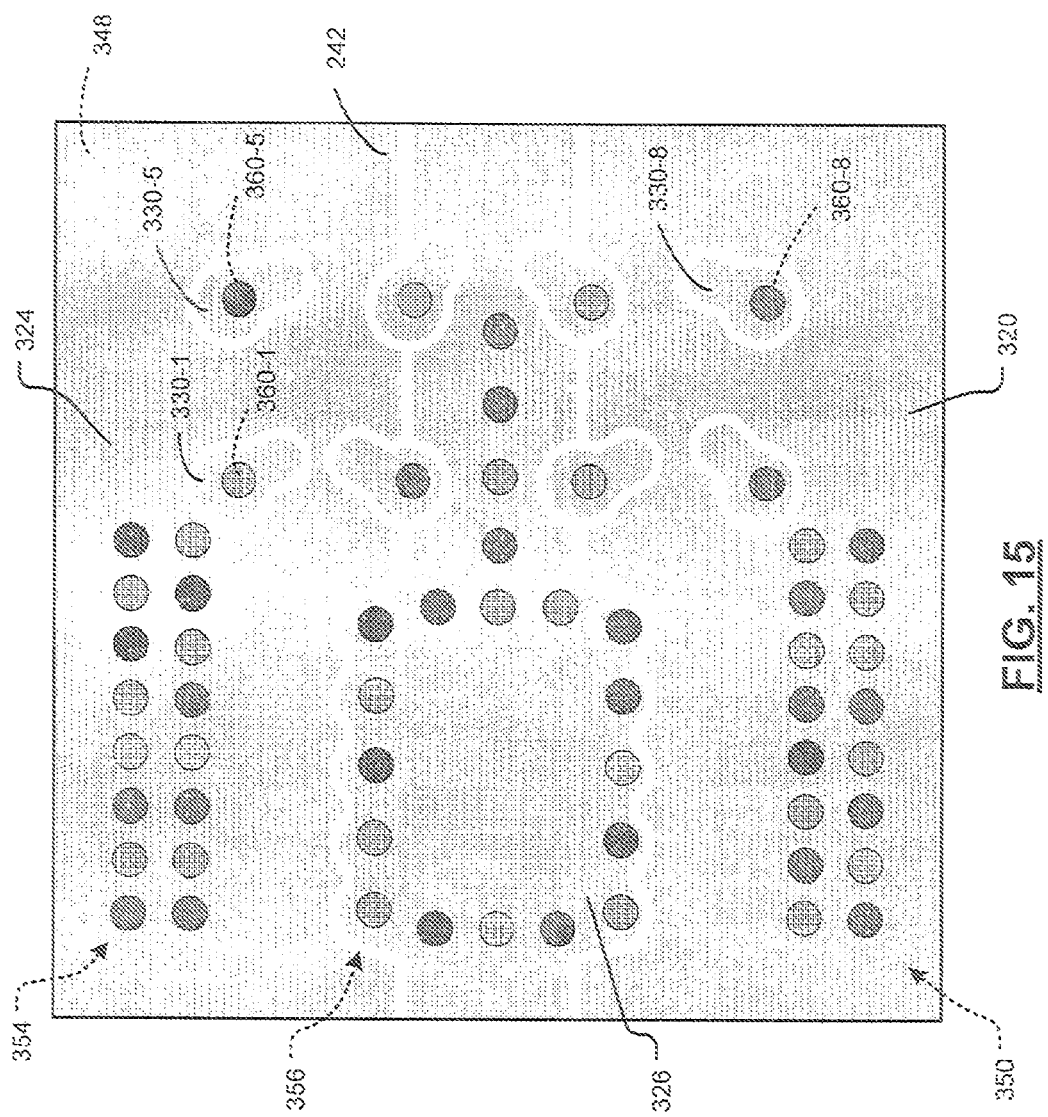
FIG. 15 illustrates alignment of the plated through holes of the core dielectric layer (shown on bottom) and an additional metal layer (shown on top) that is similar to the layer shown in FIG. 10.

Referring now to FIGS. 14 and 15, in one exemplary implementation, the substrate 348 includes a first set of PTH 350 that are electrically connected to and aligned with the first plane-like conducting portion 320 in FIG. 10. A second set of PTH 354 are electrically connected to and aligned with the second plane-like conducting portion 324 in FIG. 10. A third set of PTH 356 are electrically connected to and aligned with the third plane-like conducting portion 326 in FIG. 10. The substrate 348 further includes other PTHs 360-1, 360-2, ..., and 360-8 that are electrically connected to and aligned with the additional plane-like portions 330-1, 330-2, ..., 330-8. In a preferred embodiment, the PTH have a diameter of 200 μm with 15 μm minimum and 18 μm average plating wall thickness. In FIG. 15, the alignment of the substrate 348 (on bottom) is shown relative to the metal layer 242 (on top).

Figure 16:
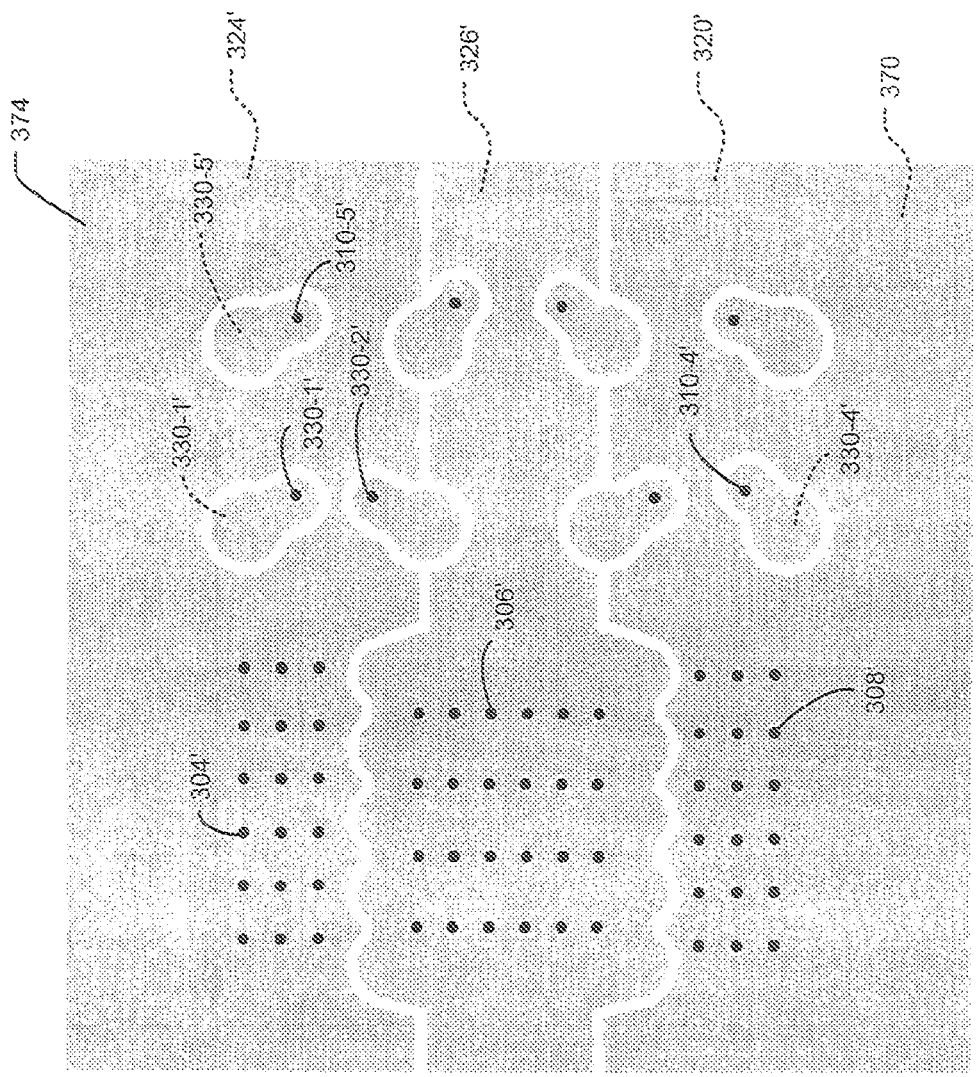
FIG. 16 illustrates alignment of the metal layer of FIG. 15 (shown on bottom) and vias in an additional dielectric layer (similar to that shown in FIG. 9) (shown on top)

Referring now to FIG. 16, the alignment and orientation of the dielectric layer 374 (on top) and the metal layer 370 (on bottom) is shown. The alignment and orientation is similar to the dielectric layer 244 and the metal layer 242 that are shown in FIG. 12. Since the dielectric layers 244 and 374 are similar, the same reference numerals are used followed by "'". A similar approach will be used for the metal layers 242 and 370.

Figure 17:
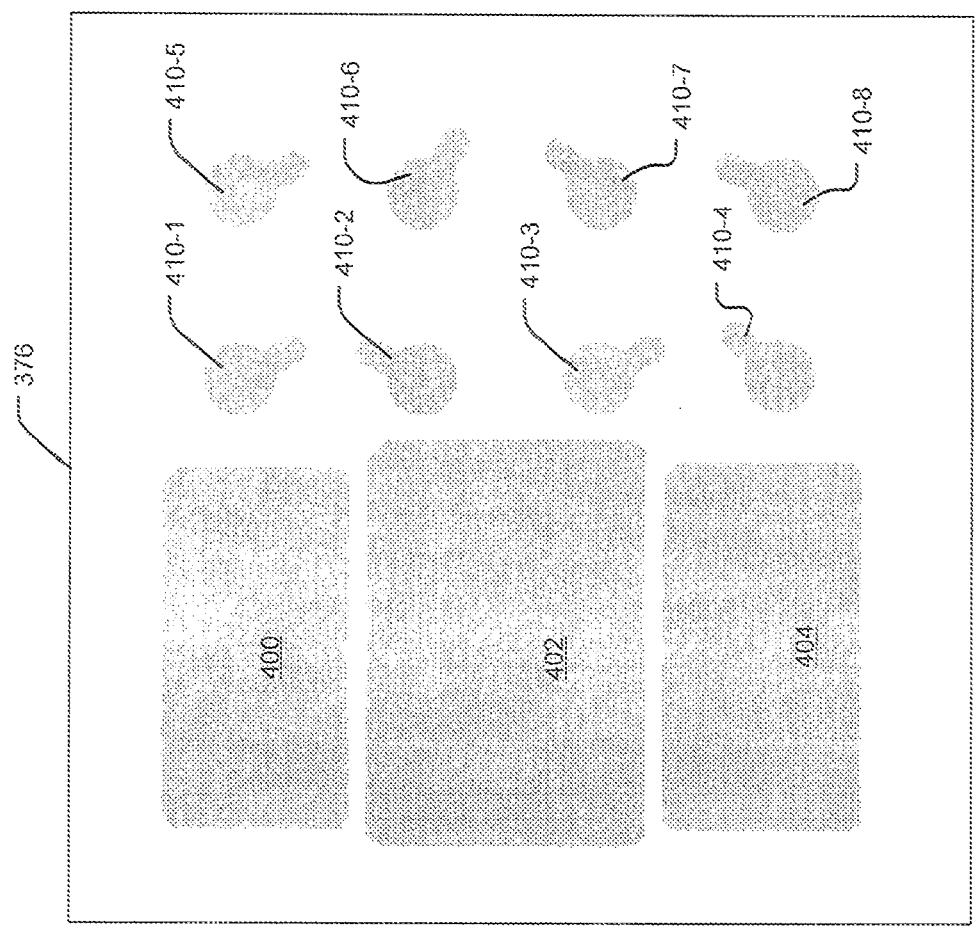
FIG. 17 is a plan view illustrating a metal layer.

Referring now to FIG. 17, the bottom metal layer 376 is shown in further detail and includes first, second and third plane-like conducting portions 400, 404 and 406. In a preferred embodiment, the plane-like conducting portions 400, 404 and 406 have a generally rectangular shape, although other shapes may be used. Additional plane-like conducting portions 410-1, 410-2, 410-3, ..., 410-8 are also provided. The additional conducting portions 410-1, 410-2, 410-3, ..., 410-8 have a generally pear-shaped cross-section, although other shapes may be used.

Figure 18:
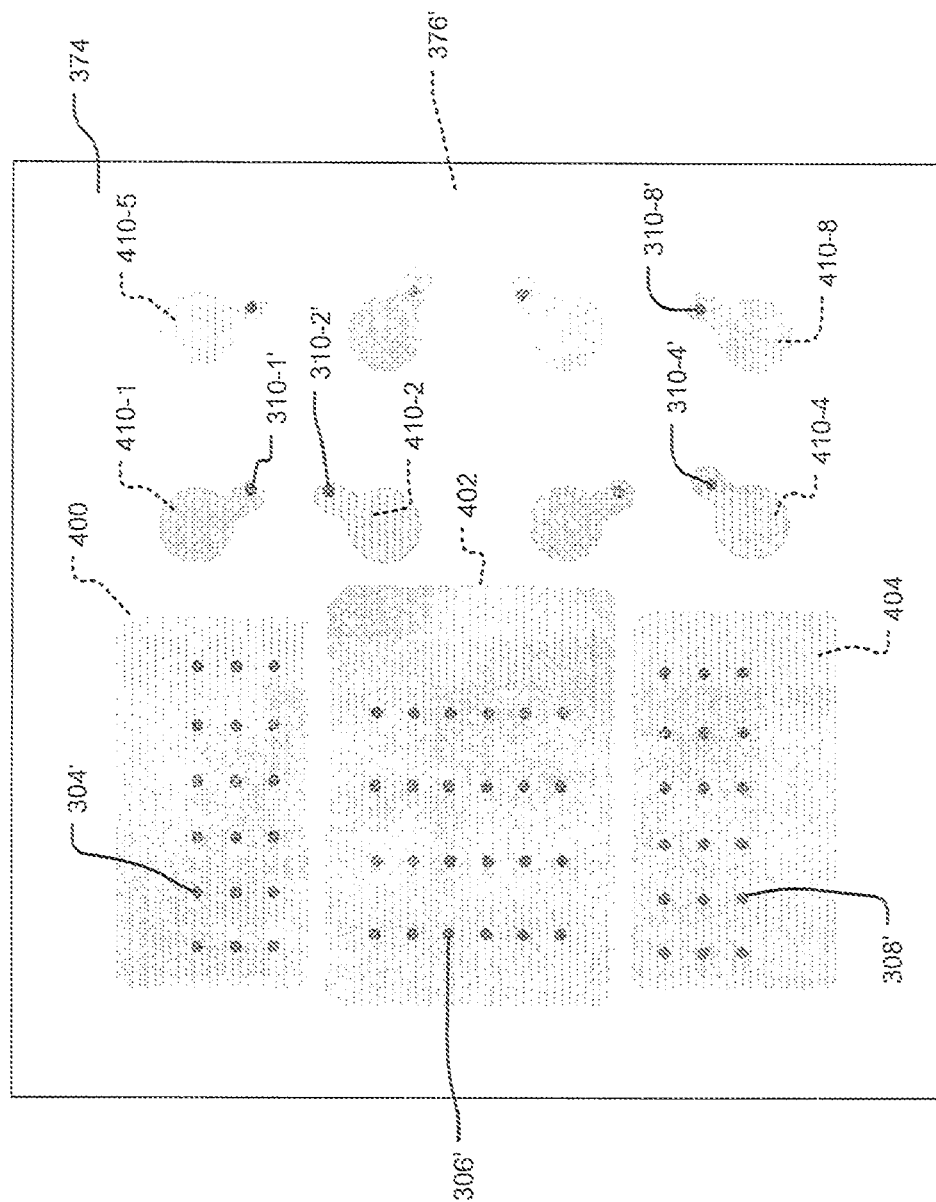
FIG. 18 illustrates alignment of the vias of the dielectric layer of FIG. 16 (shown on bottom) and the metal layer of FIG. 17 (shown on top)

Referring now to FIG. 18, alignment and interconnection of the vias 304', 306', 308' and 310-1', 310-2', ..., and 310-8' on the dielectric layer 374 (on top) are shown relative to the plane-like portions of the metal layer 376 (on bottom). The conducting portions preferably have a minimum thickness of 15 μm and an average thickness of 18 μm.

The vias 308' connect the first portion 320' of the metal layer 370 and the plane-like conducting portion 404 of the metal layer 376. The vias 304' connect the second portion 324' of the metal layer 370 and the plane-like conducting portion 404 of the metal layer 376. The vias 306' connect the third portion 326' of the metal buildup layer 370 and the plane-like conducting portion 402 of the metal layer 376. Additional vias 310-1', 310-2', ..., 310-8' connect the additional portions 330-1', 330-2', ..., 330-8' of the metal layer 370 to additional portions 410 of the metal layer 376.

Figure 19:
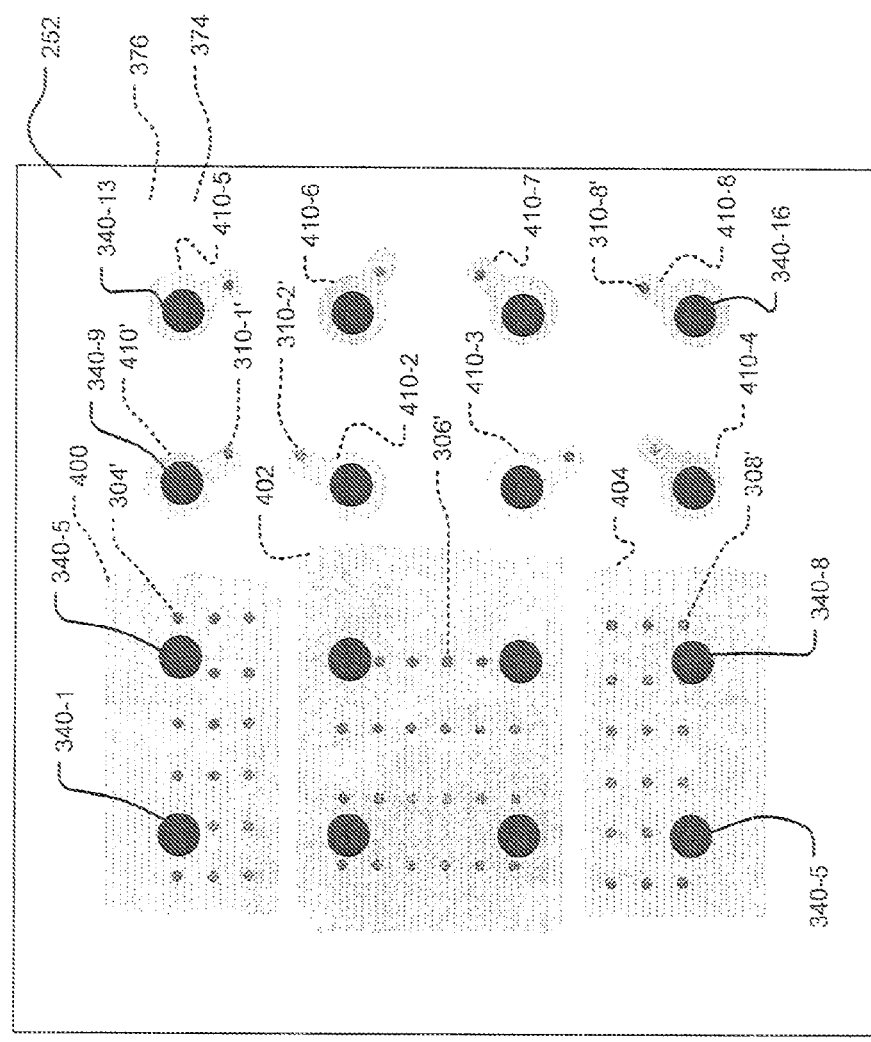
FIG. 19 illustrates alignment of the layers of FIG. 18 and the solder mask layer of FIG. 11.

Referring now to FIG. 19, the solder mask layer 252 is shown on top of the metal layer 376 and the dielectric layer 374. Alignment of the openings 340-1', 340-2', ..., 340-16' are shown relative to the plane-like portions of the metal layer 376.

Figure 20:
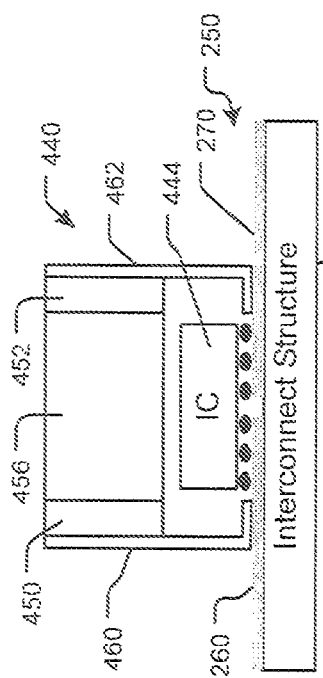
FIGS. 20 and 21 show alternate embodiments of the top metal buildup layers of the interconnect structure.
Figure 21:
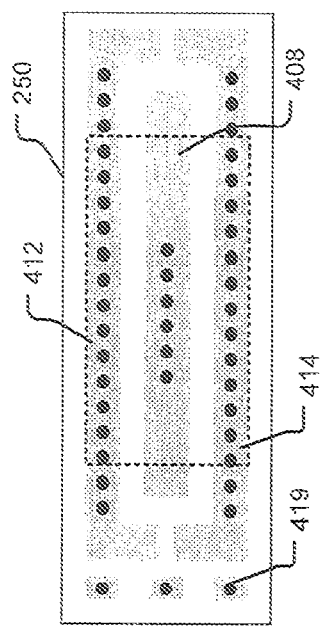

Referring now to FIGS. 20 and 21, additional layouts for the top metal buildup layer 250 are shown. As can be seen in FIGS. 20 and 21, the top metal layer of the power IC aligns with the top metal buildup layer. The top metal layer of the power IC may be a mirror image of the top metal buildup layer. Alternately, the top metal layer of the power IC may partially align with the top metal buildup layer as shown by dotted lines in FIGS. 20 and 21. The top metal buildup layer may extend beyond the aligned top metal layer of the power IC to reduce resistance and increase heat dissipation.

In FIG. 20, $V_{dd}$ is associated with a first outer contact portion 412, which has a generally "C"-shaped configuration. $V_{ss}$ is associated with a second outer contact portion 414, which also has generally "C"-shaped configuration. A middle contact portion 418 is located between the first and the second outer contact portions 412 and 414, respectively. One or more additional contact portions 419 may be arranged along one or more sides or ends of the buildup layer 250 and/or between contact portions 412 and 414 to accommodate control signals, such as gate control signals.

Referring now to FIG. 21, another layout for the top metal buildup layer 250 is shown. $V_{dd}$ is associated with a first outer portion 422, which has a generally rectangular configuration. $V_{ss}$ is associated with a second outer portion 424, which has generally rectangular configuration. A middle portion 428 is located between the first and second outer portions 422 and 424, respectively. One or more additional portions 430 may be arranged along one or more sides or ends of the buildup layer 420 to accommodate control signals, such as gate control signals.

Figure 22:
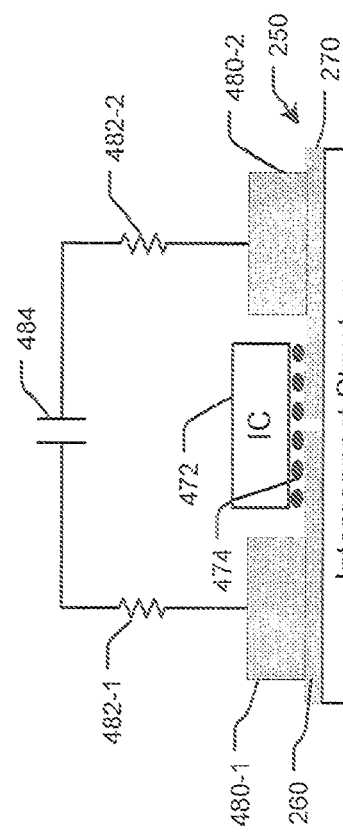
FIGS. 22 and 23 are partial cross-sectional views of the interconnect structure (taken along B-B in FIG. 8B) with decoupling capacitors that are attached to the interconnect structure of FIG. 8B.

Referring now to FIG. 22, a decoupling capacitor 440 can be attached to the interconnect structure 236 between $V_{dd}$ and $V_{ss}$ in addition to an IC 444, which is mounted on the metal buildup layer 250 of the interconnect structure 236. The decoupling capacitor 440 includes first and second conducting plates 450 and 452 that are separated by an insulating material 456. The plates 450 and 452 are connected by conductive arms 460 and 462, respectively, to the interconnect structure 236. In one implementation, the conductive arms 460 and 462 are connected to $V_{dd}$ and $V_{ss}$. Ends of the arms 460 and 462 are connected to the buildup layer 250 of the interconnect structure 236. Since the buildup layer 250 is relatively thin, it has a relatively high impedance. In one embodiment, the arms 460 and 462 have a generally "L"-shaped configuration.

Figure 23:
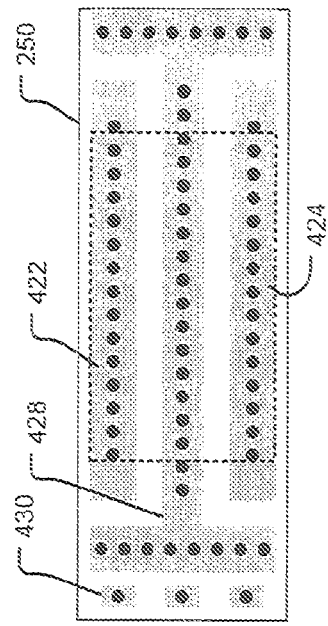

Referring now to FIG. 23, an IC 472 is connected by solder balls 474 to the buildup layer 250 of the interconnect structure 236. Additional metal layers 480-1 and 480-2 or bars are formed on the buildup layer 250 to increase strength and reduce the impedance thereof. In a preferred embodiment, the metal layers 480 are formed of copper. Short parasitic resistances 482-1 and 482-2 connect a capacitor 484 to the interconnect structure 236.

Referring now to FIGS. 24A, 24B, and 24C, one or more heat sinks can also be arranged on the metal buildup layer 250 of the interconnect structure 236 to dissipate heat. An integrated circuit (IC) 501, such as the power IC described above, is connected to the interconnect structure 236 in any suitable fashion such as adhesive, solder ball grid arrays, etc. In FIG. 24A, heat sinks 500-1 and 500-2 include a base portion 502 with a plurality of outwardly projecting fins 504. The base portion 502 is connected to the metal buildup layer 250. The fins 504 provide an increased surface area to exchange heat with surrounding air, which dissipates heat. In an alternate embodiment, the heat sink 502 does not include the fins 504.

In FIG. 24B, one surface of the IC 501 is connected to the interconnect structure 236 and an opposite surface is connected by a solder ball grid array 509 to one end of a heat sink strap 510. Another end of the heat sink strap 509 can also be connected to the metal buildup layer 250 of the interconnect structure 236, for example using solder balls. A stiffening bar 514 may be connected to one of the contact portions of the metal buildup layer to increase stiffness.

In FIG. 24C, one end of a heat sink strap 520 is connected to the interconnect structure using solder, adhesive, or any conventional method. A stiffening bar 514 provides a reinforced connection point for connecting the opposite end of the heat sink strap 520.

Referring now to FIGS. 25A and 25B, an alternate interconnect structure 600 includes a patterned Aluminum (Al) core. The Aluminum core is patterned using a series of masking steps and exposure to at least one of porous and/or dense anodization from one or both sides. If the patterning is done from both sides, the Aluminum core preferably has a thickness that allows anodization to be performed completely through the Aluminum core when two-sided patterning is performed.

The Aluminum core in FIG. 25A is patterned to define $V_{ss}$, $V_x$, $V_{dd}$ and gate regions 604, 606, 608, and 610, respectively. When the Aluminum core is used as an interconnect structure 600, however, the interconnect structure may be brittle. One or more inverted vias and/or buildup layers 614 are formed on the regions 604, 606, 608, and 610. In a preferred embodiment, the vias and/or buildup layers 614 are formed of Copper that is electroplated onto the aluminum core.

A stiffening material 616 is applied in between the inverted vias 614 to provide additional structural support. The stiffening material 616 is preferably non-conductive. In one embodiment, the stiffening material is epoxy. The stiffening material may end below the inverted vias and/or buildup layers 614, at a plane that is equal to the vias and/or buildup layers 614 and/or above the vias and/or buildup layers 614. Solder balls 620 are used to connect the inverted vias and/or buildup layers 614 to an integrated circuit such as a power IC and/or drive circuit. A similar structure may be used on an opposite side of the interconnect structure.

Referring now to FIG. 26, an alternate interconnect structure 630 includes pads 634 that are formed on the regions 604, 606, 608, and 610. The stiffening material 616 such as epoxy encases the pads 634 and an outer surface of the aluminum core to provide insulation and to increase stiffness.

Referring now to FIGS. 27A and 27B, an additional layout of the interconnect structure 650 with an Aluminum core is shown. To simplify FIG. 27A, the gate connections and solder balls are omitted. The interconnect structure 650 includes an Aluminum core with patterned $V_{ss}$, $V_x$, and $V_{dd}$ regions 652, 654 and 656. A stiffening material 660 is applied between the regions 652, 654 and 656 to increase stiffness as shown in prior FIGs. Inverted vias and/or buildup layers 664 are formed on the Aluminum core. The vias and/or buildup layers are preferably formed using electroplated Copper although other methods and material can be used. Solder balls 620 provide a connection from the vias and/or buildup layers 664 to an integrated circuit, such as the power IC and/or drive circuit.

Figure 28A:
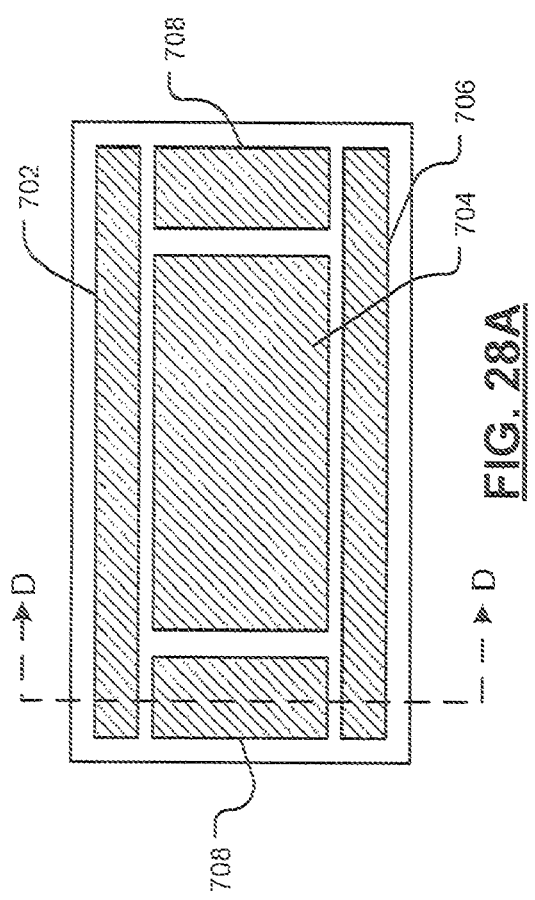
FIGS. 28A and 28B are a plan view and a cross-sectional view (taken along line D-D in FIG. 27B), respectively, of a third alternate exemplary layout for the interconnect structure with an aluminum core.
Figure 28B:
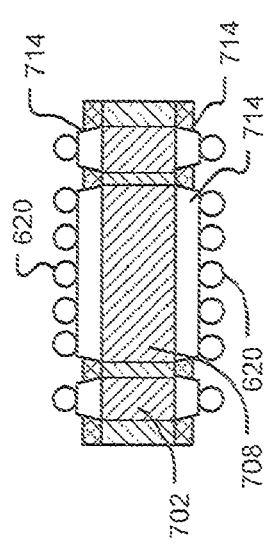

Referring now to FIGS. 28A and 28B, an additional layout of the interconnect structure 700 with an Aluminum core is shown. The interconnect structure 700 includes an Aluminum core with patterned $V_{ss}$, $V_x$, $V_{dd}$ and gate regions 702, 704, 706 and 708. A stiffening material 710 is applied between the regions 702, 704 and 706 to increase stiffness as shown in prior FIGs. Inverted vias and/or buildup layers 714 are formed on the Aluminum core. The vias and/or buildup layers 714 are preferably formed using electroplated Copper although other methods and materials can be used. Solder balls 620 provide a connection from the vias and/or buildup layers 714 to an integrated circuit, such as the power IC and/or drive circuit.

Figure 29A:
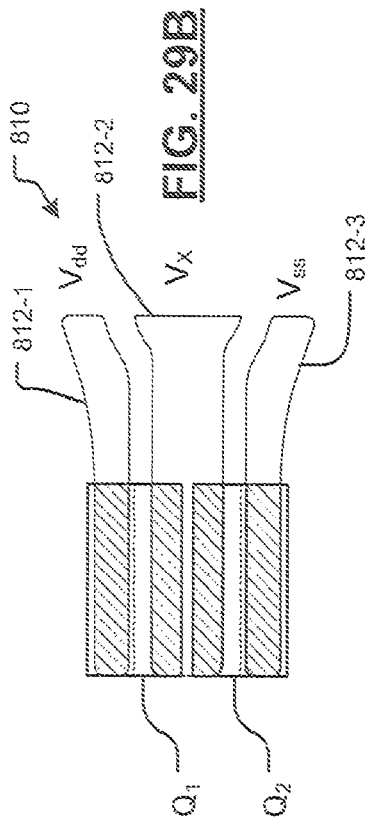
FIG. 29A is an electrical schematic of another exemplary power IC.
Figure 29B:
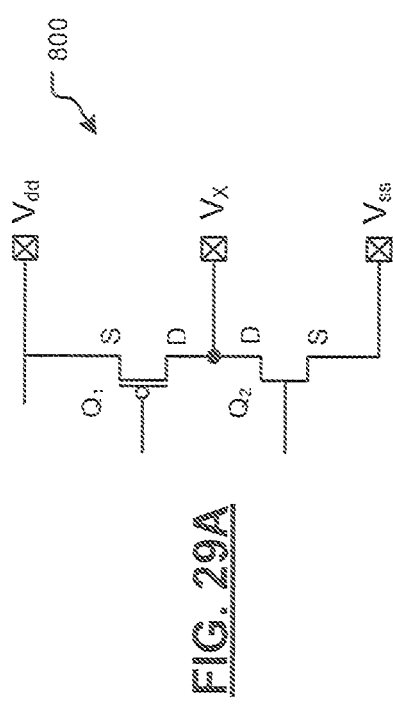
FIGS. 29B and 29C are plan views of leadframes that include transmission lines that are connected to the power IC of FIG. 29A.

Referring now to FIGS. 29A and 29B, an IC 800 such as a power IC is shown and includes a pair of transistors $Q_1$ and $Q_2$. The transistors $Q_1$ and $Q_2$ include a control terminal and first and second terminals. In FIG. 29B, a leadframe 810 defines transmission lines or planes 812-1, 812-2, and 812-3 (collectively transmission lines 812) that minimize parasitic inductance. In FIG. 29B, cross-hatched areas correspond to connections between the transmission lines or planes 812 and the top metal layer of the IC. In one embodiment, the leadframe 810 includes a mold compound that encapsulates the transmission lines 812 and the IC 800. The IC 800 preferably has a layout that is similar to that shown in FIGS. 1B and 4B. While PMOS and NMOS transistors with gates, sources S and drains D are shown, other types of transistors may be used.

Figure 30B:
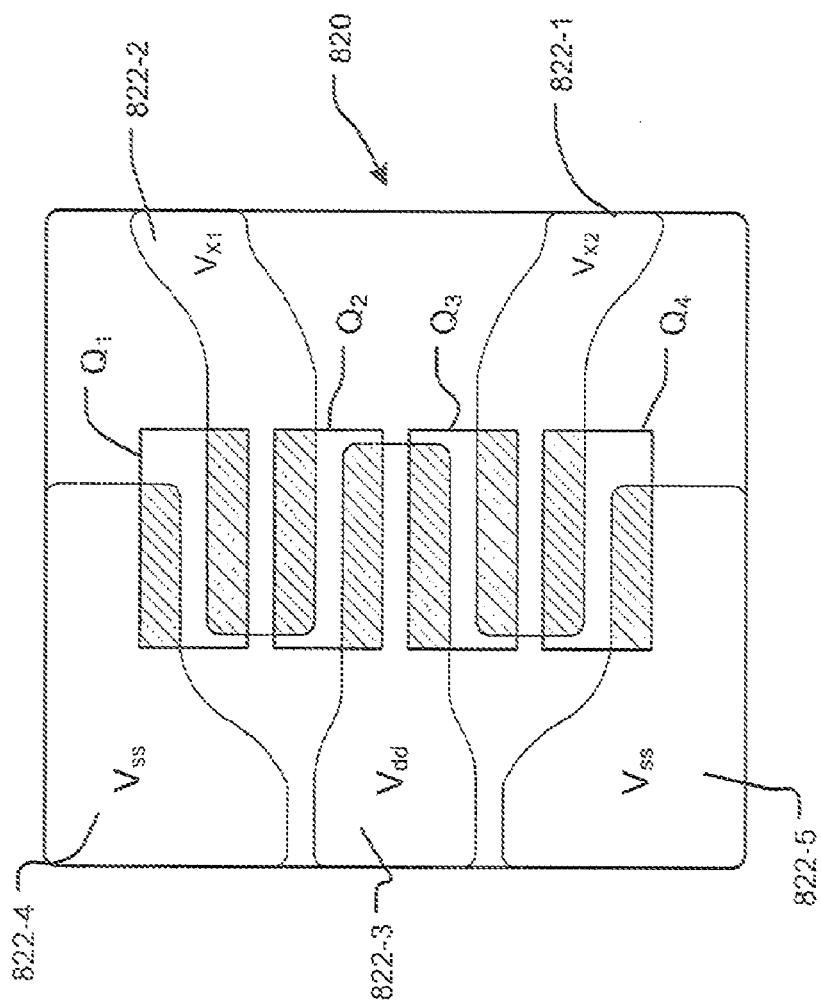
FIG. 30B is a plan view of a leadframe that includes transmission lines that are connected to the power IC of FIG. 30A.
Figure 30A:
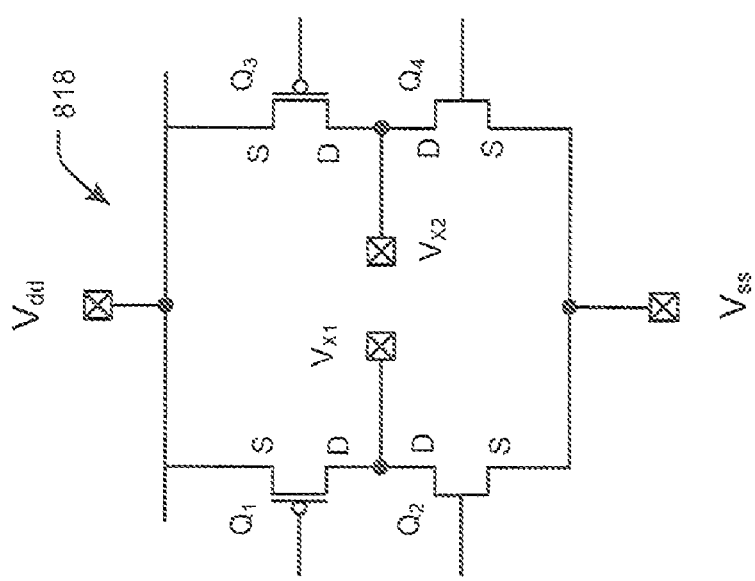
FIG. 30A is an electrical schematic of another exemplary power IC.

Referring now to FIGS. 30A and 30B, an IC 818 such as a power IC is shown and includes transistors $Q_1$, $Q_2$, $Q_3$, and $Q_4$. The transistors $Q_1$, $Q_2$, $Q_3$, and $Q_4$ include a control terminal and first and second terminals. A leadframe 820 includes transmission lines or planes 822-1, 822-2, 822-3, 822-4 and 822-5 (collectively transmission lines 822) that are connected to the IC 818. Some of the transmission lines 822 may be connected in parallel to the IC 818. For example, in one implementation the transmission line 822-3 supplies $V_{dd}$ to both a first transistor pair $Q_1$ and $Q_2$ and a second transistor pair $Q_3$ and $Q_4$. Transmission lines 822-1 and 822-2 receive outputs of the first pair $Q_1$ and $Q_2$ and the second pair $Q_3$ and $Q_4$, respectively. In FIG. 30B, cross-hatched areas correspond to connections between the transmission lines or planes 822 and the top metal layer of the IC 818. The IC 818 may have a layout that is similar to that shown in FIG. 4B. While PMOS and NMOS transistors with gates, sources S and drains D are shown, other types of transistors may be used.

Referring now to FIG. 31, a leadframe 840 for an IC such as a power IC with additional pairs of transistors is shown. Input transmission lines or planes 844-I (for example corresponding to outputs $V_{ss}$ and $V_{dd}$) are arranged along one side of the leadframe 840. Output transmission lines 844-O (for example corresponding to outputs $V_{x1} \ldots V_{x4}$) are arranged along an opposite side of the leadframe 840. The transmission lines or planes and the IC may be encapsulated in a mold compound 850. Cross-hatched areas correspond to connections between the transmission lines or planes 812 and the top metal layer of the IC.

Figure 29C:
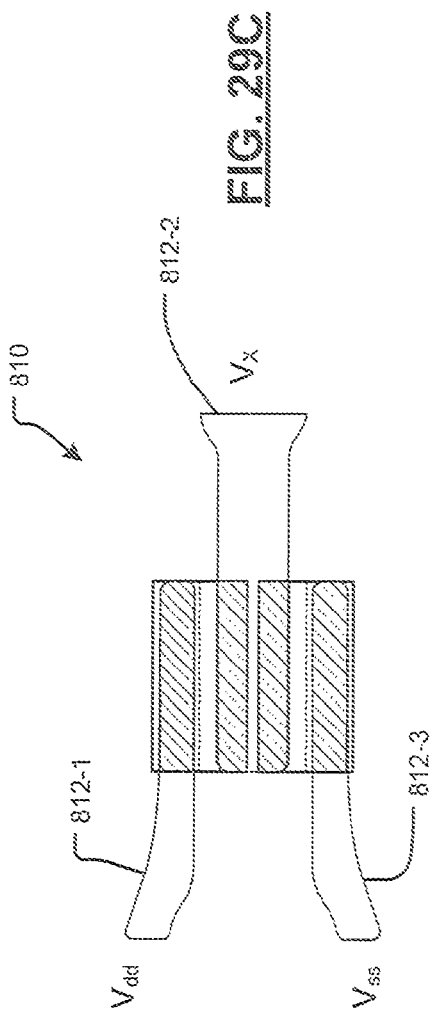
Figures 32A, 32B:
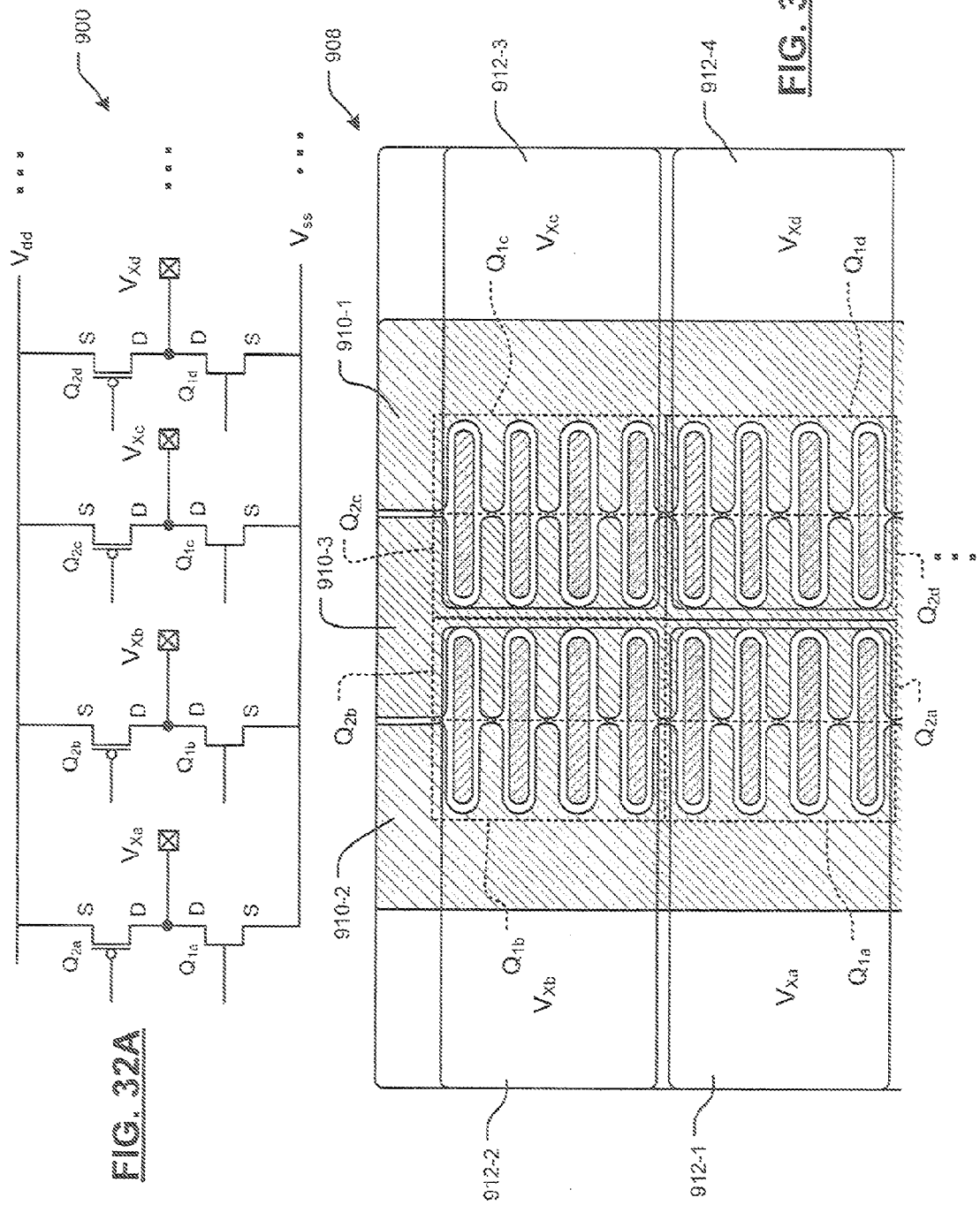
FIG. 32A is an electrical schematic of another exemplary power IC.
FIG. 32B is a plan view of a substrate with transmission lines that are connected to the power IC of FIG. 32A.

In FIGS. 29-31, the transmission lines or planes were generally located in a single plane. Referring now to FIGS. 32A and 32B, an IC such as a power IC is shown generally at 900. The IC 900 includes transistor pairs $Q_{1a}$, $Q_{2a}$, $Q_{1b}$, $Q_{2b}$, $Q_{1c}$, $Q_{2c}$, and $Q_{1d}$ and $Q_{2d}$ each including a control terminal and first and second terminals. While PMOS and NMOS transistors with gates, sources S and drains D are shown, other types of transistors may be used. Outputs $V_{xa}$, $V_{xb}$, $V_{xc}$ and $V_{xd}$ are taken between connected terminals of the pairs. The remaining terminals of the transistor pairs are connected to $V_{dd}$ and $V_{ss}$.

Referring now to FIG. 32B, the top metal layer of the IC 900 preferably has a layout that is similar to that shown in FIG. 8B. The transistor pairs are arranged adjacent to one another. An interconnect structure 908 includes transmission lines 910-1, 910-2 and 910-3 that are arranged in a first layer and that deliver $V_{ss}$, $V_{dd}$ and $V_{ss}$, respectively, to the transistor pairs. The interconnect structure 908 further includes transmission lines 912-1, 912-2, 912-3 and 912-4 that are arranged in a second layer and that receive output signals $V_{xa}$, $V_{xb}$, $V_{xc}$ and $V_{xd}$, respectively, from the transistor pairs.

Referring now to FIG. 33, an interconnect structure 950 includes transmission lines or planes that are arranged in first and second layers. The second layer provides power and/or ground connections to an IC 951. In the implementation in FIG. 33, the second layer includes transmission lines or planes 954-1 and 954-2. The first layer includes a transmission line or plane 954-3. A capacitor 960 is connected between the transmission lines 954-1 and 954-2. By using the second layer for power and/or ground, the capacitor 960 can be connected to the IC 951 with low inductance. The connection structure 950 can be implemented using a PCB or using a built-up substrate using a PCB-like material. In one implementation, the first layer is located between the IC 951 and the second layer. Skilled artisans will appreciate that there are other ways of implementing the connection structure.

Spacing between the transmission lines or planes in FIGS. 29-33 is preferably minimized to reduce parasitic capacitance and increase shielding. For example, spacing that is less than approximately 12 mils is suitable. Preferably, spacing that is less than 8 mils is used. Some of the leadframes that are shown in FIGS. 29-31 may be implemented as quad flat no-lead (QFN) packages.

Figure 34A:
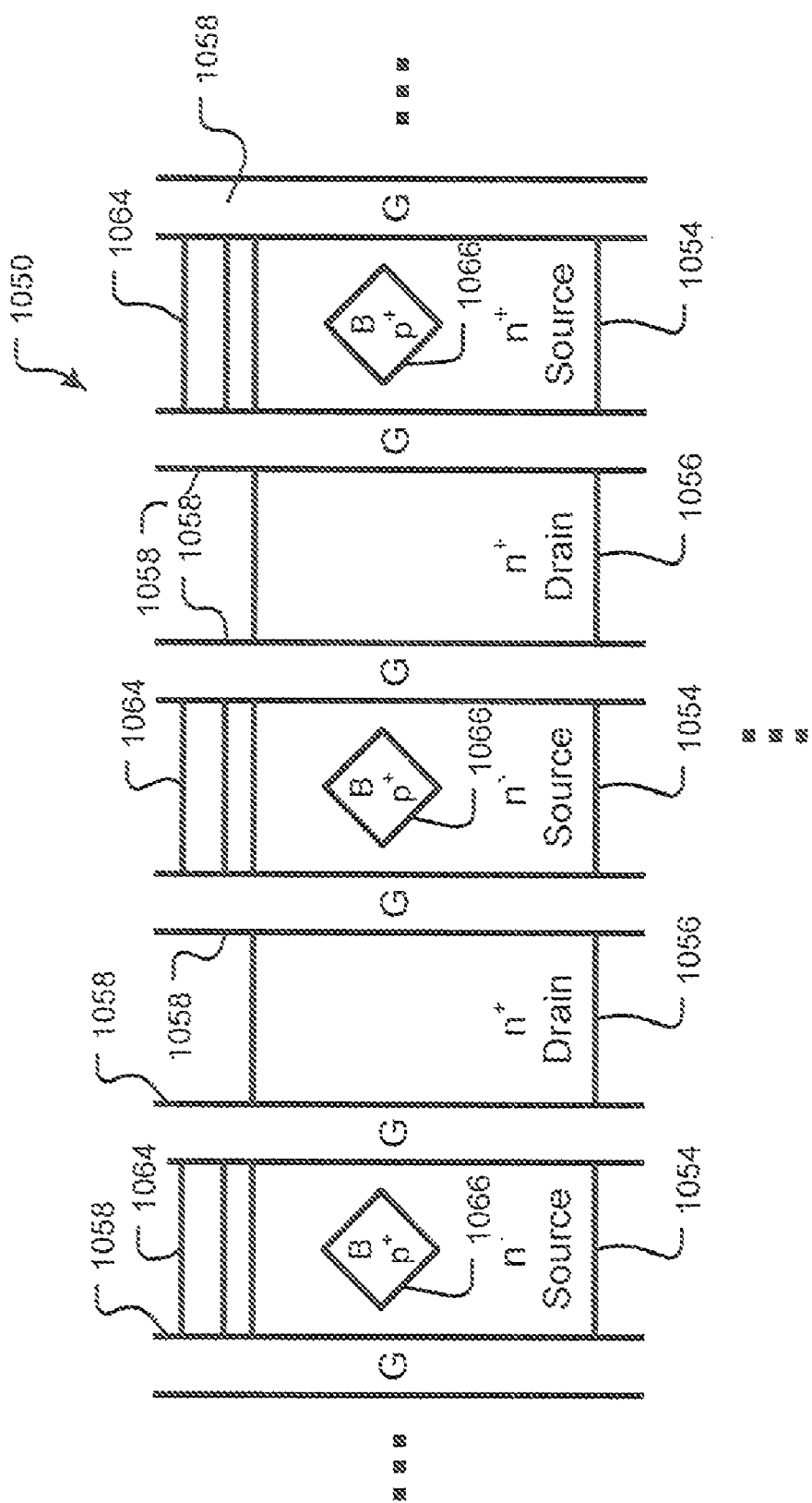
FIG. 34A is a first exemplary layout of transistors including a body that is arranged in the source.
Figure 34B:
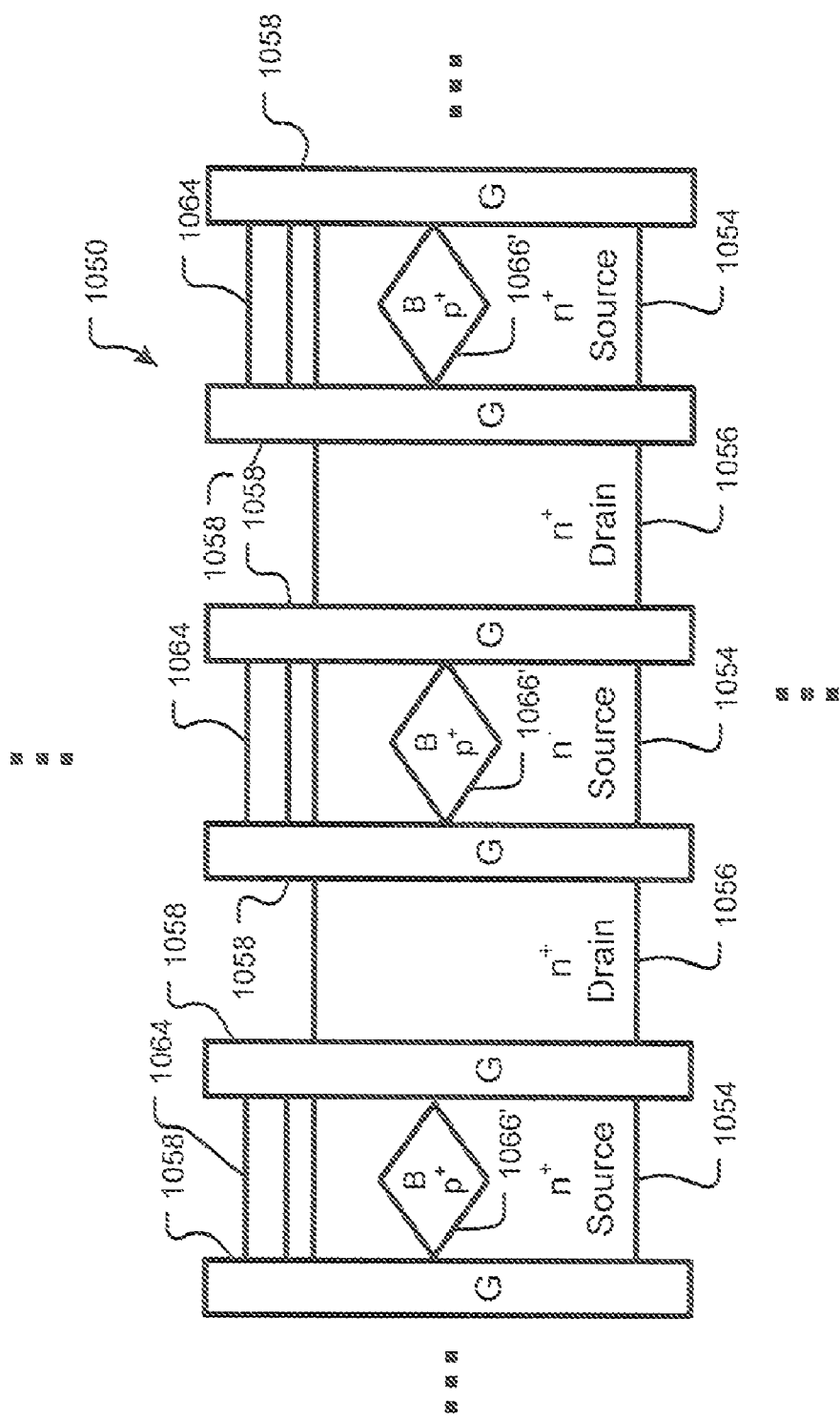
FIG. 34B is a second exemplary layout of transistors including a body having edges that align with the gates in plan view.

Referring now to FIGS. 34A and 34B, a transistor 1050 according to the present invention is shown to include one or more sources 1054 and one or more drains 1056. The sources 1054 and the drains 1056 include n+ regions. While an NMOS transistor is shown, skilled artisans will appreciate that the present invention also applies to other types of transistors such as PMOS transistors. Gates 1058 are located between adjacent pairs of sources 1054 and drains 1056. In one implementation, the gates 1058 that are located on opposite sides of the sources 1054 are connected together as shown at 1064. In other configurations, however, the gates 1058 need not be connected together.

A body 1066 including a p+ region is arranged inside of and is surrounded by the source 1054. The body 1066 preferably has a shape that tapers as a distance between a midportion of the body 1066 and adjacent gates decreases. The body 1066 may touch or not touch the gates 1058 in the plan views of FIGS. 34A and 34B. In other words, one or both edges of the body 1066 may be spaced from the gates 1058 in plan view (as shown in FIG. 34A) and/or substantially aligns with the gates in plan view (as shown in FIG. 34B). By utilizing some of the area of the source 1054 for the body 1066, the overall size of the transistor 1050 is reduced as compared to conventional transistors. In the exemplary implementation that is shown in FIGS. 34A and 34B, the body 1066 has a diamond shape.

Figure 35:
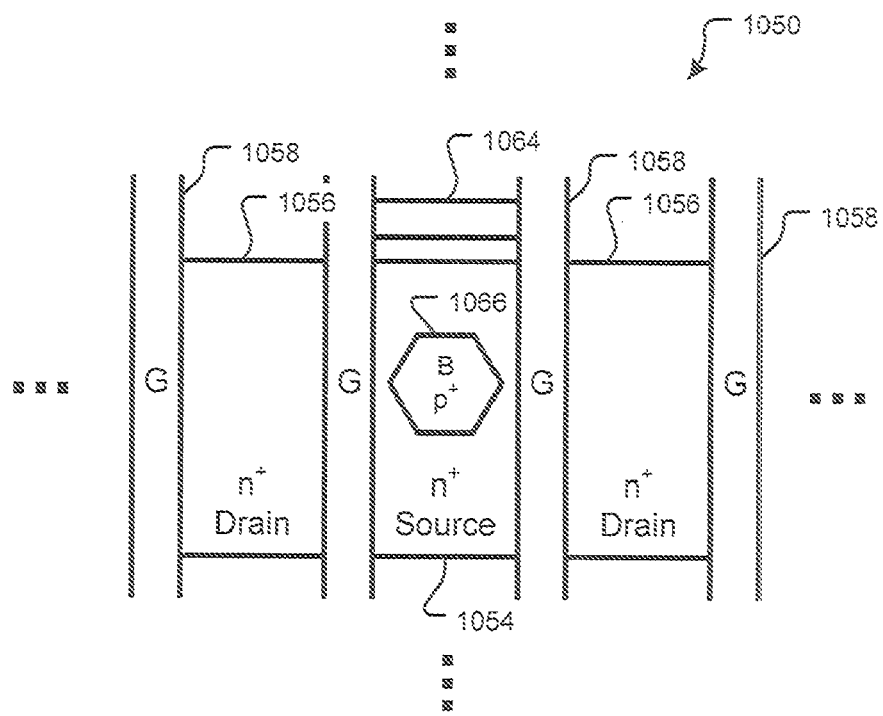
FIG. 35 is a second exemplary layout of transistors including a body that is arranged in the source.
Figure 36:
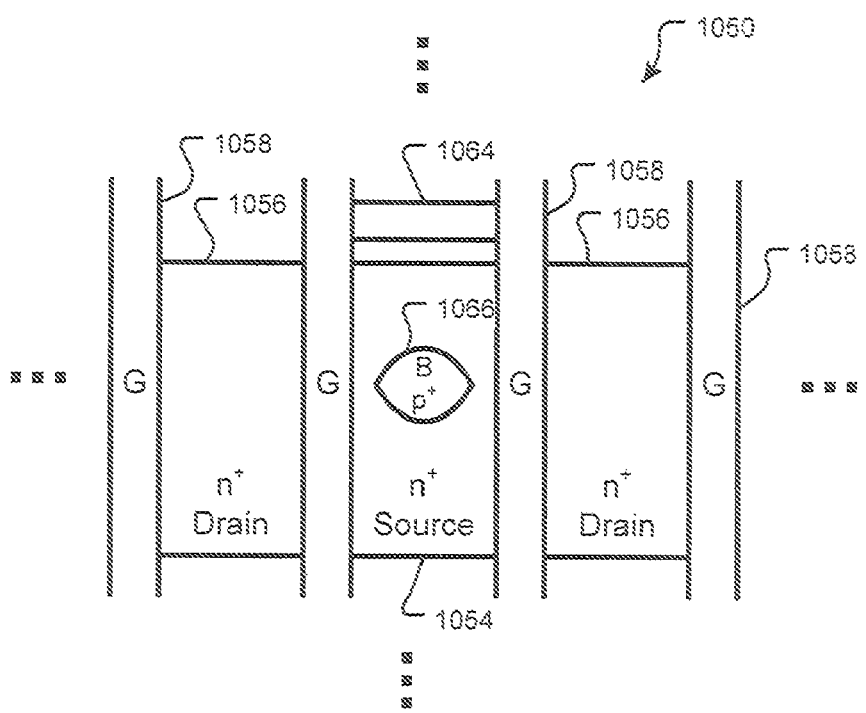
FIG. 36 is a third exemplary layout of transistors including a body that is arranged in the source.
Figure 37:
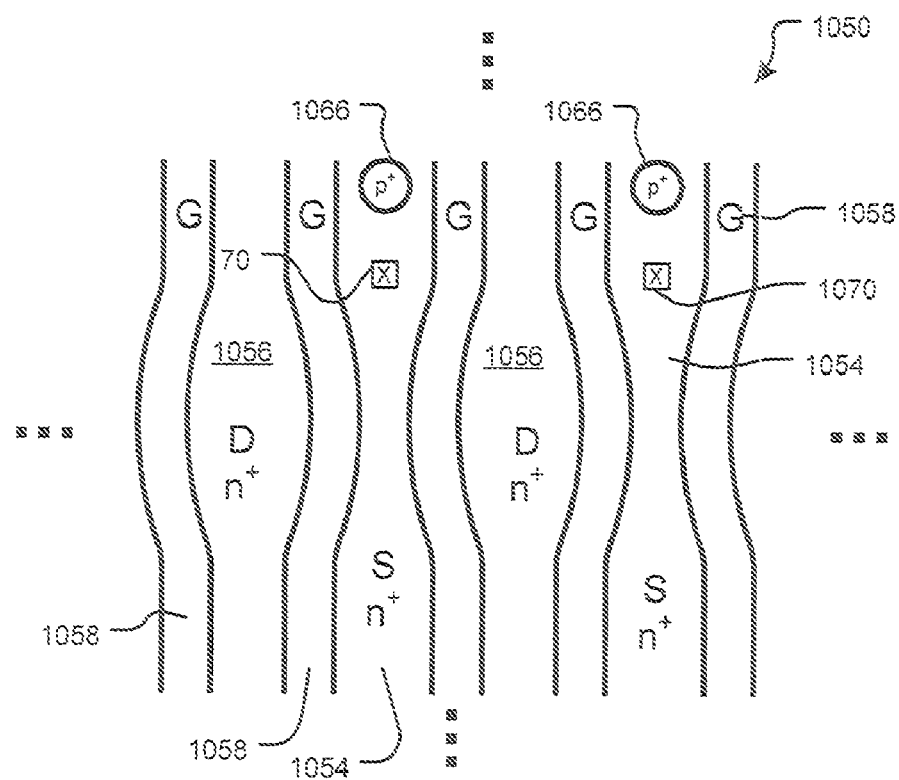
FIG. 37 is a fourth exemplary layout of transistors including a body that is arranged in the source.

Referring now to FIGS. 35 and 36, other exemplary shapes for the body 1066 are shown. In FIG. 35, the body 1066 has a hexagon shape. In FIG. 36, the body 1066 is generally football shaped. Skilled artisans will appreciate that there are a wide variety of other suitable shapes. For example, a circular body 1066 is shown in FIG. 37. Other suitable shapes include an ellipse, an octagon, etc.

Figure 38A:
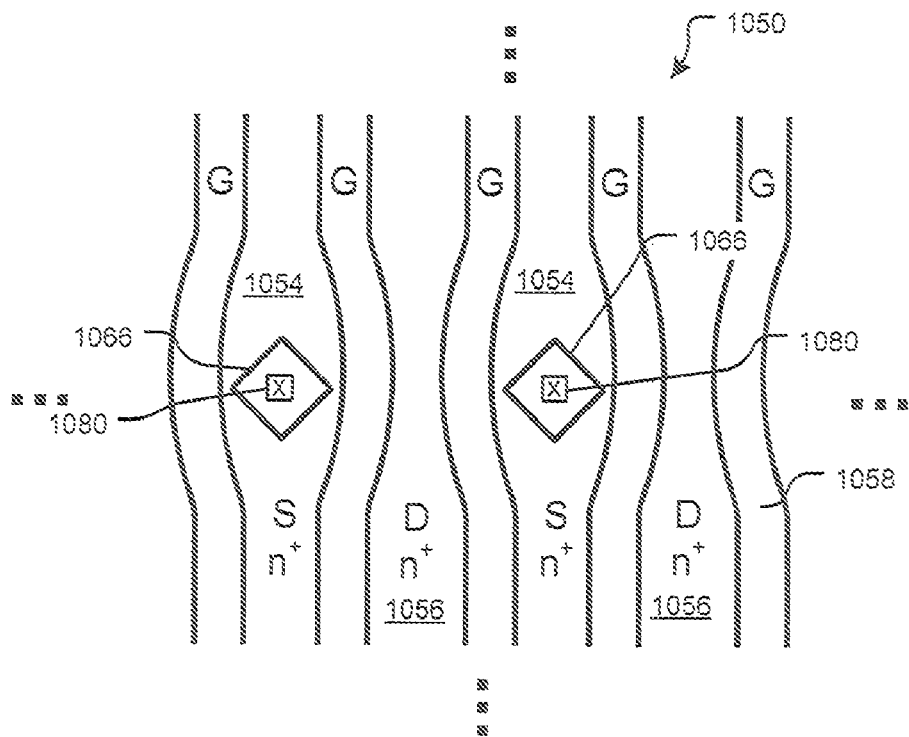
FIG. 38A is a fifth exemplary layout of transistors including a body that is arranged in the source.

Referring now to FIGS. 37 and 38A, the gates 1058 can be arranged such that they are closer together when there are no contact taps and further apart when there are contact taps. In FIG. 37, a source contact tap 1070, which is not located in the body 1066, is located in a region where the adjacent gates 1058 are located farther apart. In FIG. 38A, a body contact tap 1080, which is located in the body 1066, is located in the source 1054 where the adjacent gates 1058 are located farther apart.

Figure 38B:
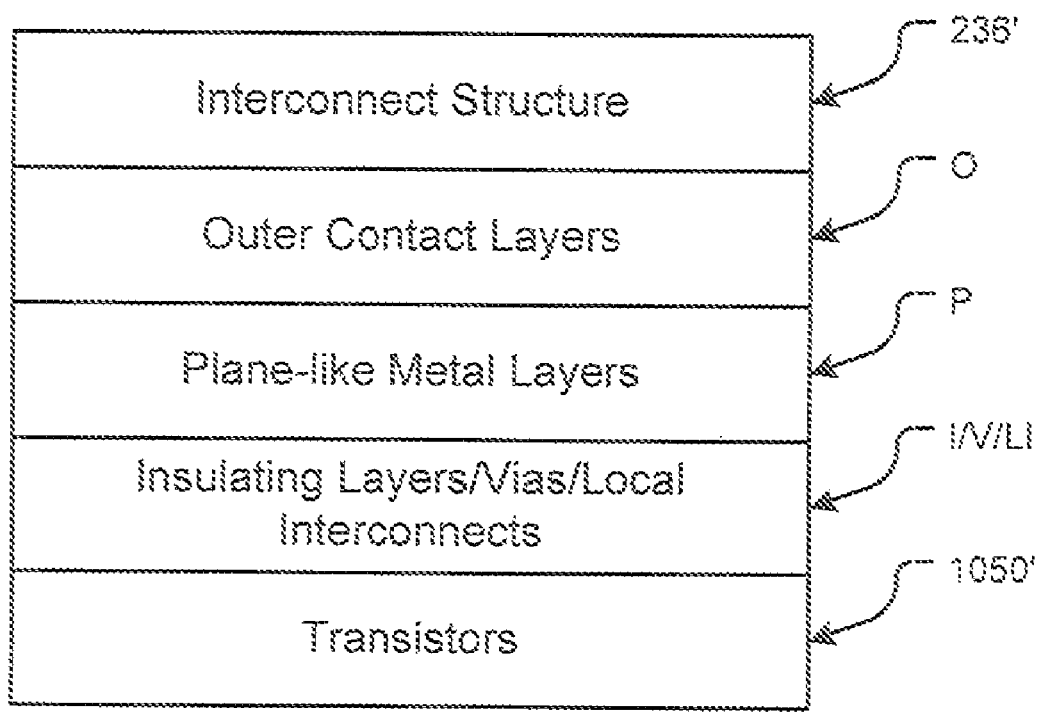
FIG. 38B illustrates the transistors of FIGS. 34A-38A arranged with plane-like metal layers, insulation/via/local interconnect layers and an interconnect structure.

Referring now to FIG. 38B, any of the transistor layouts of FIGS. 34A-38A may communicate via insulation/via/local interconnect layers (I/V/LI) with plane-like metal layers (P) and an outer contact layer (O) as previously described herein. The outer contact layer (O) may communicate with an interconnect structure and/or may be arranged in a package as previously described.

For example only, insulation/via/local interconnect layers (I/V/LI) in FIGS. 4A-4D may be used to provide connections between an underlying transistor layout such as transistor layout 1050 and plane-like metal layers (P) as described above in FIGS. 4A-4D. The plane-like metal layers (P) may communicate with an outer contact layer (O) also as described in FIGS. 4A-4D. The outer contact layer (O) may communicate with an interconnect structure as shown in FIG. 7. This arrangement can be used to reduce resistance losses and to reduce chip area as described above in further detail.

In addition to the foregoing, the transistor layout can be connected and used in a Power IC as shown in FIG. 2. Other arrangements shown in FIGS. 20-33 may be used.

Figure 39:
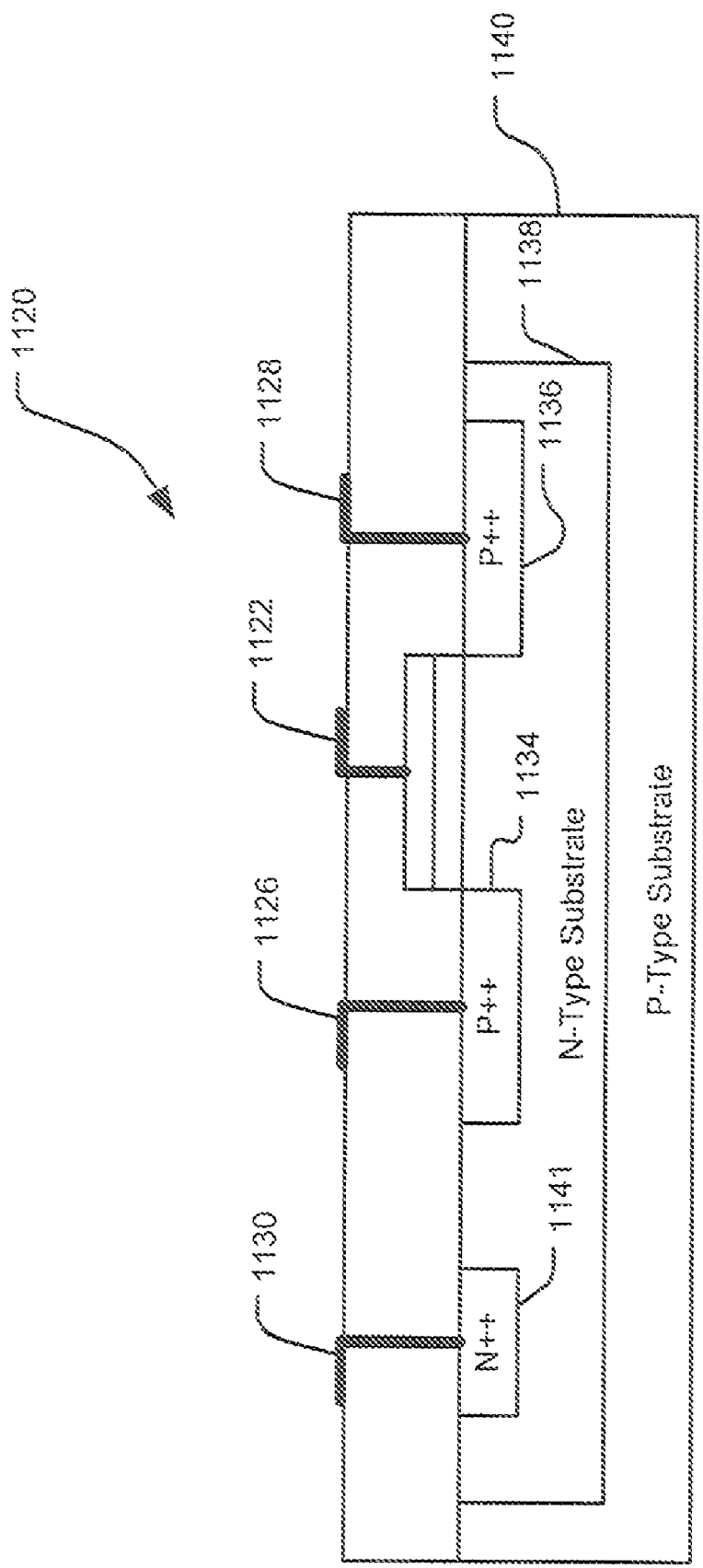
FIG. 39 is a cross-sectional view of a PMOS transistor according to the prior art.

Referring now to FIG. 39, a PMOS transistor 1120 is shown. The transistor 1120 includes a gate contact 1122, a source contact 1126, a drain contact 1128 and a negative (N)-well contact 1130. The source contact 1126 provides a connection to a P++ region 1134 formed in an N-type substrate layer 1138. The N-type layer 1138, in turn, is formed in a P-type substrate 1140. The P++ region 1134 forms the source. The drain contact 1128 provides a connection to a P++ region 1136 formed in the N-type substrate layer 1138. The P++ region 1136 forms the drain. The N-well contact 1130 provides a connection to an N++ region 1141 or N-well.

Figure 40:
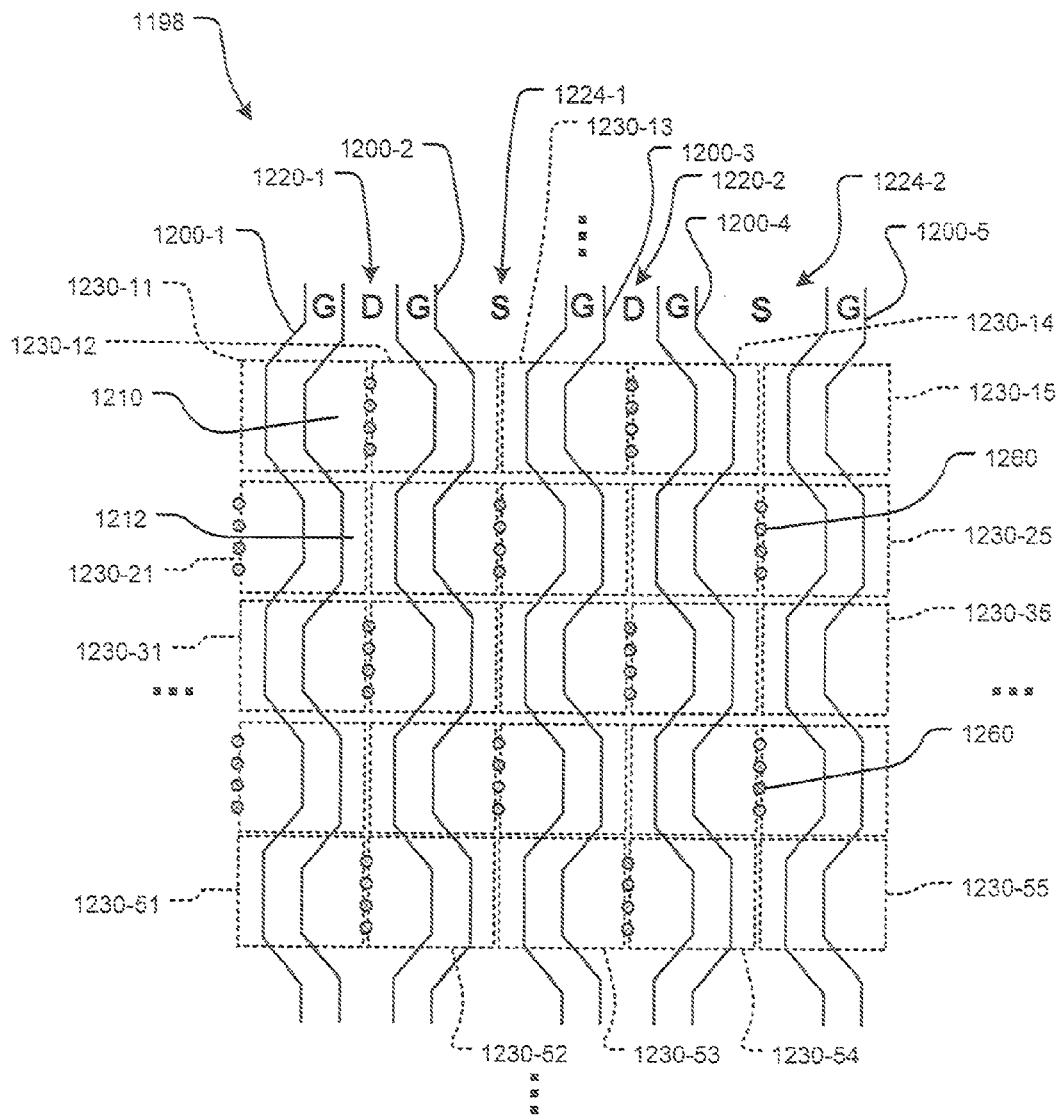
FIG. 40 is a plan view of a sixth exemplary layout including well substrate contacts.

Referring now to FIG. 40, a plan view of a sixth exemplary transistor layout 1198 is shown. For some transistor designs such as PMOS and/or NMOS transistors, electrostatic discharge (ESD) is less important than other design criteria. Therefore, N-well contact areas can be minimized. For PMOS transistors, the N-well contact area may be approximately 2.5 to 3 times the area in NMOS transistors. The source-drain resistance may be less important. Therefore, the layout in FIG. 40 minimizes the N-well contact areas and the source-drain region. Skilled artisans will appreciate that while the foregoing description relates to PMOS transistors, similar principles apply to NMOS transistors.

In the transistor layout shown in FIG. 40, gate regions 1200-1, 1200-2, . . . , and 1200-G (collectively gate regions or gates 1200) are defined between source regions 1224-1, 1224-2, . . . , and 1224-S (collectively source regions 1224) and drain regions 1220-1, 1220-2, . . . , and 1220-D (collectively drain regions 1220). Adjacent gates 1200-1 and 1200-2 define regions 1210 having a wider width than adjacent regions 1212 having narrower widths. Drain regions 1220 and source regions 1224 are alternately defined between the adjacent gates 1200.

Groups of transistors 1230-11, 1230-12, . . . , and 1230-55 (collectively groups of transistors 1230) are arranged adjacent to each other. While a 5×5 array is shown, an X by Y array may be used, where X and Y are integers greater than one. Adjacent groups of transistors 1230 share R N-well contacts 1260, where R is an integer greater than one. The R N-well contacts 1260 can be located between the adjacent groups of transistors 1230 in regions 1210 where the gates 1200 are spaced further apart.

The source-drain region is minimized by this layout. For example, each group may include 4-6 transistors. The R N-well contacts 1260 are provided for adjacent groups in both vertical and horizontal directions. Therefore, abutting edges of the adjacent groups without the R N-well contacts 1260 can be located in regions 1212 where the gates are spaced closer together. In other words, the gates 1200 can be arranged closer together to minimize areas of the regions 1212 without the R N-well contacts 1260.

Referring back to FIG. 38B, the transistor layout 1198 of FIG. 40 may be used instead of transistor layout 1050'. The transistor layout 1198 may communicate via insulation/via/local interconnect layers (I/V/LI) with plane-like metal layers (P) and an outer contact layer (O) as previously described herein. The outer contact layer (O) may communicate with an interconnect structure and/or may be arranged in a package as previously described.

For example only, insulation/via/local interconnect layers (I/V/LI) in FIGS. 4A-4D may be used to provide connections between an underlying transistor layout and plane-like metal layers (P) as described above in FIGS. 4A-4D. The plane-like metal layers (P) may communicate with an outer contact layer (O) also as described in FIGS. 4A-4D. The outer contact layer (O) may communicate with an interconnect structure as shown in FIG. 7. This arrangement can be used to reduce resistance losses and to reduce chip area as described above in further detail.

In addition to the foregoing, the transistor layout can be connected and used in a Power IC as shown in FIG. 2. Other arrangements shown in FIGS. 20-33 may be used.

Referring now to FIG. 41A, an exemplary high-density layout for laterally diffused MOSFET (LDMOS) transistors 1300 is shown. The layout tends to reduce turn-on drain-source resistance RDSon. The transistors 1300 include source (S) regions 1304, drain (D) regions 1306 and gates 1310. Some, none or all of the source regions 1304 may include one or more source contacts 1311. For illustration purposes, not all of the source regions 1304 are shown with source contacts 1311.

The gates 1310 define a checkerboard pattern. Source regions 1304 are arranged along sides of the drain regions 1306. More particularly, the drain regions 1306 may have a generally rectangular shape. The source regions 1304 may be arranged along each side of the generally rectangular drain regions 1306. Substrate contacts 1330 may be provided adjacent to corners of the drain regions 1306 at intersections between adjacent source regions 1304. Drain contacts 1334 may also be provided at a central location within the drain regions 1306.

Each drain region 1306 may be arranged adjacent to source regions 1304 that are common with other adjacent drain regions 1306. For example in dotted area 1331 in FIG. 41A, drain region 1306-1 shares the source region 1304-1 with the drain region 1306-2. Drain region 1306-1 shares the source region 1304-2 with the drain region 1306-3. Drain region 1306-1 shares the source region 1304-3 with the drain region 1306-4. Drain region 1306-1 shares the source region 1304-4 with the drain region 1306-5. This pattern may be repeated for adjacent drain regions 1306.

Each of the drain regions 1306 may have an area that is greater than or equal to two times the area of each of the source regions 1304. In FIG. 41A, the drain regions 1306 have a width "b" and a height "a". The source regions 1304 have a width (or height) "d" and a height (or width) "c". The drain regions 1306 may have substantially the same length as the source regions 1304. The drain regions 1306 may have greater than or equal to two times the width of the source regions 1304.

Figure 41B:
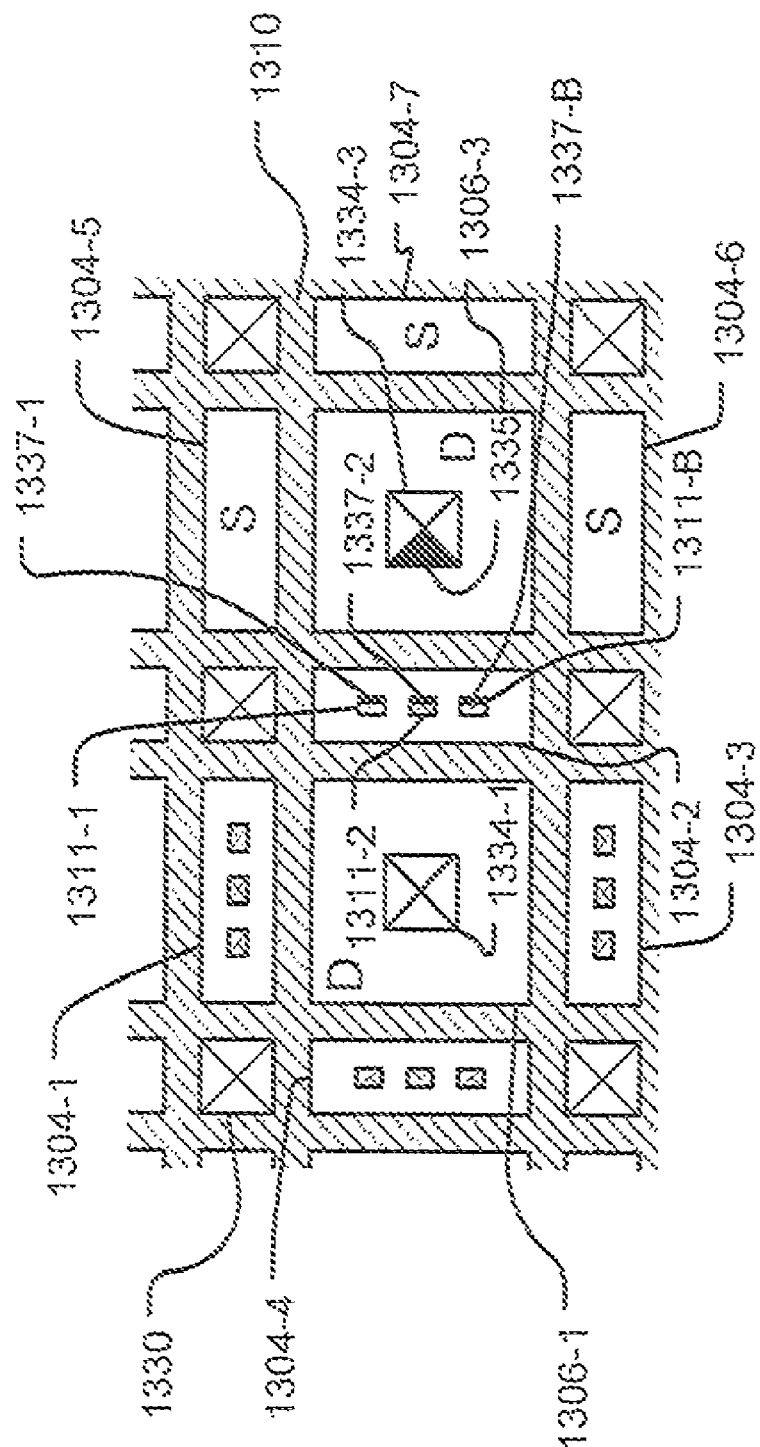
FIG. 41B is a plan view of the seventh exemplary layout of FIG. 41A.

Referring now to FIG. 41B, a more detailed view of part of the layout of FIG. 41A is shown. Drain contacts 1334-1 and 1334-3 may be associated with drain regions 1306-1 and 1306-3, respectively. Substrate contacts 1330 are located adjacent to corners of the drain regions 1306-1. Source contacts 1311-1, 1311-2, ... and 1311-B may be arranged in source regions 1304-2 and 1304-4, where B is an integer. Drain contacts 1334-1 and 1334-3 may be arranged in each of the drain regions 1306-1 and 1306-3, respectively. Drain contact 1334-1 may define an area that is greater than the area of the source contact 1311-1 in the source region 1304-2.

Substantially all of the current flowing between the drain region 1306-3 and the source contacts 1311-1, 1311-2, ... and 1311-B of the adjacent source region 1304-2 flows between a facing portion 1335 of the drain contact 1334-3 and facing halves 1337-1, 1337-2, ... and 1337-S of source contacts 1311-1, 1311-2, ... and 1311-B in the source region 1304-2. Current flows in a similar manner between other facing portions of the drain contact 1334-3 and source contacts (not shown) in other adjacent source regions 1304-5, 1304-6 and 1304-7.

Figure 41C:
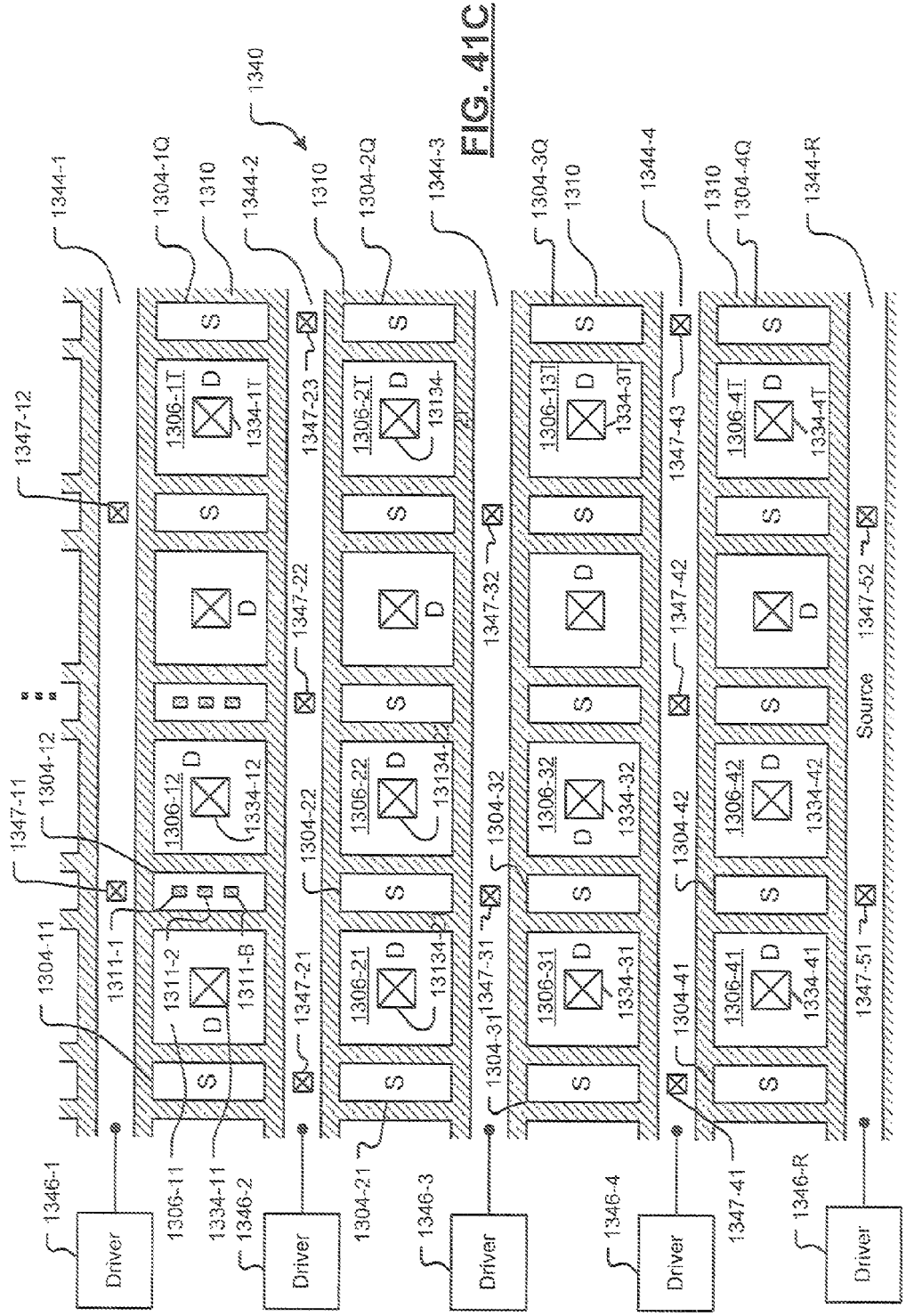
FIG. 41C is a plan view of an eighth exemplary layout for reducing $R_{DSon}$.

Referring now to FIG. 41C, another exemplary high-density layout for laterally diffused MOSFET (LDMOS) transistors 1340 is shown. The layout tends to provide low turn-on drain-source resistance RDSon. The transistors 1340 include source regions 1304-11, 1304-12, ... 1304-4Q, drain regions 1306-11, 1306-12, ... 1306-4T and gates 1310, where Q and T are integers. While four rows are shown in FIG. 41C, additional and/or fewer rows and/or columns may be employed. Some, none or all of the source regions 1304 may include source contacts 1311. For illustration purposes, not all of the source regions 1304 are shown with source contacts. For example, source region 1304-12 includes source contacts 1311-1, 1311-2, ... and 1311-B, where B is an integer.

Other elongated source regions 1344-1, 1344-2, 1344-3, ... and 1344-R are arranged between rows (or columns) of drain regions 1306 and may be driven by drivers 1346-1, 1346-2, ..., and 1346-R arranged on one or both sides (or tops) of the layout in FIG. 41C. The elongated source regions 1344-1, 1344-2, 1344-3, ... and 1344-R may extend adjacent to sides of at least two drain regions 1306 such as at least drain regions 1306-11 and 1306-12.

Each of the drain regions 1306 (such as drain region 1306-11) may have an area that is greater than or equal to two times the area of each of the source regions 1304 (such as source region 1304-12). The drain regions 1306 (such as drain region 1306-11) may have substantially the same length as the source regions 1304 (such as source region 1304-12). The drain regions 1306 (such as drain region 1306-11) may have greater than or equal to two times the width of the source regions 1304 (such as source region 1304-12).

Substrate contacts 1347-11, 1347-12, 1347-21, 1347-22, 1347-23, ... 1347-51, 1347-52 (collectively substrate contacts 1347) may be arranged in some, none or all of the elongated source regions 1344. The placement and number of substrate contracts 1347 may be uniform or varied for each of the elongated source regions 1344. For example only, the substrate contacts 1347 shown in FIG. 41C may be offset from the substrate contacts 1347 in adjacent elongated source regions 1344. Each of the elongated source regions 1344 may include the same number or a different number of substrate contacts 1347 than adjacent elongated source regions 1344. The substrate contacts 1347 may be aligned or offset as shown. Some elongated source regions 1344 may include no substrate contacts 1347. Still other variations are contemplated.

Figure 41D:
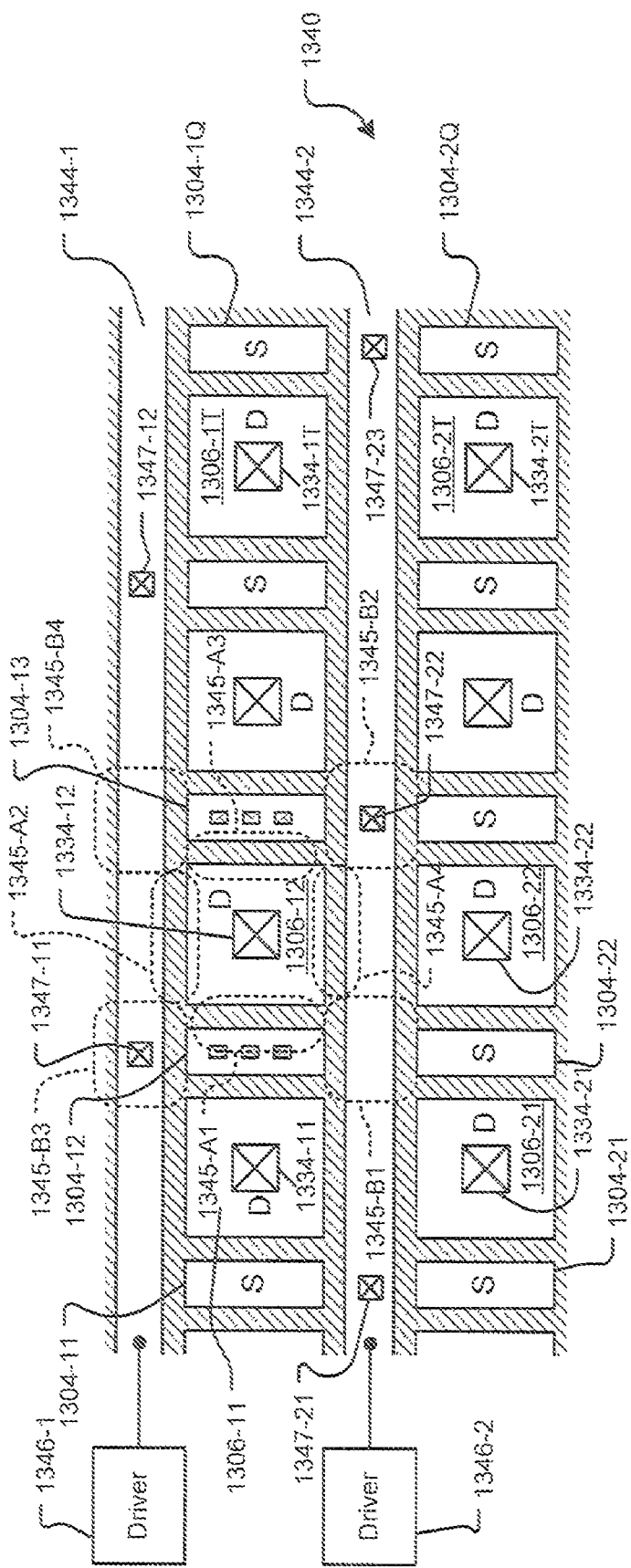
FIG. 41D is a plan view of a ninth exemplary layout for reducing $R_{DSon}$ that is similar to FIG. 41C.

Referring now to FIG. 41D, first areas 1345-A1, 1345-A2, 1345-A3 and 1345-A4 may provide useful transistor areas. For example, first areas 1345-A1, 1345-A2, 1345-A3 and 1345-A4 may be located between drain region 1306-12 and source regions 1304-12, 1344-1, 1304-13, and 1344-2, respectively. Second areas 1345-B1, 1345-B2, 1345-B3 and 1345-B4 may provide less useful transistor areas. For example, second areas 1345-B1, 1345-B2, 1345-B3 and 1345-B4 may be located between source regions 1304-12, 1344-1, 1304-13, and 1344-2.

In some implementations, the substrate contacts 1347-11, 1347-12, 1347-21, 1347-22, 1347-23, ... may be arranged in some, none or all of the second areas 1345-B1, 1345-B2, 1345-B3 and 1345-B4 of the source regions 1344-1, 1344-2, ... and 1344-R, for example as shown in FIG. 41D. The substrate contacts 1347-11, 1347-12, 1347-21, 1347-22, 1347-23, ... are shown arranged in the elongated substrate regions 1344-1 and 1344-2 and tend to lower RDS_ON. The substrate contacts 1347-11, 1347-12, 1347-21, 1347-22, 1347-23, . . . may have a height that is less than or equal to a width "c" of the source regions 1304 (as shown in FIG. 41A) and a width that is less than or equal to a width "d" of the source regions 1304 (as shown in FIG. 41A).

Figure 41E:
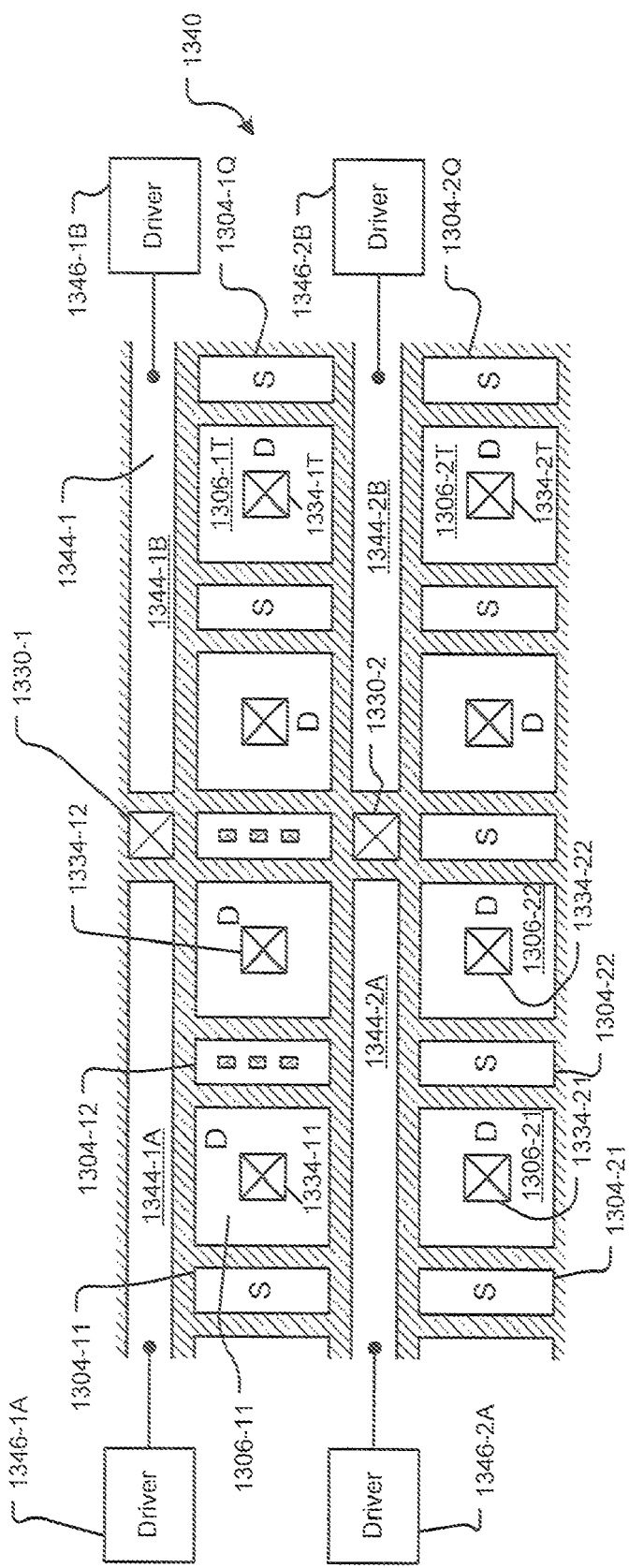
FIG. 41E is a plan view of a tenth exemplary layout for reducing $R_{DSon}$ that is similar to FIG. 41C.

Referring now to FIG. 41E, substrate contacts 1330-1 and 1330-2 are provided between pairs of elongated source regions 1344-1A and 1344-1B and 1344-2A and 1344-2B, respectively. The elongated source regions 1344-1A and 1344-2A are driven from one side by drivers 1346-1A and 1346-2A. The elongated source regions 1344-1B and 1344-2B are driven from another side by drivers 1346-1B and 1346-2B.

Figure 41G:
FIGS. 41F-41I illustrate other exemplary drain contacts.
Figure 41I:
Figure 41F:
Figure 41H:

Drain contacts 1334 in FIGS. 41A-41E may have a minimum size or a size that is greater than the minimum size. Drain contacts 1334 may have a simple or regular shape and/or an irregular or complex shape. For example, the drain contacts 1334 may have a square or rectangular shape (as shown at 1344 in FIG. 41A), a cross shape (as shown at 1344-W in FIG. 41F), clover-leaf shapes (as shown at 1334-X and 1334-Y in FIGS. 41G and 41H, respectively), a modified cross-shaped region (as shown at 1334-Z in FIG. 41I) and/or other suitable shapes such as but not limited to diamond, circular, symmetric, non-symmetric, etc. The substrate contacts 1347 may similarly have a simple or regular shape and/or an irregular or complex shape similar to the drain contacts 1334.

In some implementations, the number of source contacts B in a given source region may be an integer that is greater than one and less than six. In some implementations, B may be equal to 3 or 4. The area of the drain contact 1334-3 may be greater than or equal to 2*B* (the area one of source contacts 1311-1, 1311-2, . . . or 1311-B). For example, when B is equal to 3, the drain contact region 1334-3 may have an area that is approximately greater than or equal to 6 times an area of one source contact 1311-1, 1311-2, . . . or 1311-B. When B is equal to 4, the drain contact region 1334-3 may an area that is approximately greater than or equal to 8 times an area of one source contact 1311-1, 1311-2, . . . or 1311-B.

As the size of the drain contacts 1334 increases relative to the corresponding drain region 1306, over-etching may occur. In other words, the etching process may adversely impact adjacent regions and/or underlying layers. To alleviate the problems of over-etching, the complex shapes in FIGS. 41F-41I and/or other complex shapes can be employed for the drain contacts 1334. Alternately, the drain contacts 1334 can employ deep implant ions in and/or below the drain contacts 1334.

As an alternative to placing the substrate contact 1330 in the elongated source regions 1344, a relief area may be provided in one or both sides of the source region 1344 in areas 1345-B1, 1345-B2, 1345-B3 and 1345-B. A substrate contact region 1330 can be positioned in the relief area. The shape of the elongate source region 1344 can be adjusted on an opposite side of the relief area to offset the effect of the relief area and to prevent reduction in current density in areas of the elongate source region 1344 near the relief areas.

Referring back to FIG. 38B, any of the transistor layouts of FIGS. 41A-41I may be used instead of the transistor layout 1050' and may communicate via insulation/via/local interconnect layers (I/V/LI) with plane-like metal layers (P) and an outer contact layer (O) as previously described herein. The outer contact layer (O) may communicate with an interconnect structure and/or may be arranged in a package as previously described.

For example only, insulation/via/local interconnect layers (I/V/LI) in FIGS. 4A-4D may be used to provide connections between an underlying transistor layout such as transistor layout 1300 in FIGS. 41A and 1340 in FIG. 41C and plane-like metal layers (P) as described above in FIGS. 4A-4D. The plane-like metal layers (P) may communicate with an outer contact layer (O) also as described in FIGS. 4A-4D. The outer contact layer (O) may communicate with an interconnect structure as shown in FIG. 7. This arrangement can be used to reduce resistance losses and to reduce chip area as described above in further detail.

In addition to the foregoing, the transistor layout can be connected and used in a Power IC as shown in FIG. 2. Other arrangements shown in FIGS. 20-33 may be used.

Figure 42:
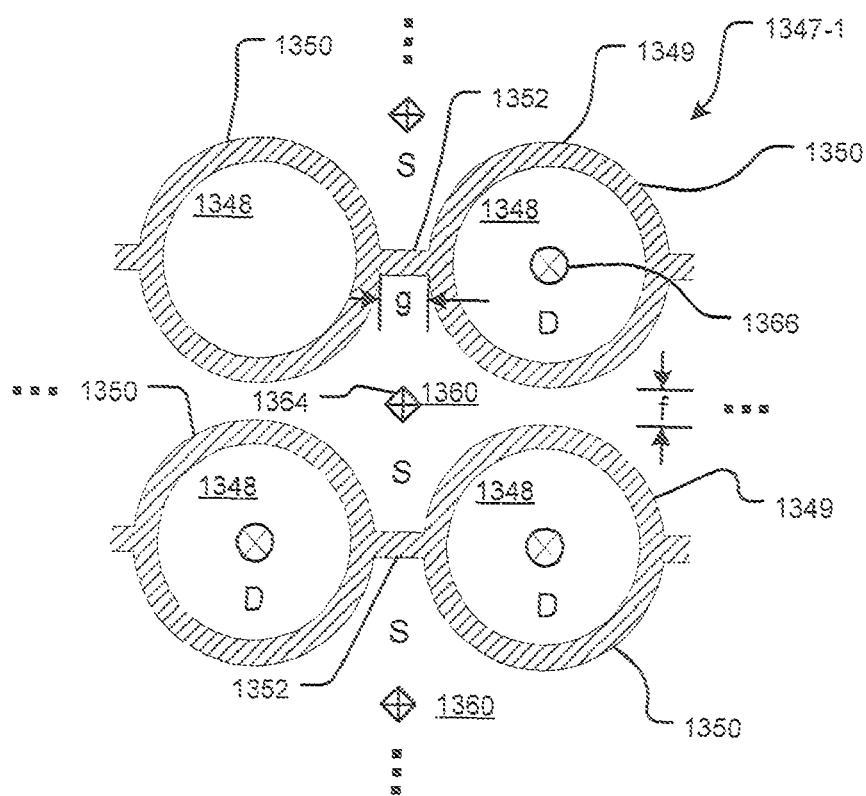
FIG. 42 is a plan view of a eleventh exemplary layout for reducing $R_{DSon}$.
Figure 43:
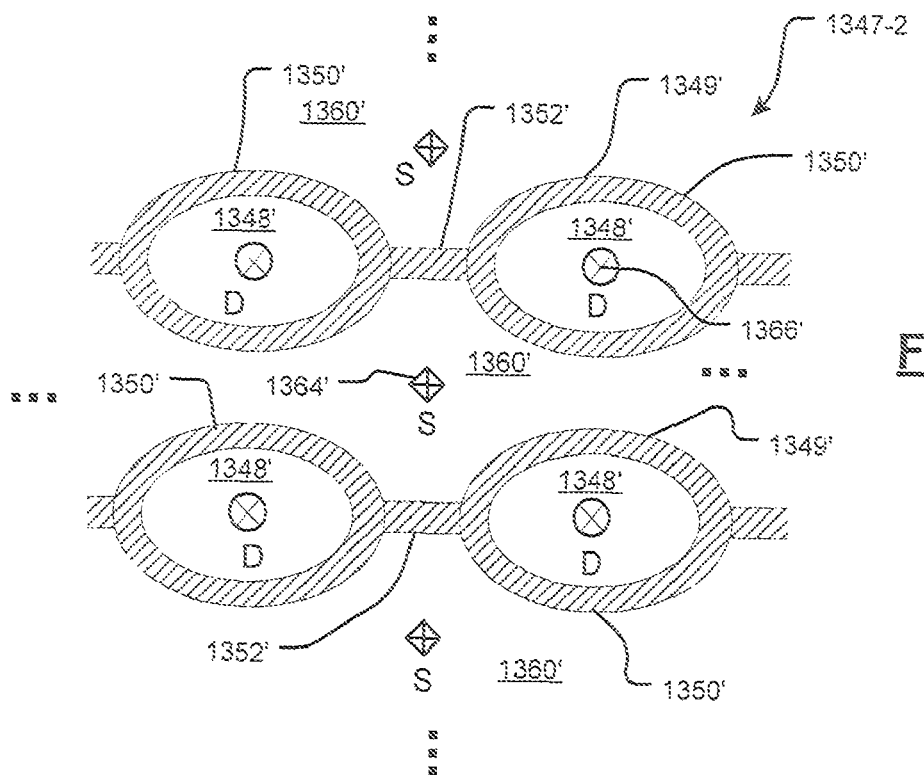
FIG. 43 is a plan view of a twelfth exemplary layout for reducing $R_{DSon}$.
Figure 44:
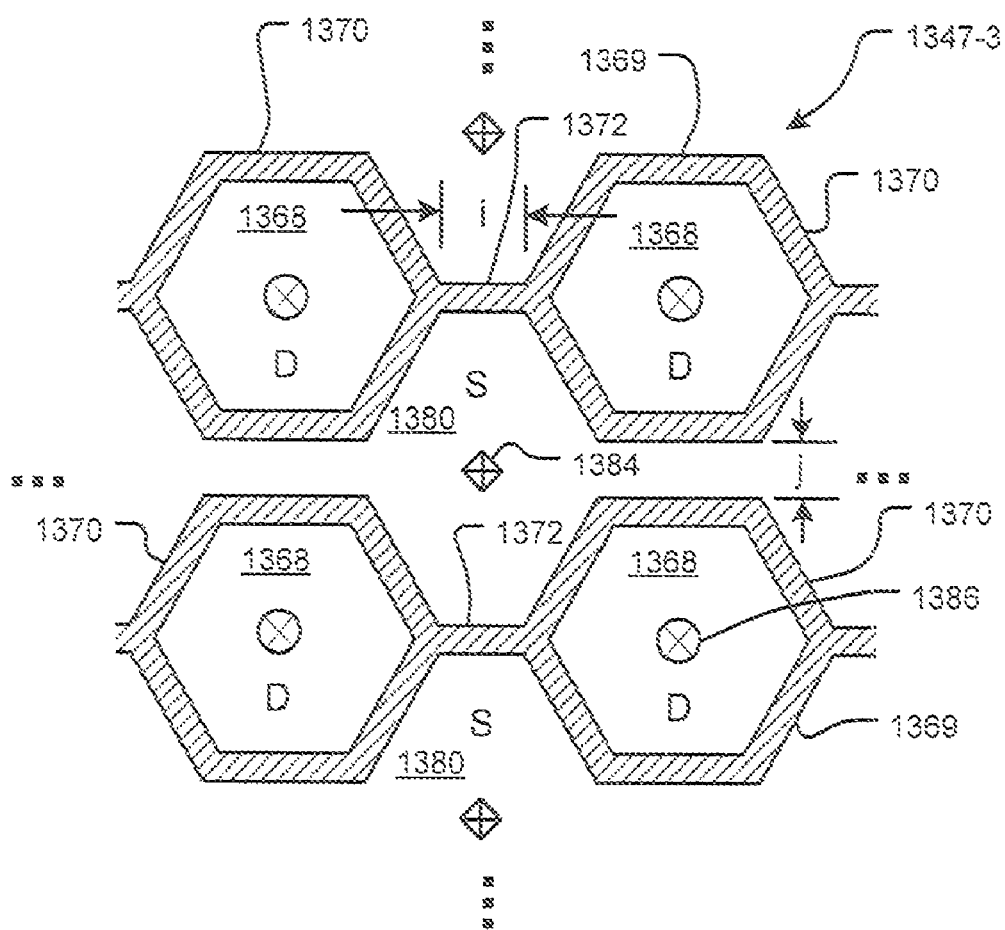
FIG. 44 is a plan view of a thirteenth exemplary layout for reducing $R_{DSon}$.

Referring now to FIGS. 42-44, transistor layouts 1347-1, 1347-2 and 1347-3 (collectively 1347), respectively, are shown. Drain, source and gate regions can have other shapes that can be used to minimize RDSON. For example, drain regions 1348 can have a circular shape as shown in the transistor layout 1347-1 in FIG. 42, an elliptical shape as shown in the transistor layout 1347-2 of FIG. 43 and/or other suitable shapes. Gate regions 1349 include circular-shaped gate regions 1350 that are connected by linear gate connecting regions 1352. Similar elements are identified in FIG. 43 using a prime symbol ("'"). The drain regions 1348 are located in the circular-shaped gate regions 1350. Source regions 1360 are located in between the gate regions 1349 in areas other than the inside of the circular shaped gate regions 1350. Substrate contacts 1364 are located in the source regions 1360. The drain regions 1348 may also include a contact region 1366. The linear gate regions 1352 may have a vertical spacing "g" that is minimized to increase density. Likewise, lateral spacing identified at "f" between adjacent circular-shaped gate regions 1350 may be minimized to increase density.

Drain regions 1368 can also have polygon shapes. For example, the drain regions can have a hexagon shape as shown in the transistor layout 1347-3 of FIG. 44, although other polygon shapes can be used. Gate regions 1369 include hexagon-shaped gate regions 1370 that are connected by linear gate connecting regions 1372. The drain regions 1368 are located in the hexagon-shaped gate regions 1370. Source regions 1380 are located in between the gate regions 1369 in areas other than the inside of the hexagon-shaped gate regions 1370. Substrate contacts 1384 are located in the source regions 1380. The drain regions may also include a contact region 1386. The linear gate connecting regions 1372 preferably have a vertical spacing "j" that is minimized to increase density. Likewise lateral spacing identified at "i" between adjacent hexagon-shaped gate regions 1370 is minimized to increase density.

As can be appreciated, the shapes for the drain and gate areas in FIGS. 42-44 can be any shape that is symmetric about at least one of the horizontal and vertical centerlines of the drain regions. The transistors in FIGS. 42-44 may be LDMOS transistors. The shape of the drain regions may include any symmetric shape. The shape may taper as a distance from a center point of the drain region increases and/or as a center point of the drain region increases in a direction towards one or more other transistors.

Referring back to FIG. 38B, any of the transistor layouts of FIGS. 42-44 may be used instead of the transistor layout 1050' and may communicate via insulation/via/local interconnect layers (I/V/LI) with plane-like metal layers (P) and an outer contact layer (O) as previously described herein. The outer contact layer (O) may communicate with an interconnect structure and/or may be arranged in a package as previously described.

For example only, insulation/via/local interconnect layers (I/V/LI) in FIGS. 4A-4D may be used to provide connections between an underlying transistor layout such as transistor layout (identified as 1392) from FIGS. 42-44 and plane-like metal layers (P) as described above in FIGS. 4A-4D. The plane-like metal layers (P) may communicate with an outer contact layer (O) also as described in FIGS. 4A-4D. The outer contact layer (O) may communicate with an interconnect structure as shown in FIG. 7. This arrangement can be used to reduce resistance losses and to reduce chip area as described above in further detail.

In addition to the foregoing, the transistor layout can be connected and used in a Power IC as shown in FIG. 2. Other arrangements shown in FIGS. 20-33 may be used.

Referring now to FIGS. 45A-45G, various exemplary implementations incorporating the teachings of the present disclosure are shown.

Figure 45A:
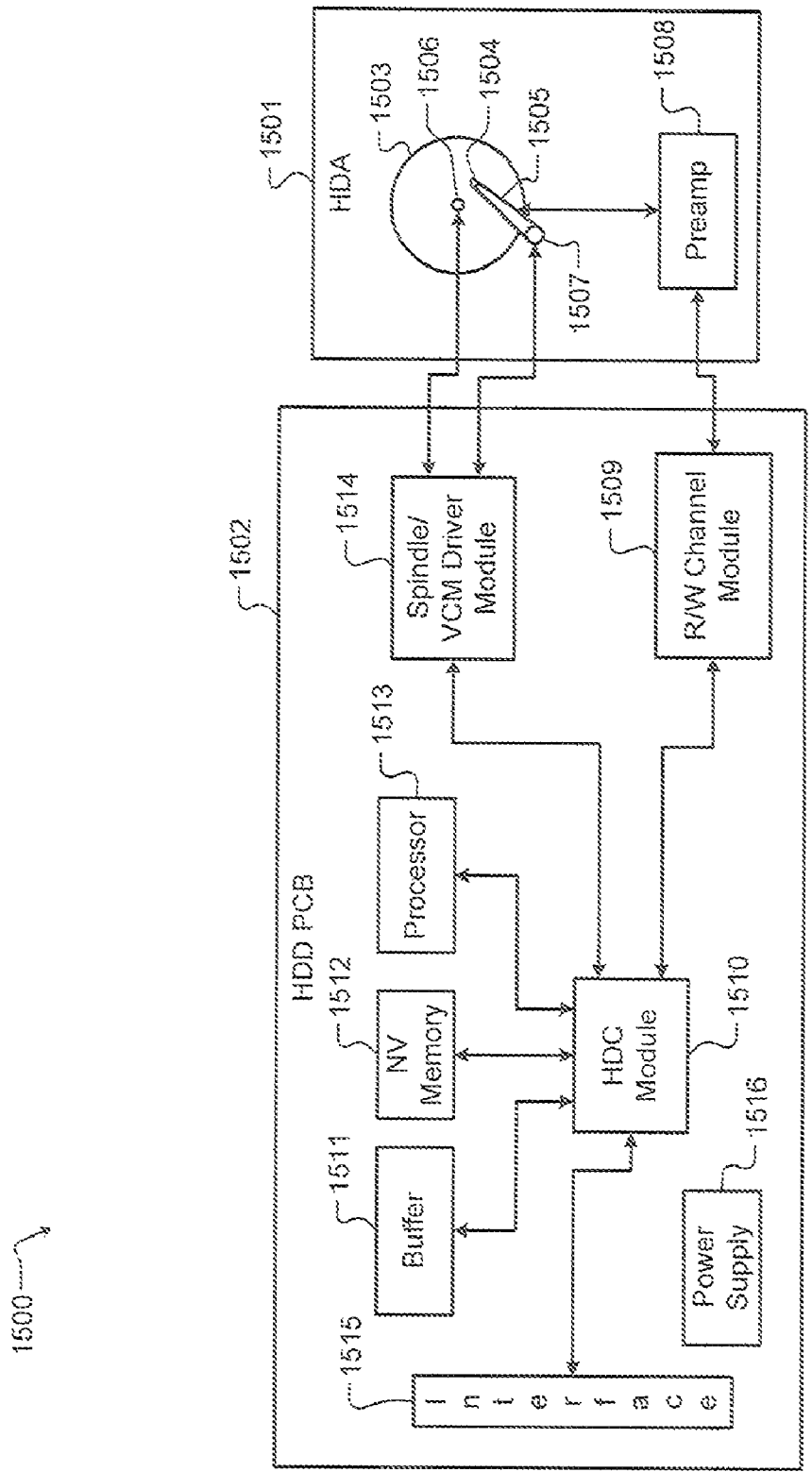
FIG. 45A is a functional block diagram of a hard disk drive.

Referring now to FIG. 45A, the teachings of the disclosure can be implemented in integrated circuits that implement components of a hard disk drive (HDD) 1500. The HDD 1500 includes a hard disk assembly (HDA) 1501 and a HDD PCB 1502. The HDA 1501 may include a magnetic medium 1503, such as one or more platters that store data, and a read/write device 1504. The read/write device 1504 may be arranged on an actuator arm 1505 and may read and write data on the magnetic medium 1503. Additionally, the HDA 1501 includes a spindle motor 1506 that rotates the magnetic medium 1503 and a voice-coil motor (VCM) 1507 that actuates the actuator arm 1505. A preamplifier device 1508 amplifies signals generated by the read/write device 1504 during read operations and provides signals to the read/write device 1504 during write operations.

The HDD PCB 1502 includes a read/write channel module (hereinafter, "read channel") 1509, a hard disk controller (HDC) module 1510, a buffer 1511, nonvolatile memory 1512, a processor 1513, and a spindle/VCM driver module 1514. The read channel 1509 processes data received from and transmitted to the preamplifier device 1508. The HDC module 1510 controls components of the HDA 1501 and communicates with an external device (not shown) via an I/O interface 1515. The external device may include a computer, a multimedia device, a mobile computing device, etc. The I/O interface 1515 may include wireline and/or wireless communication links.

The HDC module 1510 may receive data from the HDA 1501, the read channel 1509, the buffer 1511, nonvolatile memory 1512, the processor 1513, the spindle/VCM driver module 1514, and/or the I/O interface 1515. The processor 1513 may process the data, including encoding, decoding, filtering, and/or formatting. The processed data may be output to the HDA 1501, the read channel 1509, the buffer 1511, nonvolatile memory 1512, the processor 1513, the spindle/VCM driver module 1514, and/or the I/O interface 1515.

The HDC module 1510 may use the buffer 1511 and/or nonvolatile memory 1512 to store data related to the control and operation of the HDD 1500. The buffer 1511 may include DRAM, SDRAM, etc. The nonvolatile memory 1512 may include flash memory (including NAND and NOR flash memory), phase change memory, magnetic RAM, or multi-state memory, in which each memory cell has more than two states. The spindle/VCM driver module 1514 controls the spindle motor 1506 and the VCM 1507. The HDD PCB 1502 includes a power supply 1516 that provides power to the components of the HDD 1500.

Figure 45B:
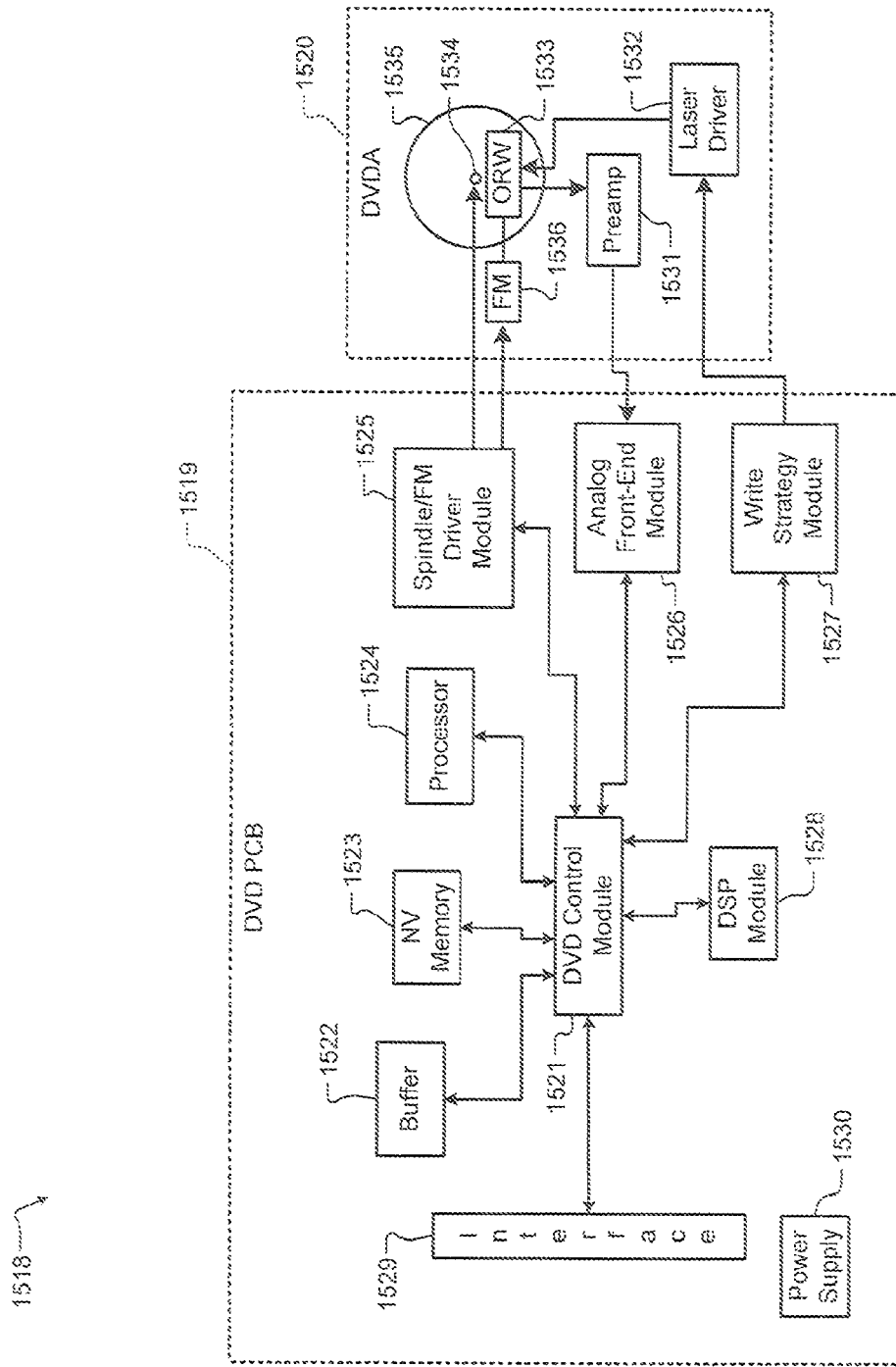
FIG. 45B is a functional block diagram of a DVD drive.

Referring now to FIG. 45B, the teachings of the disclosure can be implemented in integrated circuits that implement components of a DVD drive 1518 or of a CD drive (not shown). The DVD drive 1518 includes a DVD PCB 1519 and a DVD assembly (DVDA) 1520. The DVD PCB 1519 includes a DVD control module 1521, a buffer 1522, nonvolatile memory 1523, a processor 1524, a spindle/FM (feed motor) driver module 1525, an analog front-end module 1526, a write strategy module 1527, and a DSP module 1528.

The DVD control module 1521 controls components of the DVDA 1520 and communicates with an external device (not shown) via an I/O interface 1529. The external device may include a computer, a multimedia device, a mobile computing device, etc. The I/O interface 1529 may include wireline and/or wireless communication links.

The DVD control module 1521 may receive data from the buffer 1522, nonvolatile memory 1523, the processor 1524, the spindle/FM driver module 1525, the analog front-end module 1526, the write strategy module 1527, the DSP module 1528, and/or the I/O interface 1529. The processor 1524 may process the data, including encoding, decoding, filtering, and/or formatting. The DSP module 1528 performs signal processing, such as video and/or audio coding/decoding. The processed data may be output to the buffer 1522, nonvolatile memory 1523, the processor 1524, the spindle/FM driver module 1525, the analog front-end module 1526, the write strategy module 1527, the DSP module 1528, and/or the I/O interface 1529.

The DVD control module 1521 may use the buffer 1522 and/or nonvolatile memory 1523 to store data related to the control and operation of the DVD drive 1518. The buffer 1522 may include DRAM, SDRAM, etc. The nonvolatile memory 1523 may include flash memory (including NAND and NOR flash memory), phase change memory, magnetic RAM, or multi-state memory, in which each memory cell has more than two states. The DVD PCB 1519 includes a power supply 1530 that provides power to the components of the DVD drive 1518.

The DVDA 1520 may include a preamplifier device 1531, a laser driver 1532, and an optical device 1533, which may be an optical read/write (ORW) device or an optical read-only (OR) device. A spindle motor 1534 rotates an optical storage medium 1535, and a feed motor 1536 actuates the optical device 1533 relative to the optical storage medium 1535.

When reading data from the optical storage medium 1535, the laser driver provides a read power to the optical device 1533. The optical device 1533 detects data from the optical storage medium 1535, and transmits the data to the preamplifier device 1531. The analog front-end module 1526 receives data from the preamplifier device 1531 and performs such functions as filtering and A/D conversion. To write to the optical storage medium 1535, the write strategy module 1527 transmits power level and timing data to the laser driver 1532. The laser driver 1532 controls the optical device 1533 to write data to the optical storage medium 1535.

Figure 45D:
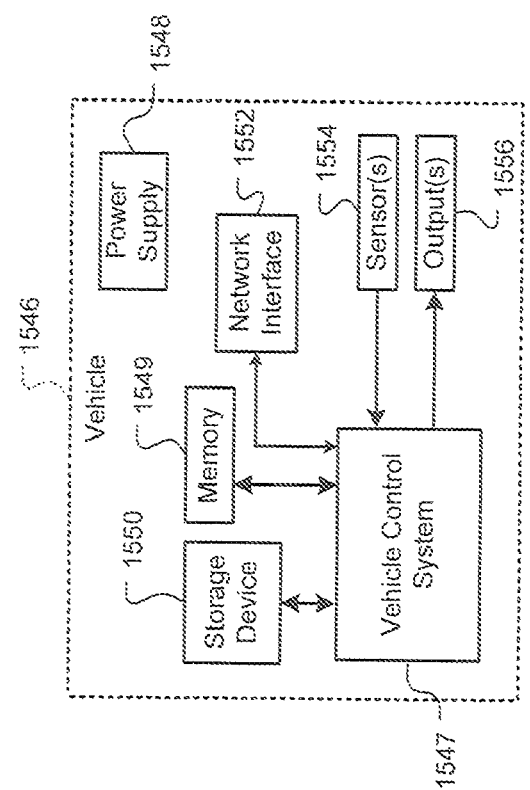
FIG. 45D is a functional block diagram of a vehicle control system.
Figure 45C:
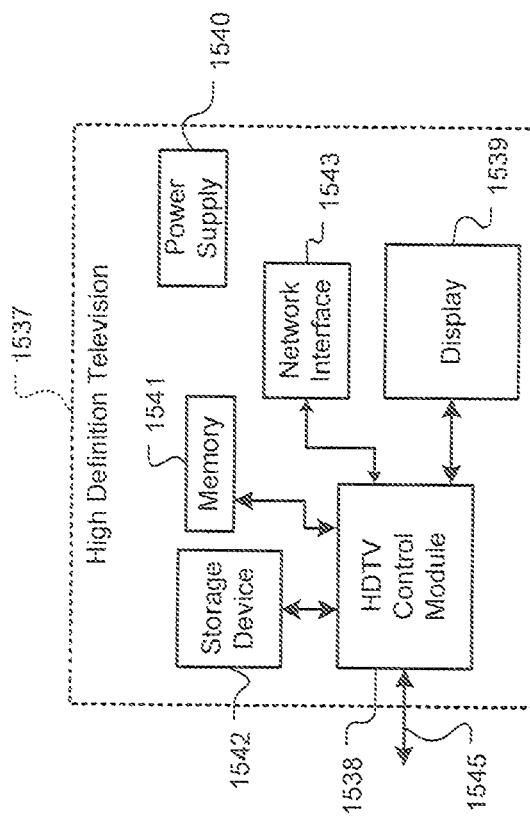
FIG. 45C is a functional block diagram of a high definition television.

Referring now to FIG. 45C, the teachings of the disclosure can be implemented in integrated circuits that implement components of a high definition television (HDTV) 1537. The HDTV 1537 includes a HDTV control module 1538, a display 1539, a power supply 1540, memory 1541, a storage device 1542, a network interface 1543, and an external interface 1545. If the network interface 1543 includes a wireless local area network interface, an antenna (not shown) may be included.

The HDTV 1537 can receive input signals from the network interface 1543 and/or the external interface 1545, which can send and receive data via cable, broadband Internet, and/or satellite. The HDTV control module 1538 may process the input signals, including encoding, decoding, filtering, and/or formatting, and generate output signals. The output signals may be communicated to one or more of the display 1539, memory 1541, the storage device 1542, the network interface 1543, and the external interface 1545.

Memory 1541 may include random access memory (RAM) and/or nonvolatile memory such as flash memory, phase change memory, or multi-state memory, in which each memory cell has more than two states. The storage device 1542 may include an optical storage drive, such as a DVD drive, and/or a hard disk drive (HDD). The HDTV control module 1538 communicates externally via the network interface 1543 and/or the external interface 1545. The power supply 1540 provides power to the components of the HDTV 1537.

Referring now to FIG. 45D, the teachings of the disclosure may be implemented in integrated circuits that implement components of a vehicle 1546. The vehicle 1546 may include a vehicle control system 1547, a power supply 1548, memory 1549, a storage device 1550, and a network interface 1552. If the network interface 1552 includes a wireless local area network interface, an antenna (not shown) may be included. The vehicle control system 1547 may be a powertrain control system, a body control system, an entertainment control system, an anti-lock braking system (ABS), a navigation system, a telematics system, a lane departure system, an adaptive cruise control system, etc.

The vehicle control system 1547 may communicate with one or more sensors 1554 and generate one or more output signals 1556. The sensors 1554 may include temperature sensors, acceleration sensors, pressure sensors, rotational sensors, airflow sensors, etc. The output signals 1556 may control engine operating parameters, transmission operating parameters, suspension parameters, etc.

The power supply 1548 provides power to the components of the vehicle 1546. The vehicle control system 1547 may store data in memory 1549 and/or the storage device 1550. Memory 1549 may include random access memory (RAM) and/or nonvolatile memory such as flash memory, phase change memory, or multi-state memory, in which each memory cell has more than two states. The storage device 1550 may include an optical storage drive, such as a DVD drive, and/or a hard disk drive (HDD). The vehicle control system 1547 may communicate externally using the network interface 1552.

Referring now to FIG. 45E, the teachings of the disclosure can be implemented in integrated circuits that implement components of a cellular phone 1558. The cellular phone 1558 includes a phone control module 1560, a power supply 1562, memory 1564, a storage device 1566, and a cellular network interface 1567. The cellular phone 1558 may include a network interface 1568, a microphone 1570, an audio output 1572 such as a speaker and/or output jack, a display 1574, and a user input device 1576 such as a keypad and/or pointing device. If the network interface 1568 includes a wireless local area network interface, an antenna (not shown) may be included.

The phone control module 1560 may receive input signals from the cellular network interface 1567, the network interface 1568, the microphone 1570, and/or the user input device 1576. The phone control module 1560 may process signals, including encoding, decoding, filtering, and/or formatting, and generate output signals. The output signals may be communicated to one or more of memory 1564, the storage device 1566, the cellular network interface 1567, the network interface 1568, and the audio output 1572.

Memory 1564 may include random access memory (RAM) and/or nonvolatile memory such as flash memory, phase change memory, or multi-state memory, in which each memory cell has more than two states. The storage device 1566 may include an optical storage drive, such as a DVD drive, and/or a hard disk drive (HDD). The power supply 1562 provides power to the components of the cellular phone 1558.

Referring now to FIG. 45F, the teachings of the disclosure can be implemented in integrated circuits that implement components of a set top box 1578. The set top box 1578 includes a set top control module 1580, a display 1581, a power supply 1582, memory 1583, a storage device 1584, and a network interface 1585. If the network interface 1585 includes a wireless local area network interface, an antenna (not shown) may be included.

The set top control module 1580 may receive input signals from the network interface 1585 and an external interface 1587, which can send and receive data via cable, broadband Internet, and/or satellite. The set top control module 1580 may process signals, including encoding, decoding, filtering, and/or formatting, and generate output signals. The output signals may include audio and/or video signals in standard and/or high definition formats. The output signals may be communicated to the network interface 1585 and/or to the display 1581. The display 1581 may include a television, a projector, and/or a monitor.

The power supply 1582 provides power to the components of the set top box 1578. Memory 1583 may include random access memory (RAM) and/or nonvolatile memory such as flash memory, phase change memory, or multi-state memory, in which each memory cell has more than two states. The storage device 1584 may include an optical storage drive, such as a DVD drive, and/or a hard disk drive (HDD).

Figure 45G:
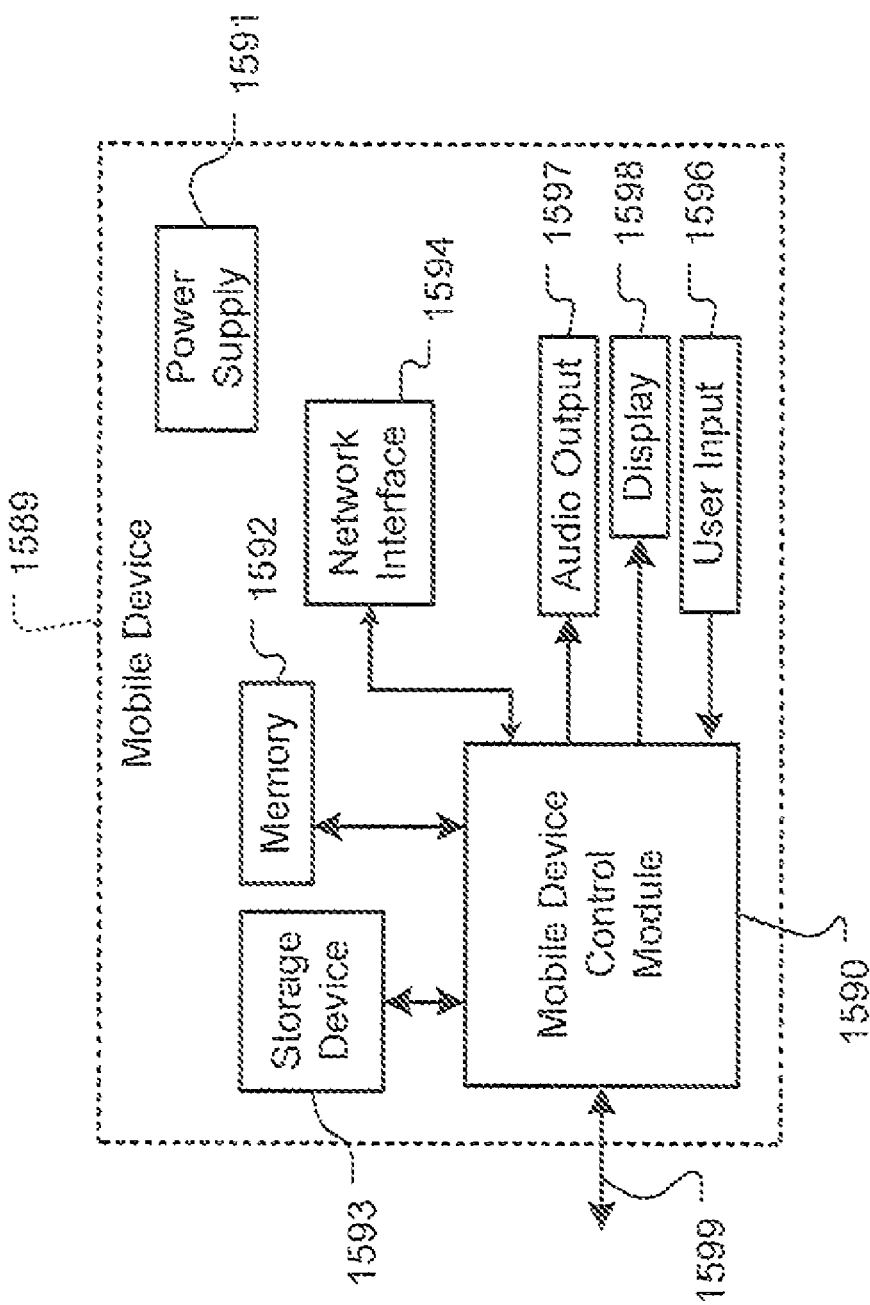
FIG. 45G is a functional block diagram of a media player.

Referring now to FIG. 45G, the teachings of the disclosure can be implemented in integrated circuits that implement components of a mobile device 1589. The mobile device 1589 may include a mobile device control module 1590, a power supply 1591, memory 1592, a storage device 1593, a network interface 1594, and an external interface 1599. If the network interface 1594 includes a wireless local area network interface, an antenna (not shown) may be included.

The mobile device control module 1590 may receive input signals from the network interface 1594 and/or the external interface 1599. The external interface 1599 may include USB, infrared, and/or Ethernet. The input signals may include compressed audio and/or video, and may be compliant with the MP3 format. Additionally, the mobile device control module 1590 may receive input from a user input 1596 such as a keypad, touchpad, or individual buttons. The mobile device control module 1590 may process input signals, including encoding, decoding, filtering, and/or formatting, and generate output signals.

The mobile device control module 1590 may output audio signals to an audio output 1597 and video signals to a display 1598. The audio output 1597 may include a speaker and/or an output jack. The display 1598 may present a graphical user interface, which may include menus, icons, etc. The power supply 1591 provides power to the components of the mobile device 1589. Memory 1592 may include random access memory (RAM) and/or nonvolatile memory such as flash memory, phase change memory, or multi-state memory, in which each memory cell has more than two states. The storage device 1593 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the present invention can be implemented in a variety of forms. Therefore, while this invention has been described in connection with particular examples thereof, the true scope of the inven-

What is claimed is:

1. An integrated circuit, comprising:
N plane-like metal layers, where N is an integer greater than one;
a first plane-like metal layer that includes M contact portions in communication with the N plane-like metal layers, respectively, where M is an integer greater than one, and wherein the first plane-like metal layer and the N plane-like metal layers are located in separate planes;
a first source;
a first drain;
a second source, wherein at least two of first source, the first drain and the second source are in communication with at least two of the N plane-like metal layers;
a first gate arranged between the first source and the first drain; and
a second gate arranged between the first drain and the second source,
wherein the first and second gates define alternating first and second regions in the first drain, and wherein the first and second gates are arranged farther apart in the first regions than in the second regions, and
wherein at least one of the M contact portions has an elliptical shape.

2. The integrated circuit of claim 1, further comprising a well substrate contact arranged in the first regions.

3. The integrated circuit of claim 1, wherein at least two of the N plane-like metal layers are coplanar.

4. The integrated circuit of claim 1, wherein the N plane-like metal layers are located in separate planes.

5. The integrated circuit of claim 1, further comprising a plurality of local interconnects in communication with the first and second sources and the first drain.

6. The integrated circuit of claim 1, wherein the integrated circuit implements a power IC, a first one of the M contact portions supplies a first voltage potential to the power IC, a second one of the M contact portions supplies a second voltage potential to the power IC and a third one of the M contact portions receives an output voltage of the power IC.

7. A system comprising the integrated circuit of claim 1, and further comprising:
a first transmission line in communication with a first one of the M contact portions;
a second transmission line in communication with a second one of the M contact portions;
a third transmission line in communication with a third one of the M contact portions; and
a capacitance in communication with the second transmission line and the third transmission line, wherein the second transmission line supplies a first voltage potential and the third transmission line supplies a second voltage potential.

8. The integrated circuit of claim 1, further comprising R well substrate contacts arranged in the first regions, where R is an integer greater than one.

9. The integrated circuit of claim 8, wherein R is an integer that is greater than three and less than seven.

10. The integrated circuit of claim 8, wherein the R well substrate contacts are associated with respective ones of R transistors.

11. The integrated circuit of claim 1, wherein the integrated circuit includes a plurality of transistors.

12. The integrated circuit of claim 11, wherein the transistors include PMOS transistors.

13. The integrated circuit of claim 1, further comprising:
a second drain; and
a third gate arranged between the second source and the second drain,
wherein the second and third gates define alternating third and fourth regions, the second and third gates are arranged farther apart in the third regions than in the fourth regions.

14. The integrated circuit of claim 13, wherein the first regions are arranged adjacent to the fourth regions and the second regions are arranged adjacent to the third regions.

15. The integrated circuit of claim 14, wherein the first and third regions include R well substrate contacts.

16. A method for providing an integrated circuit, the method comprising:
providing N plane-like metal layers, where N is an integer greater than one;
providing a first plane-like metal layer that includes M contact portions in communication with the N plane-like metal layers, respectively, where M is an integer greater than one;
arranging the first plane-like metal layer and the N plane-like metal layers in separate planes;
providing a first source, a first drain, and a second source;
arranging at least two of the first source, the first drain and the second source to be in communication with at least two of the N plane-like metal layers;
arranging a first gate between the first source and the first drain;
arranging a second gate between the first drain and the second source;
defining alternating first and second regions in the first drain using the first and second gates; and
arranging the first and second gates farther apart in the first regions than in the second regions,
wherein at least one of the M contact portions has an elliptical shape.

17. The method of claim 16, further comprising arranging a well substrate contact in the first regions.

18. The method of claim 16, further comprising arranging at least two of the N plane-like metal layers in the same plane.

19. The method of claim 16, further comprising arranging the N plane-like metal layers in separate planes.

20. The method of claim 16, further comprising providing a plurality of local interconnects in communication with the first and second sources and the first drain.

21. The method of claim 16, further comprising:
implementing a power IC using the integrated circuit;
supplying a first voltage potential to the power IC using a first one of the M contact portions;
supplying a second voltage potential to the power IC using a second one of the M contact portions; and
receiving an output voltage of the power IC at a third one of the M contact portions.

22. The method of claim 16, further comprising:
providing a first transmission line in communication with a first one of the M contact portions;
providing a second transmission line in communication with a second one of the M contact portions;
providing a third transmission line in communication with a third one of the M contact portions; and
providing a capacitance in communication with the second transmission line and the third transmission line, wherein the second transmission line supplies a first voltage potential and the third transmission line supplies a second voltage potential.

23. The method of claim 16, further comprising arranging R well substrate contacts in the first regions, where R is an integer greater than one.

24. The method of claim 23, wherein R is an integer that is greater than three and less than seven.

25. The method of claim 23, wherein the R well substrate contacts are associated with respective ones of R transistors.

26. The method of claim 16, wherein the integrated circuit includes a plurality of transistors.

27. The method of claim 26, wherein the transistors include PMOS transistors.

28. The method of claim 16, further comprising:
arranging a third gate between the second source and a second drain;
defining alternating third and fourth regions using the second and third gates; and
arranging the second and third gates farther apart in the third regions than in the fourth regions.

29. The method of claim 28, further comprising arranging the first regions adjacent to the fourth regions and the second regions adjacent to the third regions.

30. The method of claim 29, wherein the first and third regions include R well substrate contacts.

31. An integrated circuit, comprising:
N plane-like metal layers, where N is an integer greater than one;
a first plane-like metal layer that includes M contact portions in communication with the N plane-like metal layers, respectively, where M is an integer greater than one, and wherein the first plane-like metal layer and the N plane-like metal layers are located in separate planes;
a first source;
a first drain;
a second source, wherein at least two of first source, the first drain and the second source are in communication with at least two of the N plane-like metal layers;
a first gate arranged between the first source and the first drain; and
a second gate arranged between the first drain and the second source,
wherein the first and second gates define alternating first and second regions in the first drain, and wherein the first and second gates are arranged farther apart in the first regions than in the second regions, and
wherein first and second ones of the M contact portions have a base portion and wings that extend from the base portion, and a third one of the M contact portions is received between the wings of the first and second ones of the M contact portions.

32. An integrated circuit, comprising:
N plane-like metal layers, where N is an integer greater than one;
a first plane-like metal layer that includes M contact portions in communication with the N plane-like metal layers, respectively, where M is an integer greater than one, and wherein the first plane-like metal layer and the N plane-like metal layers are located in separate planes;
a first source;
a first drain;
a second source, wherein at least two of first source, the first drain and the second source are in communication with at least two of the N plane-like metal layers;
a first gate arranged between the first source and the first drain; and
a second gate arranged between the first drain and the second source,
wherein the first and second gates define alternating first and second regions in the first drain, and wherein the first and second gates are arranged farther apart in the first regions than in the second regions, and
wherein first and second ones of the M contact portions are generally "C"-shaped and wherein a third one of the M contact portions is arranged between the first and second ones of the M contact portions.

33. A system, comprising:
an integrated circuit, comprising:
N plane-like metal layers, where N is an integer greater than one;
a first plane-like metal layer that includes M contact portions in communication with the N plane-like metal layers, respectively, where M is an integer greater than one, and wherein the first plane-like metal layer and the N plane-like metal layers are located in separate planes;
a first source;
a first drain;
a second source, wherein at least two of first source, the first drain and the second source are in communication with at least two of the N plane-like metal layers;
a first gate arranged between the first source and the first drain; and
a second gate arranged between the first drain and the second source,
wherein the first and second gates define alternating first and second regions in the first drain, and wherein the first and second gates are arranged farther apart in the first regions than in the second regions; and
a leadframe including transmission lines, the transmission lines in communication with at least two of the M contact portions.

34. The system of claim 33, wherein the integrated circuit and the transmission lines are encased by a mold compound.

35. The system of claim 34, wherein the leadframe and the integrated circuit implement a quad flat no-lead (QFN) package.

36. A method for providing an integrated circuit, the method comprising:
providing N plane-like metal layers, where N is an integer greater than one;
providing a first plane-like metal layer that includes M contact portions in communication with the N plane-like metal layers, respectively, where M is an integer greater than one;
arranging the first plane-like metal layer and the N plane-like metal layers in separate planes;
providing a first source, a first drain, and a second source;
arranging at least two of the first source, the first drain and the second source to be in communication with at least two of the N plane-like metal layers;
arranging a first gate between the first source and the first drain;
arranging a second gate between the first drain and the second source;
defining alternating first and second regions in the first drain using the first and second gates; and
arranging the first and second gates farther apart in the first regions than in the second regions,
wherein first and second ones of the M contact portions have a base portion and wings that extend from the base portion, and a third one of the M contact portions is received between the wings of the first and second ones of the M contact portions.

37. A method for providing an integrated circuit, the method comprising:

provide N plane-like metal layers, where N is an integer greater than one;

providing a first plane-like metal layer that includes M contact portions in communication with the N plane-like metal layers, respectively, where M is an integer greater than one;

arranging the first plane-like metal layer and the N plane-like metal layers in separate planes;

providing a first source, a first drain, and a second source;

arranging at least two of the first source, the first drain and the second source to be in communication with at least two of the N plane-like metal layers;

arranging a first gate between the first source and the first drain;

arranging a second gate between the first drain and the second source;

defining alternating first and second regions in the first drain using the first and second gates; and arranging the first and second gates farther apart in the first regions than in the second regions, wherein first and second ones of the M contact portions are generally "C"-shaped and wherein a third one of the M contact portions is arranged between the first and second ones of the M contact portions.

38. A method for providing an integrated circuit, the method comprising:

providing N plane-like metal layers, where N is an integer greater than one;

providing a first plane-like metal layer that includes M contact portions in communication with the N plane-like metal layers, respectively, where M is an integer greater than one;

arranging the first plane-like metal layer and the N plane-like metal layers in separate planes;

providing a first source, a first drain, and a second source;

arranging at least two of the first source, the first drain and the second source to be in communication with at least two of the N plane-like metal layers;

arranging a first gate between the first source and the first drain;

arranging a second gate between the first drain and the second source;

defining alternating first and second regions in the first drain using the first and second gates;

arranging the first and second gates farther apart in the first regions than in the second regions; and providing a leadframe including transmission lines, the transmission lines in communication with at least two of the M contact portions.

39. The method of claim 38, wherein the integrated circuit and the transmission lines are encased by a mold compound.

40. The method of claim 39, further comprising implementing a quad flat no-lead (QFN) package using the leadframe and the integrated circuit.

* * * * *